US006798351B1

(12) United States Patent
Sorrells et al.

(10) Patent No.: US 6,798,351 B1
(45) Date of Patent: Sep. 28, 2004

(54) AUTOMATED METER READER APPLICATIONS OF UNIVERSAL FREQUENCY TRANSLATION

(75) Inventors: David F. Sorrells, Middleburg, FL (US); Michael J. Bultman, Jacksonville, FL (US); Charles D. Clements, Jacksonville, FL (US); Robert W. Cook, Switzerland, FL (US); Joseph M. Hamilla, St. Augustine, FL (US); Richard C. Looke, Jacksonville, FL (US); Charley D. Moses, Jr., Jackonville, FL (US); Gregory S. Silver, St. Augustine, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

(21) Appl. No.: 09/543,867

(22) Filed: Apr. 5, 2000

Related U.S. Application Data

(63) Continuation-in-part of application No. 09/261,129, filed on Mar. 3, 1999, which is a continuation-in-part of application No. 09/176,027, filed on Oct. 21, 1998, now abandoned.

(51) Int. Cl.$^7$ .............................................. G08C 17/02
(52) U.S. Cl. ..................... 340/870.02; 455/18; 375/22
(58) Field of Search ...................... 340/870.02, 870.19, 340/870.11, 573.1, 10.1, 637, 310.02, 310.06, 10.33, 10.41; 455/118, 313, 115.1, 113, 323, 296, 18, 507; 375/322, 340

(56) References Cited

U.S. PATENT DOCUMENTS

| 2,057,613 A | 10/1936 | Gardner | 250/8 |
|---|---|---|---|
| 2,241,078 A | 5/1941 | Vreeland | 179/15 |
| 2,270,385 A | 1/1942 | Skillman | 179/179 |
| 2,283,575 A | 5/1942 | Roberts | 250/6 |
| 2,358,152 A | 9/1944 | Earp | 179/171.5 |

(List continued on next page.)

FOREIGN PATENT DOCUMENTS

| DE | 35 41 031 A1 | 5/1986 | ............ H03D/3/00 |
| DE | 42 37 692 C1 | 3/1994 | ............ H04B/1/26 |
| DE | 196 27 640 A1 | 1/1997 | ............ H03D/7/12 |
| DE | 196 48 915 A1 | 6/1998 | |
| DE | 197 35 798 C1 | 7/1998 | ............ H04L/27/00 |

(List continued on next page.)

OTHER PUBLICATIONS

Aghvami, H. et al., "Land Mobile Satellites Using the Highly Elliptic Orbits– The UK T–SAT Mobile Payload," *Fourth International Conference on Satellite Systems for Mobile Communications and Navigation*, IEE, pp. 147–153 (Oct. 17–19, 1988).

Akers, N.P. et al., "RF Sampling Gates: a Brief Review," *IEE Proceedings*, IEE, vol. 133, Part A, No. 1, pp. 45–49 (Jan. 1986).

(List continued on next page.)

*Primary Examiner*—Michael Horabik
*Assistant Examiner*—Hung Dang
(74) *Attorney, Agent, or Firm*—Sterne, Kessler, Goldstein & Fox P.L.L.C.

(57) ABSTRACT

Frequency translation and applications of same are described herein, including RF modem and wireless local area network (WLAN) applications. Such applications include, but are not limited to, frequency down-conversion, frequency up-conversion, enhanced signal reception, unified down-conversion and filtering, and combinations and applications of same.

28 Claims, 72 Drawing Sheets

U.S. PATENT DOCUMENTS

| | | | |
|---|---|---|---|
| 2,410,350 A | 10/1946 | Labin et al. .................. 179/15 |
| 2,451,430 A | 10/1948 | Barone ......................... 250/8 |
| 2,462,069 A | 2/1949 | Chatterjea et al. ............. 250/17 |
| 2,462,181 A | 2/1949 | Grosselfinger ............... 250/17 |
| 2,472,798 A | 6/1949 | Fredendall ................... 178/44 |
| 2,497,859 A | 2/1950 | Boughtwood et al. ......... 250/8 |
| 2,499,279 A | 2/1950 | Peterson ...................... 332/41 |
| 2,802,208 A | 8/1957 | Hobbs ........................ 343/176 |
| 2,985,875 A | 5/1961 | Grisdale et al. ............. 343/100 |
| 3,023,309 A | 2/1962 | Foulkes ....................... 205/17 |
| 3,069,679 A | 12/1962 | Sweeney et al. ............ 343/200 |
| 3,104,393 A | 9/1963 | Vogelman ................... 343/200 |
| 3,114,106 A | 12/1963 | McManu ..................... 325/56 |
| 3,118,117 A | 1/1964 | King et al. ................... 332/22 |
| 3,226,643 A | 12/1965 | McNair ....................... 325/40 |
| 3,246,084 A | 4/1966 | Kryter |
| 3,258,694 A | 6/1966 | Shepherd .................... 325/145 |
| 3,383,598 A | 5/1968 | Sanders ...................... 325/163 |
| 3,384,822 A | 5/1968 | Miyagi ........................ 325/30 |
| 3,454,718 A | 7/1969 | Perreault ..................... 178/66 |
| 3,523,291 A | 8/1970 | Pierret ........................ 340/347 |
| 3,548,342 A | 12/1970 | Maxey .......................... 332/9 |
| 3,555,428 A | 1/1971 | Perreault .................... 325/320 |
| 3,617,892 A | 11/1971 | Hawley et al. ............. 325/145 |
| 3,621,402 A | 11/1971 | Gardner ....................... 328/37 |
| 3,622,885 A | 11/1971 | Oberdorf et al. |
| 3,623,160 A | 11/1971 | Giles et al. ........... 340/347 DA |
| 3,626,417 A | 12/1971 | Gilbert ....................... 343/203 |
| 3,629,696 A | 12/1971 | Bartelingk ................ 324/57 R |
| 3,662,268 A | 5/1972 | Gans et al. ................... 325/56 |
| 3,689,841 A | 9/1972 | Bello et al. ................... 325/39 |
| 3,702,440 A | 11/1972 | Moore |
| 3,714,577 A | 1/1973 | Hayes ........................ 324/145 |
| 3,716,730 A | 2/1973 | Cerny, Jr. ................... 307/295 |
| 3,717,844 A | 2/1973 | Barret et al. ................ 340/5 R |
| 3,735,048 A | 5/1973 | Tomsa et al. .......... 179/15 BM |
| 3,767,984 A | 10/1973 | Shinoda et al. |
| 3,806,811 A | 4/1974 | Thompson .................. 325/146 |
| 3,852,530 A | 12/1974 | Shen |
| 3,868,601 A | 2/1975 | MacAfee ..................... 332/45 |
| 3,949,300 A | 4/1976 | Sadler ......................... 325/31 |
| 3,967,202 A | 6/1976 | Batz ............................ 325/31 |
| 3,980,945 A | 9/1976 | Bickford ..................... 325/30 |
| 3,987,280 A | 10/1976 | Bauer ..................... 235/150.53 |
| 3,991,277 A | 11/1976 | Hirata .................... 179/15 FD |
| 4,003,002 A | 1/1977 | Snijders et al. ............... 332/10 |
| 4,013,966 A | 3/1977 | Campbell ................... 325/363 |
| 4,017,798 A | 4/1977 | Gordy et al. ................. 325/42 |
| 4,019,140 A | 4/1977 | Swerdlow .................... 322/65 |
| 4,032,847 A | 6/1977 | Unkauf ....................... 325/323 |
| 4,035,732 A | 7/1977 | Lohrmann ................. 325/446 |
| 4,047,121 A | 9/1977 | Campbell ..................... 331/76 |
| 4,051,475 A | 9/1977 | Campbell ................... 343/180 |
| 4,066,841 A | 1/1978 | Young ...................... 178/66 R |
| 4,066,919 A | 1/1978 | Huntington ................ 307/353 |
| 4,080,573 A | 3/1978 | Howell ....................... 325/439 |
| 4,081,748 A | 3/1978 | Batz ............................ 325/56 |
| 4,130,765 A | 12/1978 | Arakelian et al. ....... 307/220 R |
| 4,130,806 A | 12/1978 | Van Gerwen et al. ...... 325/487 |
| 4,142,155 A | 2/1979 | Adachi ........................ 325/47 |
| 4,170,764 A | 10/1979 | Salz et al. .................... 332/17 |
| 4,204,171 A | 5/1980 | Sutphin, Jr. ................. 328/167 |
| 4,210,872 A | 7/1980 | Gregorian ..................... 330/9 |
| 4,220,977 A | 9/1980 | Yamanaka |
| 4,245,355 A | 1/1981 | Pascoe et al. ............... 455/326 |
| 4,253,066 A | 2/1981 | Fisher et al. ................. 329/50 |
| 4,253,067 A | 2/1981 | Caples et al. ............... 329/110 |
| 4,253,069 A | 2/1981 | Nossek ....................... 330/107 |
| 4,308,614 A | 12/1981 | Fisher et al. ................ 370/119 |
| 4,320,361 A | 3/1982 | Kikkert ................... 332/16 R |
| 4,320,536 A | 3/1982 | Dietrich ...................... 455/325 |
| 4,334,324 A | 6/1982 | Hoover ....................... 455/333 |
| 4,346,477 A | 8/1982 | Gordy ........................ 455/257 |
| 4,355,401 A | 10/1982 | Ikoma et al. .................. 375/5 |
| 4,356,558 A | 10/1982 | Owen et al. ................ 364/724 |
| 4,360,867 A | 11/1982 | Gonda ........................ 363/158 |
| 4,363,132 A | 12/1982 | Collin ......................... 455/52 |
| 4,365,217 A | 12/1982 | Berger et al. ............... 333/165 |
| 4,369,522 A | 1/1983 | Cerny, Jr. et al. ........... 455/333 |
| 4,370,572 A | 1/1983 | Cosand et al. .............. 307/353 |
| 4,384,357 A | 5/1983 | deBuda et al. |
| 4,389,579 A | 6/1983 | Stein .......................... 307/353 |
| 4,392,255 A | 7/1983 | Del Giudice ............... 455/328 |
| 4,393,395 A | 7/1983 | Hacke et al. ................. 358/23 |
| 4,430,629 A | 2/1984 | Betzl et al. ................. 333/165 |
| 4,446,438 A | 5/1984 | Chang et al. ............... 328/127 |
| 4,456,990 A | 6/1984 | Fisher et al. ................ 370/119 |
| 4,470,145 A | 9/1984 | Williams |
| 4,472,785 A | 9/1984 | Kasuga ....................... 364/718 |
| 4,479,226 A | 10/1984 | Prabhu et al. .................. 375/1 |
| 4,481,490 A | 11/1984 | Huntley ...................... 332/41 |
| 4,481,642 A | 11/1984 | Hanson ......................... 375/9 |
| 4,483,017 A | 11/1984 | Hampel et al. |
| 4,484,143 A | 11/1984 | French et al. ................ 329/50 |
| 4,485,488 A | 11/1984 | Houdart ..................... 455/327 |
| 4,504,803 A | 3/1985 | Lee et al. .................. 332/31 R |
| 4,510,467 A | 4/1985 | Chang et al. |
| 4,517,519 A | 5/1985 | Mukaiyama ................ 329/126 |
| 4,517,520 A | 5/1985 | Ogawa ....................... 329/145 |
| 4,518,935 A | 5/1985 | van Roermund ........... 333/173 |
| 4,521,892 A | 6/1985 | Vance et al. .................. 375/88 |
| 4,563,773 A | 1/1986 | Dixon, Jr. et al. .......... 455/327 |
| 4,577,157 A | 3/1986 | Reed .......................... 329/50 |
| 4,583,239 A | 4/1986 | Vance .......................... 375/94 |
| 4,591,736 A | 5/1986 | Hirao et al. ................. 307/267 |
| 4,602,220 A | 7/1986 | Kurihara ...................... 331/19 |
| 4,603,330 A | 7/1986 | Horne et al. .................. 329/50 |
| 4,612,464 A | 9/1986 | Ishikawa et al. ............ 307/496 |
| 4,612,518 A | 9/1986 | Gans et al. .................. 332/21 |
| 4,616,191 A | 10/1986 | Galani et al. ................. 331/4 |
| 4,621,217 A | 11/1986 | Saxe et al. ..................... 315/1 |
| 4,628,517 A | 12/1986 | Schwarz et al. ............... 375/40 |
| 4,634,998 A | 1/1987 | Crawford .................... 331/1 A |
| 4,648,021 A | 3/1987 | Alberkrack ................. 363/157 |
| 4,651,034 A | 3/1987 | Sato .......................... 307/556 |
| 4,653,117 A | 3/1987 | Heck .......................... 455/209 |
| 4,660,164 A | 4/1987 | Leibowitz |
| 4,675,882 A | 6/1987 | Lillie et al. ................... 375/80 |
| 4,688,253 A | 8/1987 | Gumm .......................... 381/7 |
| 4,716,376 A | 12/1987 | Daudelin ..................... 329/107 |
| 4,716,388 A | 12/1987 | Jacobs ........................ 333/173 |
| 4,718,113 A | 1/1988 | Rother et al. ............... 455/209 |
| 4,726,041 A | 2/1988 | Prohaska et al. .............. 375/91 |
| 4,733,403 A | 3/1988 | Simone ....................... 375/103 |
| 4,734,591 A | 3/1988 | Ichitsubo ................. 307/219.1 |
| 4,737,969 A | 4/1988 | Steel et al. .................... 375/67 |
| 4,743,858 A | 5/1988 | Everard ........................ 330/10 |
| 4,745,463 A | 5/1988 | Lu ............................... 358/23 |
| 4,751,468 A | 6/1988 | Agoston ..................... 328/133 |
| 4,757,538 A | 7/1988 | Zink ............................. 381/7 |
| 4,761,798 A | 8/1988 | Griswold, Jr. et al. |
| 4,768,187 A | 8/1988 | Marshall .................... 370/69.1 |
| 4,769,612 A | 9/1988 | Tamakoshi et al. ......... 328/167 |
| 4,772,853 A | 9/1988 | Hart |
| 4,785,463 A | 11/1988 | Janc et al. ..................... 375/1 |
| 4,791,584 A | 12/1988 | Greivenkamp, Jr. ......... 364/525 |
| 4,801,823 A | 1/1989 | Yokoyama ................. 307/353 |
| 4,806,790 A | 2/1989 | Sone .......................... 307/353 |
| 4,810,904 A | 3/1989 | Crawford .................... 307/353 |
| 4,810,976 A | 3/1989 | Cowley et al. ......... 331/117 R |
| 4,811,362 A | 3/1989 | Yester, Jr. et al. ............ 375/75 |

| | | | |
|---|---|---|---|
| 4,816,704 A | 3/1989 | Fiori, Jr. .................... 307/519 |
| 4,819,252 A | 4/1989 | Christopher ................ 375/122 |
| 4,833,445 A | 5/1989 | Buchele ...................... 341/118 |
| 4,841,265 A | 6/1989 | Watanabe et al. ........... 333/194 |
| 4,855,894 A | 8/1989 | Asahi et al. ................. 363/157 |
| 4,857,928 A | 8/1989 | Gailus et al. |
| 4,862,121 A | 8/1989 | Hochschild et al. ......... 333/173 |
| 4,868,654 A | 9/1989 | Juri et al. .................... 358/133 |
| 4,870,659 A | 9/1989 | Oishi et al. .................... 375/82 |
| 4,871,987 A | 10/1989 | Kawase ...................... 332/100 |
| 4,885,587 A | 12/1989 | Wiegand et al. ............... 42/14 |
| 4,885,756 A | 12/1989 | Fontanes et al. .............. 375/82 |
| 4,888,557 A | 12/1989 | Puckette, IV et al. ....... 329/341 |
| 4,890,302 A | 12/1989 | Muilwijk ..................... 375/80 |
| 4,893,316 A | 1/1990 | Janc et al. ..................... 375/44 |
| 4,893,341 A | 1/1990 | Gehring ......................... 381/7 |
| 4,894,766 A | 1/1990 | De Agro ..................... 363/159 |
| 4,896,152 A | 1/1990 | Tiemann ..................... 340/853 |
| 4,902,979 A | 2/1990 | Puckette, IV ................ 329/343 |
| 4,908,579 A | 3/1990 | Tawfik et al. ............... 328/167 |
| 4,910,752 A | 3/1990 | Yester, Jr. et al. ............. 375/75 |
| 4,914,405 A | 4/1990 | Wells ........................... 331/25 |
| 4,920,510 A | 4/1990 | Senderowicz et al. ....... 364/825 |
| 4,922,452 A | 5/1990 | Larsen et al. ................ 365/45 |
| 4,931,921 A | 6/1990 | Anderson .................... 363/163 |
| 4,943,974 A | 7/1990 | Motamedi ...................... 375/1 |
| 4,944,025 A | 7/1990 | Gehring et al. ............. 455/207 |
| 4,955,079 A | 9/1990 | Connerney et al. ......... 455/325 |
| 4,965,467 A | 10/1990 | Bilterijst ..................... 307/352 |
| 4,967,160 A | 10/1990 | Quievy et al. ................ 328/16 |
| 4,970,703 A | 11/1990 | Hariharan et al. ........... 367/138 |
| 4,972,436 A | 11/1990 | Halim et al. |
| 4,982,353 A | 1/1991 | Jacob et al. .............. 364/724.1 |
| 4,984,077 A | 1/1991 | Uchida ....................... 358/140 |
| 4,995,055 A | 2/1991 | Weinberger et al. ........... 375/5 |
| 5,003,621 A | 3/1991 | Gailus ........................ 455/209 |
| 5,005,169 A | 4/1991 | Bronder et al. .............. 370/76 |
| 5,006,810 A | 4/1991 | Popescu ..................... 328/167 |
| 5,010,585 A | 4/1991 | Garcia ........................ 455/118 |
| 5,012,245 A | 4/1991 | Scott et al. |
| 5,014,304 A | 5/1991 | Nicollini et al. ............. 379/399 |
| 5,015,963 A | 5/1991 | Sutton ........................ 329/361 |
| 5,016,242 A | 5/1991 | Tang |
| 5,017,924 A | 5/1991 | Guiberteau et al. ......... 342/195 |
| 5,020,149 A | 5/1991 | Hemmie ..................... 455/325 |
| 5,020,154 A | 5/1991 | Zierhut ....................... 455/608 |
| 5,052,050 A | 9/1991 | Collier et al. ............... 455/296 |
| 5,058,107 A | 10/1991 | Stone et al. |
| 5,065,409 A | 11/1991 | Hughes et al. ................ 375/91 |
| 5,083,050 A | 1/1992 | Vasile ........................ 307/529 |
| 5,091,921 A | 2/1992 | Minami ....................... 375/88 |
| 5,095,533 A | 3/1992 | Loper et al. ................. 455/245 |
| 5,095,536 A | 3/1992 | Loper ......................... 455/324 |
| 5,111,152 A | 5/1992 | Makino ...................... 329/300 |
| 5,113,094 A | 5/1992 | Grace et al. ................. 307/529 |
| 5,113,129 A | 5/1992 | Hughes ....................... 323/316 |
| 5,115,409 A | 5/1992 | Stepp .......................... 364/841 |
| 5,122,765 A | 6/1992 | Pataut ......................... 332/105 |
| 5,124,592 A | 6/1992 | Hagino ....................... 307/520 |
| 5,126,682 A | 6/1992 | Weinberg et al. ........... 329/304 |
| 5,136,267 A | 8/1992 | Cabot ......................... 333/174 |
| 5,140,705 A | 8/1992 | Kosuga ...................... 455/318 |
| 5,150,124 A | 9/1992 | Moore et al. ................. 342/68 |
| 5,151,661 A | 9/1992 | Caldwell et al. .............. 328/14 |
| 5,157,687 A | 10/1992 | Tymes ........................... 375/1 |
| 5,159,710 A | 10/1992 | Cusdin ........................ 455/304 |
| 5,170,414 A | 12/1992 | Silvian ......................... 375/59 |
| 5,172,070 A | 12/1992 | Hiraiwa et al. ............. 329/304 |
| 5,179,731 A | 1/1993 | Tränkle et al. |
| 5,191,459 A | 3/1993 | Thompson et al. ......... 359/133 |
| 5,204,642 A | 4/1993 | Ashgar et al. ............... 331/135 |
| 5,212,827 A | 5/1993 | Meszko et al. ............. 455/219 |
| 5,214,787 A | 5/1993 | Karkota, Jr. ................. 455/3.2 |
| 5,220,583 A | 6/1993 | Solomon ...................... 375/82 |
| 5,220,680 A | 6/1993 | Lee ............................. 455/102 |
| 5,222,144 A | 6/1993 | Whikehart ................... 381/15 |
| 5,230,097 A | 7/1993 | Currie et al. ............ 455/226.1 |
| 5,239,686 A | 8/1993 | Downey ....................... 455/78 |
| 5,241,561 A | 8/1993 | Barnard ......................... 375/1 |
| 5,249,203 A | 9/1993 | Loper ........................... 375/97 |
| 5,251,218 A | 10/1993 | Stone et al. ................. 370/120 |
| 5,251,232 A | 10/1993 | Nonami .......................... 375/5 |
| 5,260,970 A | 11/1993 | Henry et al. .................. 375/10 |
| 5,263,194 A | 11/1993 | Ragan ......................... 455/316 |
| 5,263,196 A | 11/1993 | Jasper ......................... 455/324 |
| 5,267,023 A | 11/1993 | Kawasaki .................... 358/23 |
| 5,278,826 A | 1/1994 | Murphy et al. ............... 370/76 |
| 5,282,023 A | 1/1994 | Scarpa ......................... 358/36 |
| 5,282,222 A | 1/1994 | Fattouche et al. |
| 5,287,516 A | 2/1994 | Schaub ......................... 375/88 |
| 5,293,398 A | 3/1994 | Hamao et al. ................. 375/1 |
| 5,303,417 A | 4/1994 | Laws .......................... 455/314 |
| 5,307,517 A | 4/1994 | Rich ........................... 455/306 |
| 5,315,583 A | 5/1994 | Murphy et al. ............... 370/18 |
| 5,319,799 A | 6/1994 | Morita .......................... 455/78 |
| 5,321,852 A | 6/1994 | Seong ...................... 455/182.1 |
| 5,325,204 A | 6/1994 | Scarpa ......................... 348/607 |
| 5,337,014 A | 8/1994 | Najle et al. .................. 324/613 |
| 5,339,054 A | 8/1994 | Taguchi ...................... 332/100 |
| 5,339,459 A | 8/1994 | Schiltz et al. ............... 455/333 |
| 5,353,306 A | 10/1994 | Yamamoto .................... 375/14 |
| 5,355,114 A | 10/1994 | Sutterlin et al. ......... 340/310 A |
| 5,361,408 A | 11/1994 | Watanabe et al. ........... 455/324 |
| 5,369,404 A | 11/1994 | Galton ........................ 341/143 |
| 5,369,800 A | 11/1994 | Takagi et al. ................. 455/59 |
| 5,375,146 A | 12/1994 | Chalmers .................... 375/103 |
| 5,379,040 A | 1/1995 | Mizomoto et al. .......... 341/143 |
| 5,379,141 A | 1/1995 | Thompson et al. ......... 359/125 |
| 5,388,063 A | 2/1995 | Takatori et al. ........ 364/724.17 |
| 5,389,839 A | 2/1995 | Heck |
| 5,390,364 A | 2/1995 | Webster et al. ............ 455/52.3 |
| 5,400,084 A | 3/1995 | Scarpa ......................... 348/624 |
| 5,404,127 A | 4/1995 | Lee et al. .............. 340/310.02 |
| 5,410,326 A | 4/1995 | Goldstein |
| 5,410,541 A | 4/1995 | Hotto ........................... 370/76 |
| 5,410,743 A | 4/1995 | Seely et al. ................. 455/326 |
| 5,412,352 A | 5/1995 | Graham ...................... 332/103 |
| 5,416,803 A | 5/1995 | Janer .......................... 375/324 |
| 5,422,909 A | 6/1995 | Love et al. |
| 5,422,913 A | 6/1995 | Wilkinson ................... 375/347 |
| 5,423,082 A | 6/1995 | Cygan et al. ................ 455/126 |
| 5,428,638 A | 6/1995 | Cioffi et al. ................. 375/224 |
| 5,428,640 A | 6/1995 | Townley ..................... 375/257 |
| 5,434,546 A | 7/1995 | Palmer ....................... 332/151 |
| 5,438,329 A * | 8/1995 | Gastouniotis et al. .. 340/870.02 |
| 5,438,692 A | 8/1995 | Mohindra .................... 455/324 |
| 5,440,311 A | 8/1995 | Gallagher et al. |
| 5,444,415 A | 8/1995 | Dent et al. .................. 329/302 |
| 5,444,416 A | 8/1995 | Ishikawa et al. ............. 329/341 |
| 5,444,865 A | 8/1995 | Heck et al. ................... 455/86 |
| 5,446,421 A | 8/1995 | Kechkaylo .................. 332/100 |
| 5,446,422 A | 8/1995 | Mattila et al. ............... 332/103 |
| 5,448,602 A | 9/1995 | Ohmori et al. ............. 375/347 |
| 5,451,899 A | 9/1995 | Lawton ....................... 329/320 |
| 5,454,007 A | 9/1995 | Dutta .......................... 375/322 |
| 5,454,009 A | 9/1995 | Fruit et al. ................... 372/202 |
| 5,463,356 A | 10/1995 | Palmer ....................... 332/117 |
| 5,463,357 A | 10/1995 | Hobden ...................... 332/151 |
| 5,465,071 A | 11/1995 | Kobayashi et al. .......... 329/315 |
| 5,465,410 A | 11/1995 | Hiben et al. ................ 455/266 |
| 5,465,415 A | 11/1995 | Bien .......................... 455/326 |
| 5,465,418 A | 11/1995 | Zhou et al. .................. 455/332 |

| Patent No. | Date | Inventor | Class |
|---|---|---|---|
| 5,471,162 A | 11/1995 | McEwan | 327/92 |
| 5,471,665 A | 11/1995 | Pace et al. | |
| 5,479,120 A | 12/1995 | McEwan | 327/91 |
| 5,479,447 A | 12/1995 | Chow et al. | 375/260 |
| 5,483,193 A | 1/1996 | Kennedy et al. | 329/300 |
| 5,483,549 A | 1/1996 | Weinberg et al. | 375/200 |
| 5,483,691 A | 1/1996 | Heck et al. | 455/234.2 |
| 5,483,695 A | 1/1996 | Pardoen | |
| 5,490,173 A | 2/1996 | Whikehart et al. | 375/316 |
| 5,490,176 A | 2/1996 | Peltier | |
| 5,493,581 A | 2/1996 | Young et al. | 375/350 |
| 5,493,721 A | 2/1996 | Reis | 455/339 |
| 5,495,200 A | 2/1996 | Kwan et al. | 327/554 |
| 5,495,202 A | 2/1996 | Hsu | 327/113 |
| 5,495,500 A | 2/1996 | Jovanovich et al. | 375/206 |
| 5,499,267 A | 3/1996 | Ohe et al. | 375/206 |
| 5,500,758 A | 3/1996 | Thompson et al. | 359/189 |
| 5,513,389 A | 4/1996 | Reeser et al. | 455/311 |
| 5,515,014 A | 5/1996 | Troutman | 332/178 |
| 5,517,688 A | 5/1996 | Fajen et al. | 455/333 |
| 5,519,890 A | 5/1996 | Pinckley | 455/307 |
| 5,523,719 A | 6/1996 | Longo et al. | 327/557 |
| 5,523,726 A | 6/1996 | Kroeger et al. | 332/103 |
| 5,523,760 A | 6/1996 | McEwan | 342/89 |
| 5,539,770 A | 7/1996 | Ishigaki | 375/206 |
| 5,555,453 A | 9/1996 | Kajimoto et al. | 455/266 |
| 5,557,641 A | 9/1996 | Weinberg | 375/295 |
| 5,557,642 A | 9/1996 | Williams | 375/316 |
| 5,563,550 A | 10/1996 | Toth | 329/347 |
| 5,564,097 A | 10/1996 | Swanke | |
| 5,574,755 A | 11/1996 | Persico | 375/295 |
| 5,579,341 A | 11/1996 | Smith et al. | 375/267 |
| 5,579,347 A | 11/1996 | Lindquist et al. | 375/346 |
| 5,584,068 A | 12/1996 | Mohindra | 455/324 |
| 5,589,793 A | 12/1996 | Kassapian | |
| 5,592,131 A | 1/1997 | Labreche et al. | 332/103 |
| 5,600,680 A | 2/1997 | Mishima et al. | |
| 5,602,847 A | 2/1997 | Pagano et al. | 370/484 |
| 5,602,868 A | 2/1997 | Wilson | 375/219 |
| 5,604,592 A | 2/1997 | Kotidis et al. | 356/357 |
| 5,604,732 A | 2/1997 | Kim et al. | 370/342 |
| 5,606,731 A | 2/1997 | Pace et al. | |
| 5,608,531 A | 3/1997 | Honda et al. | 386/1 |
| 5,610,946 A | 3/1997 | Tanaka et al. | 375/269 |
| RE35,494 E | 4/1997 | Nicollini | 327/554 |
| 5,617,451 A | 4/1997 | Mimura et al. | 375/340 |
| 5,619,538 A | 4/1997 | Sempel et al. | 375/328 |
| 5,621,455 A | 4/1997 | Rogers et al. | 348/6 |
| 5,628,055 A | 5/1997 | Stein | |
| 5,630,227 A | 5/1997 | Bella et al. | 455/324 |
| 5,633,815 A | 5/1997 | Young | |
| 5,638,396 A | 6/1997 | Klimek | 372/92 |
| 5,640,415 A | 6/1997 | Pandula | 375/202 |
| 5,640,424 A | 6/1997 | Banavong et al. | 375/316 |
| 5,640,428 A | 6/1997 | Abe et al. | 375/334 |
| 5,640,698 A | 6/1997 | Shen et al. | 455/323 |
| 5,648,985 A | 7/1997 | Bjerede et al. | 375/219 |
| 5,650,785 A | 7/1997 | Rodal | 342/357 |
| 5,661,424 A | 8/1997 | Tang | 327/105 |
| 5,663,878 A | 9/1997 | Walker | 363/159 |
| 5,663,986 A | 9/1997 | Striffler | 375/260 |
| 5,668,836 A | 9/1997 | Smith et al. | 375/316 |
| 5,675,392 A | 10/1997 | Nayebi et al. | 348/584 |
| 5,678,220 A | 10/1997 | Fournier | |
| 5,680,078 A | 10/1997 | Ariie | 332/178 |
| 5,680,418 A | 10/1997 | Croft et al. | 375/346 |
| 5,689,413 A | 11/1997 | Jaramillo et al. | 363/146 |
| 5,694,096 A | 12/1997 | Ushiroku et al. | 333/195 |
| 5,699,006 A | 12/1997 | Zele et al. | 327/341 |
| 5,705,949 A | 1/1998 | Alelyunas et al. | 329/304 |
| 5,705,955 A | 1/1998 | Freeburg et al. | 331/14 |
| 5,710,998 A | 1/1998 | Opas | 455/324 |
| 5,714,910 A | 2/1998 | Skoczen et al. | 331/3 |
| 5,715,281 A | 2/1998 | Bly | 375/344 |
| 5,721,514 A | 2/1998 | Crockett et al. | 331/3 |
| 5,724,002 A | 3/1998 | Hulick | 329/361 |
| 5,724,653 A | 3/1998 | Baker et al. | 455/296 |
| 5,729,577 A | 3/1998 | Chen | 375/334 |
| 5,729,829 A | 3/1998 | Talwar et al. | 455/63 |
| 5,732,333 A | 3/1998 | Cox et al. | 455/126 |
| 5,736,895 A | 4/1998 | Yu et al. | 327/554 |
| 5,737,035 A | 4/1998 | Rotzoll | 348/725 |
| 5,742,189 A | 4/1998 | Yoshida et al. | 327/113 |
| 5,748,683 A | 5/1998 | Smith et al. | 375/347 |
| 5,757,858 A | 5/1998 | Black et al. | |
| 5,757,870 A | 5/1998 | Miya et al. | 375/367 |
| RE35,829 E | 6/1998 | Sanderford, Jr. | 375/200 |
| 5,760,645 A | 6/1998 | Comte et al. | 329/304 |
| 5,764,087 A | 6/1998 | Clark | 327/105 |
| 5,767,726 A | 6/1998 | Wang | 327/356 |
| 5,768,118 A | 6/1998 | Faulk et al. | 363/72 |
| 5,768,323 A | 6/1998 | Kroeger et al. | 375/355 |
| 5,770,985 A | 6/1998 | Ushiroku et al. | 333/193 |
| 5,771,442 A | 6/1998 | Wang et al. | 455/93 |
| 5,777,692 A | 7/1998 | Ghosh | 348/725 |
| 5,777,771 A | 7/1998 | Smith | 359/180 |
| 5,778,022 A | 7/1998 | Walley | 375/206 |
| 5,786,844 A | 7/1998 | Rogers et al. | 348/6 |
| 5,793,801 A | 8/1998 | Fertner | 375/219 |
| 5,793,818 A | 8/1998 | Claydon et al. | 375/326 |
| 5,801,654 A | 9/1998 | Traylor | 341/144 |
| 5,802,463 A | 9/1998 | Zuckerman | 455/208 |
| 5,809,060 A | 9/1998 | Cafarella et al. | 375/206 |
| 5,812,546 A | 9/1998 | Zhou et al. | 370/342 |
| 5,818,582 A | 10/1998 | Fernandez et al. | 356/318 |
| 5,818,869 A | 10/1998 | Miya et al. | 375/206 |
| 5,825,254 A | 10/1998 | Lee | 331/25 |
| 5,834,985 A | 11/1998 | Sundegård | 332/100 |
| 5,841,324 A | 11/1998 | Williams | 331/17 |
| 5,841,811 A | 11/1998 | Song | 375/235 |
| 5,844,449 A | 12/1998 | Abeno et al. | 332/105 |
| 5,859,878 A | 1/1999 | Phillips et al. | 375/316 |
| 5,864,754 A | 1/1999 | Hotto | 455/280 |
| 5,870,670 A | 2/1999 | Ripley et al. | |
| 5,872,446 A | 2/1999 | Cranford, Jr. et al. | 323/315 |
| 5,881,375 A | 3/1999 | Bonds | 455/118 |
| 5,883,548 A | 3/1999 | Assard et al. | 329/306 |
| 5,892,380 A | 4/1999 | Quist | 327/172 |
| 5,894,239 A | 4/1999 | Bonaccio et al. | 327/176 |
| 5,894,496 A | 4/1999 | Jones | 455/126 |
| 5,896,562 A | 4/1999 | Heinonen | 455/76 |
| 5,898,912 A | 4/1999 | Heck et al. | |
| 5,900,747 A | 5/1999 | Brauns | 327/9 |
| 5,901,054 A | 5/1999 | Leu et al. | 363/41 |
| 5,901,187 A | 5/1999 | Iinuma | 375/347 |
| 5,901,344 A | 5/1999 | Opas | 455/76 |
| 5,901,347 A | 5/1999 | Chambers et al. | 455/234.1 |
| 5,901,348 A | 5/1999 | Bang et al. | 455/254 |
| 5,901,349 A | 5/1999 | Guegnaud et al. | 455/302 |
| 5,903,178 A | 5/1999 | Miyatsuji et al. | 327/308 |
| 5,903,187 A | 5/1999 | Claverie et al. | 329/342 |
| 5,903,196 A | 5/1999 | Salvi et al. | 331/16 |
| 5,903,421 A | 5/1999 | Furutani et al. | 361/58 |
| 5,903,553 A | 5/1999 | Sakamoto et al. | 370/338 |
| 5,903,595 A | 5/1999 | Suzuki | 375/207 |
| 5,903,609 A | 5/1999 | Kool et al. | 375/261 |
| 5,903,827 A | 5/1999 | Kennan et al. | 455/326 |
| 5,903,854 A | 5/1999 | Abe et al. | 455/575 |
| 5,905,449 A | 5/1999 | Tsubouchi et al. | 340/925.69 |
| 5,907,149 A | 5/1999 | Marckini | 235/487 |
| 5,907,197 A | 5/1999 | Faulk | 307/119 |
| 5,909,447 A | 6/1999 | Cox et al. | 370/508 |

| | | | | | | |
|---|---|---|---|---|---|---|
| 5,911,116 A | 6/1999 | Nosswitz ............... 455/83 | | 6,531,979 B1 | 3/2003 | Hynes |
| 5,911,123 A | 6/1999 | Shaffer et al. ........... 455/554 | | 6,542,722 B1 | 4/2003 | Sorrells et al. |
| 5,914,622 A | 6/1999 | Inoue .................. 327/172 | | 6,560,301 B1 | 5/2003 | Cook et al. |
| 5,915,278 A | 6/1999 | Mallick ................ 73/658 | | 6,580,902 B1 | 6/2003 | Sorrells et al. |
| 5,920,199 A | 7/1999 | Sauer ................. 324/678 | | 6,600,911 B1 | 7/2003 | Morishige et al. |
| 5,926,065 A | 7/1999 | Wakai et al. | | 6,611,569 B1 * | 8/2003 | Schier et al. ............. 375/322 |
| 5,926,513 A | 7/1999 | Suominen et al. | | 6,686,879 B2 | 2/2004 | Shattil |
| 5,933,467 A | 8/1999 | Sehier et al. ............. 375/350 | | 6,697,603 B1 | 2/2004 | Lovinggood et al. |
| 5,937,013 A | 8/1999 | Lam et al. | | | | |
| 5,943,370 A | 8/1999 | Smith ................. 375/334 | | FOREIGN PATENT DOCUMENTS | | |
| 5,945,660 A | 8/1999 | Nakasuji et al. ....... 235/462.46 | EP | 0 035 166 A1 | 9/1981 | ........... H04B/1/26 |
| 5,949,827 A | 9/1999 | DeLuca et al. | EP | 0 087 336 A1 | 8/1983 | ........... H03D/7/12 |
| 5,952,895 A | 9/1999 | McCune, Jr. et al. ....... 332/128 | EP | 0 099 265 A1 | 1/1984 | ........... H03D/3/04 |
| 5,953,642 A | 9/1999 | Feldtkeller et al. ...... 455/195.1 | EP | 0 087 336 B1 | 7/1986 | ........... H03D/7/12 |
| 5,955,992 A | 9/1999 | Shattil | EP | 0 254 844 A2 | 2/1988 | ........... H03D/7/00 |
| 5,956,025 A | 9/1999 | Goulden et al. | EP | 0 276 130 A2 A3 | 7/1988 | |
| 5,959,850 A | 9/1999 | Lim ................... 363/17 | EP | 0 193 899 B1 | 6/1990 | ........... G01S/7/52 |
| 5,960,033 A | 9/1999 | Shibano et al. ............. 375/207 | EP | 0 380 351 A2 | 8/1990 | .......... H03H/17/04 |
| 5,970,053 A | 10/1999 | Schick et al. | EP | 0 380 351 A3 | 2/1991 | .......... H03H/17/04 |
| 5,982,315 A | 11/1999 | Bazarjani et al. | EP | 0 411 840 A2 | 2/1991 | .......... G01R/33/36 |
| 5,995,030 A | 11/1999 | Cabler | EP | 0 423 718 A2 | 4/1991 | ........... H04N/7/01 |
| 5,999,561 A | 12/1999 | Naden et al. | EP | 0 411 840 A3 | 7/1991 | .......... G01R/33/36 |
| 6,014,176 A | 1/2000 | Nayebi et al. | EP | 0 486 095 A1 | 5/1992 | ........... H03D/3/00 |
| 6,014,551 A | 1/2000 | Pesola et al. | EP | 0 423 718 A3 | 8/1992 | ........... H04N/7/01 |
| 6,018,262 A | 1/2000 | Noro et al. | EP | 0 512 748 A2 | 11/1992 | ........... H04N/9/64 |
| 6,018,553 A | 1/2000 | Sanielevici et al. | EP | 0 529 836 A1 | 3/1993 | ........... H03L/7/089 |
| 6,028,887 A | 2/2000 | Harrison et al. ............. 375/206 | EP | 0 548 542 A1 | 6/1993 | .......... H03B/19/14 |
| 6,031,217 A | 2/2000 | Aswell et al. | EP | 0 512 748 A3 | 7/1993 | ........... H04N/9/64 |
| 6,041,073 A | 3/2000 | Davidovici et al. ......... 375/148 | EP | 0 560 228 A1 | 9/1993 | ........... H03D/7/12 |
| 6,047,026 A | 4/2000 | Chao et al. | EP | 0 632 288 A2 | 1/1995 | .......... G01S/13/75 |
| 6,049,573 A | 4/2000 | Song | EP | 0 632 577 A1 | 1/1995 | ........... H03D/7/16 |
| 6,049,706 A | 4/2000 | Cook et al. ............. 455/313 | EP | 0 696 854 A1 | 2/1995 | ........... H04B/1/26 |
| 6,054,889 A | 4/2000 | Kobayashi ............. 327/357 | EP | 0 643 477 A2 A3 | 3/1995 | ........... H03D/7/16 |
| 6,061,551 A | 5/2000 | Sorrells et al. ............. 455/118 | EP | 0 411 840 B1 | 10/1995 | .......... G01R/33/36 |
| 6,061,555 A | 5/2000 | Bultman et al. ............. 455/313 | EP | 0 632 288 A3 | 7/1996 | .......... G01S/13/75 |
| 6,073,001 A | 6/2000 | Sokoler | EP | 0 732 803 A1 | 9/1996 | ........... H03D/3/00 |
| 6,076,015 A | 6/2000 | Hartley et al. | EP | 0 486 095 B1 | 2/1997 | ........... H03D/3/00 |
| 6,078,630 A | 6/2000 | Prasanna | EP | 0 782 275 A2 | 7/1997 | ........... H04B/7/02 |
| 6,081,691 A | 6/2000 | Renard et al. ............. 455/12.1 | EP | 0 785 635 A1 | 7/1997 | ........... H04B/1/713 |
| 6,084,922 A | 7/2000 | Zhou et al. ............. 375/316 | EP | 0 789 449 A2 A3 | 8/1997 | ........... H03D/7/12 |
| 6,085,073 A | 7/2000 | Palermo et al. | EP | 0 795 978 A2 | 9/1997 | ........... H04L/5/06 |
| 6,091,939 A | 7/2000 | Banh ................. 455/102 | EP | 0 795 955 A2 A3 | 9/1997 | .......... H03D/13/00 |
| 6,091,940 A | 7/2000 | Sorrells et al. ............. 455/118 | EP | 0 817 369 A2 A3 | 1/1998 | ........... H03D/7/00 |
| 6,091,941 A | 7/2000 | Moriyama et al. .......... 455/126 | EP | 0 837 565 A1 | 4/1998 | ........... H04B/1/69 |
| 6,098,046 A | 8/2000 | Cooper et al. | EP | 0 862 274 A1 | 9/1998 | ........... H03M/1/06 |
| 6,098,886 A | 8/2000 | Swift et al. ............. 235/472.01 | EP | 0 874 499 A2 | 10/1998 | ........... H04L/25/06 |
| 6,121,819 A | 9/2000 | Traylor ................. 327/359 | EP | 0 512 748 B1 | 11/1998 | ........... H04N/9/64 |
| 6,125,271 A | 9/2000 | Rowland ................. 455/313 | EP | 0 877 476 A1 | 11/1998 | ........... H03D/7/16 |
| 6,127,941 A | 10/2000 | Van Ryzin | EP | 0 977 351 A1 | 2/2000 | ........... H03D/7/16 |
| 6,144,236 A | 11/2000 | Vice et al. ................. 327/113 | FR | 2 245 130 | 4/1975 | ........... H03K/5/13 |
| 6,144,331 A | 11/2000 | Jiang | FR | 2 669 787 A1 | 5/1992 | ........... H03D/7/14 |
| 6,144,846 A | 11/2000 | Durec ................. 455/323 | FR | 2 743 231 A1 | 7/1997 | ........... H04B/7/12 |
| 6,147,340 A | 11/2000 | Levy ................. 250/214 R | GB | 2 161 344 A | 1/1986 | ........... H04B/7/12 |
| 6,147,763 A | 11/2000 | Steinlechner ............. 356/484 | GB | 2 215 945 A | 9/1989 | ........... H04L/27/00 |
| 6,150,890 A | 11/2000 | Damgaard et al. ........... 331/14 | GB | 2 324 919 A | 11/1998 | ........... H03D/7/18 |
| 6,151,354 A | 11/2000 | Abbey | JP | 47-2314 | 2/1972 | |
| 6,169,733 B1 | 1/2001 | Lee | JP | 55-66057 | 5/1980 | ........... G06K/7/10 |
| 6,175,728 B1 | 1/2001 | Mitama ................. 455/323 | JP | 56-114451 | 9/1981 | ........... H04B/7/02 |
| 6,215,475 B1 | 4/2001 | Meyerson et al. .......... 345/173 | JP | 58-7903 | 1/1983 | ........... H03C/1/02 |
| 6,230,000 B1 | 5/2001 | Tayloe | JP | 58-133004 | 8/1983 | ........... H03D/1/00 |
| 6,266,518 B1 | 7/2001 | Sorrells et al. ............. 455/118 | JP | 59-144249 | 8/1984 | ........... H04L/27/00 |
| 6,314,279 B1 | 11/2001 | Mohindra | JP | 60-58705 | 4/1985 | ........... H03D/7/00 |
| 6,317,589 B1 | 11/2001 | Nash | JP | 60-130203 | 7/1985 | ........... H03D/7/00 |
| 6,327,313 B1 | 12/2001 | Traylor et al. | JP | 61-30821 | 2/1986 | ........... H04B/1/10 |
| 6,330,244 B1 | 12/2001 | Swartz et al. | JP | 63-54002 | 3/1988 | .......... H03B/19/14 |
| 6,353,735 B1 | 3/2002 | Sorrells et al. ............. 455/118 | JP | 63-65587 | 3/1988 | ........... G06K/7/10 |
| 6,363,262 B1 | 3/2002 | McNicol | JP | 63-153691 | 6/1988 | .......... G06K/17/00 |
| 6,370,371 B1 | 4/2002 | Sorrells et al. ............. 455/323 | JP | 2-39632 | 2/1990 | ........... H04B/7/12 |
| 6,400,963 B1 | 6/2002 | Glöckler et al. | JP | 2-131629 | 5/1990 | ........... H04B/7/12 |
| 6,421,534 B1 | 7/2002 | Cook et al. | JP | 2-276351 | 11/1990 | ........... H04L/27/22 |
| 6,459,721 B1 | 10/2002 | Mochizuki et al. | JP | 4-123614 | 4/1992 | ....... H03K/19/0175 |

| | | | | |
|---|---|---|---|---|
| JP | 4-127601 | 4/1992 | ............ | H03D/7/00 |
| JP | 5-175730 | 7/1993 | ............ | H03D/1/00 |
| JP | 5-175734 | 7/1993 | ............ | H03D/3/00 |
| JP | 5-327356 | 12/1993 | ............ | H03D/7/00 |
| JP | 6-237276 | 8/1994 | ............ | H04L/27/20 |
| JP | 7-154344 | 6/1995 | ............ | H04B/14/06 |
| JP | 7-307620 | 11/1995 | ............ | H03D/1/18 |
| JP | 8-23359 | 1/1996 | ............ | H04L/27/20 |
| JP | 8-32556 | 2/1996 | ............. | H04L/1/04 |
| JP | 8-139524 | 5/1996 | ............ | H03D/7/00 |
| WO | WO 80/01633 A1 | 8/1980 | ............. | H04J/1/08 |
| WO | WO 91/18445 A1 | 11/1991 | ............ | H03D/7/18 |
| WO | WO 94/05087 A1 | 3/1994 | ............ | H03M/1/00 |
| WO | WO 95/01006 A1 | 1/1995 | ............ | H03M/1/66 |
| WO | WO 96/02977 A1 | 2/1996 | ............ | H04B/1/26 |
| WO | WO 96/08078 A1 | 3/1996 | ............ | H03D/3/00 |
| WO | WO 96/39750 A1 | 12/1996 | ............ | H04B/1/26 |
| WO | WO 97/08839 A2 A3 | 3/1997 | ............ | H04B/1/04 |
| WO | WO 97/38490 A1 | 10/1997 | ............ | H03K/7/00 |
| WO | WO 98/00953 A1 | 1/1998 | ............ | H04L/27/26 |
| WO | WO 98/24201 A1 | 6/1998 | ............ | H04H/1/00 |
| WO | WO 98/40968 A2 A3 | 9/1998 | ............. | H03L/7/08 |
| WO | WO 99/23755 A1 | 5/1999 | ............ | H03D/7/16 |
| WO | WO 00/31659 A1 | 6/2000 | | |

OTHER PUBLICATIONS

Al–Ahmad, H.A.M. et al., "Doppler Frequency Correction for a Non–Geostationary Communications Satellite. Techniques for CERS and T–SAT," *Electronics Division Colloquium on Low Noise Oscillators and Synthesizers*, IEE, pp. 4/1–4/5 (Jan. 23, 1986).

Ali, I. et al., "Doppler Characterization for LEO Satellites," *IEEE Transactions on Communications*, IEEE, vol. 46, No. 3, pp. 309–313 (Mar. 1998).

Allan, D.W., "Statistics of Atomic Frequency Standards," *Proceedings Of The IEEE Special Issue on Frequency Stability*, IEEE, pp. 221–230 (Feb. 1966).

Allstot, D.J. et al., "MOS Switched Capacitor Ladder Filters," *IEEE Journal of Solid–State Circuits*, IEEE, vol. SC–13, No. 6, pp. 806–814 (Dec. 1978).

Allstot, D.J. and Black Jr. W.C., "Technological Design Considerations for Monolithic MOS Switched–Capacitor Filtering Systems," *Proceedings of the IEEE*, IEEE, vol. 71, No. 8, pp. 967–986 (Aug. 1983).

Alouini, M. et al., "Channel Characterization and Modeling for Ka–Band Very Small Aperture Terminals," *Proceedings Of the IEEE*, IEEE, vol. 85, No. 6, p. 981–997 (Jun. 1997).

Andreyev, G.A. and Ogarev, S.A., "Phase Distortions of Keyed Millimeter–Wave Signals in the Case of Propagation in a Turbulent Atmosphere," *Telecommunications and Radio Engineering*, Scripta Technica, vol. 43, No. 12, pp. 87–90 (Dec. 1988).

Antonetti, A. et al., "Optoelectronic Sampling in the Picosecond Range," *Optics Communications*, North–Holland Publishing Company, vol. 21, No. 2, pp. 211–214 (May 1977).

Austin, J. et al., "Doppler Correction of the Telecommunication Payload Oscillators in the UK T–SAT," *18th European Microwave Conference*, Microwave Exhibitions and Publishers Ltd., pp. 851–857 (Sep. 12–15, 1988).

Auston, D.H., "Picosecond optoelectronic switching and gating in silicon," *Applied Physics Letters*, American Institute of Physics, vol. 26, No. 3, pp. 101–103 (Feb. 1, 1975).

Baher, H., "Transfer Functions for Switched–Capacitor and Wave Digital Filters," *IEEE Transactions on Circuits and Systems*, IEEE Circuits and Systems Society, vol. CAS–33, No. 11, pp. 1138–1142 (Nov. 1986).

Baines, R., "The DSP Bottleneck," *IEEE Communications Magazine*, IEEE Communicatons Society, pp. 46–54 (May 1995).

Banjo, O.P. and Vilar, E., "Binary Error Probabilities on Earth–Space Links Subject to Scintillation Fading," *Electronics Letters*, IEE, vol. 21, No. 7, pp. 296–297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation,* IEE, pp. 277–280 (Mar. 30–Apr. 2, 1987).

Banjo, O.P. and Vilar, E. "Measurement and Modeling of Amplitude Scintillations on Low–Elevation Earth–Space Paths and Impact on Communication Systems," *IEEE Transactions on Communications*, IEEE Communications Society, vol. COM–34, No. 8, pp. 774–780 (Aug. 1986).

Banjo, O.P. et al., "Tropospheric Amplitude Spectra Due to Absorption and Scattering in Earth–Space Paths," *Fourth International Conference on Antennas and Propagation (ICAP 85)*, IEE, pp. 77–82 (Apr. 16–19, 1985).

Basili,P. et al., "Case Study of Intense Scintillation Events on the OTS Path," *IEEE Transactions on Antennas and Propagation*, IEEE, vol. 38, No. 1, pp. 107–113 (Jan. 1990).

Basilli, P. et al., "Observation of High $C^2$ and Turbulent Path Length on OTS Space–Earth Link," *Electronics Letters*, IEE, vol. 24, No. 17, pp. 1114–1116 (Aug. 18, 1988).

Blakey, J.R. et al., "Measurement of Atmospheric Millimetre–Wave Phase Scintillations in an Absorption Region," *Electronics Letters*, IEE, vol. 21, No. 11, pp. 486–487 (May 23, 1985).

Burgueño, A. et al., "Influence of rain gauge integration time on the rain rate statistics used in microwave communications," *annalkes des tèlècommunications,* International Union of Radio Science, pp. 522–527 (Sep./Oct. 1988).

Burgueño, A. et al, "Long–Term Joint Statistical Analysis of Duration and Intensity of Rainfall Rate with Application to Microwave Communications," *Fifth International Conference on Antennas and Propagation (ICAP 87) Part 2: Propagation,* IEE, pp. 198–201 (Mar. 30–Apr. 2, 1987).

Burgueño, A. et al., "Long Term Statistics of Precipitation Rate Return Periods in the Context of Microwave Communications," *Sixth International Conference on Antennas and Propagation (ICAP 89) Part 2: Propagation,* IEE, pp. 297–301 (Apr. 4–7, 1989).

Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359–1366 (Sep. 1990).

Catalan, C. and Vilar, E., "Approach for satellite slant path remote sensing," *Electronics Letters*, IEE, vol. 34, No. 12, pp. 1238–1240 (Jun. 11, 1998).

Chan, P. et al., "A Highly Linear 1–GHz CMOS Downconversion Mixer," *European Solid State Circuits Conference*, IEEE Communication Society, pp. 210–213 (Sep. 22–24, 1993).

Copy of Declaration of Michael J. Bultman filed in patent application Ser. No. 09/176,022, which is directed to related subject matter, 2 pages.

Copy of Declaration of Robert W. Cook filed in patent application Ser. No. 09/176,022, which is directed to related subject matter, 2 pages.

Copy of Declaration of Alex Holtz filed in patent application Ser. No. 09/176,022, which is directed to related subject matter, 3 pages.

Copy of Declaration of Richard C. Looke filed in patent applicatrion Ser. No. 09/176,022, which is directed to related subject matter, 2 pages.

Copy of Declaration of Charley D. Moses, Jr. filed in patent application Ser. No. 09/176,022, which is directed to related subject matter, 2 pages.

Copy of Declaration of Jeffrey L. Parker and David F. Sorrells, with attachment Exhibit 1, filed in patent application Ser. No. 09/176,022, which is directed to related subject matter, 130 pages.

Dewey, R.J. and Collier, C.J., "Multi–Mode Radio Receiver," *Electronics Division Colloquium on Digitally Implemented Radios*, IEE, pp. 3/1–3/5 (Oct. 18, 1985).

Dialog File 347 (JAPIO) English Language Patent Abstract for JP 2–276351, 1 page (Nov. 13, 1990—Date of publication of application).

Dialog File 247 (JAPIO) English Language Patent Abstract for JP 2–131629, 1 page (May 21, 1990—Date of publication of application).

Dialog File 347 (JAPIO) English Language Patent Abstract for JP 2–39632, 1 page (Feb. 8, 1990—Date of publication of application).

Dialog File 348 (European Patents) English Language Patent Abstract for EP 0 785 635 A1, 3 pages (Dec. 26, 1996—Date of publication of application).

Dialog File 348 (European Patents) English Language Patent Abstract for EP 35166 A1, 2 pages (Feb. 18, 1981—Date of publication of application).

"DSO takes sampling rate to 1 Ghz," *Electronic Engineering*, Morgan Grampian Publishers, vol. 59, No. 723, pp. 77 and 79 (Mar. 1987).

Erdi, G. and Henneuse, P.R., "A Precision FET–Less Sample–and–Hold with High Charge–to–Droop Current Ratio," *IEEE Journal of Solid–State Circuits*, IEEE, vol. SC–13, No. 6, pp. 864–873 (Dec. 1978).

Faulkner, N.D. and Vilar, E., "Subharmonic Sampling for the Measurement of Short Term Stabillity of Microwave Oscillators," *IEEE Transactions on Instrumentation and Measurement*, IEEE, vol. IM–32, No. 1, pp. 208–213 (Mar. 1983).

Faulkner, N.D. et al., "Sub–Harmonic Sampling for the Accurate Measurement of Frequency Stabililty of Microwave Oscillators," *CPEM 82 Digest: Conference on Precision Electromagenetic Measurements*, IEEE, pp. M–10 and M–11 (1982).

Faulkner, N.D. and Vilar, E., "Time Domain Analysis of Frequency Stability Using Non–Zero Dead–Time Counter Techniques," *CPEM 84 Digest Conference on Precision Electromagnetic Measurements*, IEEE, pp. 81–82 (1984).

Filip, M. and Vilar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958–1965 (Nov. 1990).

Fukahori, K., "A CMOS Narrow–Band Signaling Filter with Q Reduction," *IEEE Journal of Solid–State Circuits*, IEEE, vol. SC–19, No. 6, pp. 926–932 (Dec. 1984).

Fukuchi, H. and Otsu, Y., "Available time statistics of rain attentuation on earth–space path," *IEE Proceedings–H: Microwaves, Antennas and Propagation*, IEE, vol. 135, Pt. H, No. 6, pp. 387–390 (Dec. 1988).

Gibbins, C.J. and Chadha, R., "Millimetre–wave propagation through hydrocarbon flame," *IEE Proceedings*, IEE, vol. 134, Pt. H, No.2, pp. 169–173 (Apr. 1987).

Gilchrist, B. et al., "Sampling hikes performance of frequency synthesizers," *Microwaves & RF*, Hayden Publishing, vol. 23, No. 1, pp. 93–94, and 110 (Jan. 1984).

Gossard, E.E., "Clear weather meteorological effects on propagation at frequencies above 1 Ghz," *Radio Science*, American Geophysical Union, vol. 16, NO. 5, pp. 589–608 (Sep.–Oct. 1981).

Gregorian, R. et al., "Switched–Capacitor Circuit Design," *Proceedings of the IEEE*, IEEE vol. 71, No. 8, pp. 941–966 (Aug. 1983).

Groshong et al., "Undersampling Techniques Simplify Digital Radio," *Electronic Design*, Penton Publishing, pp. 67–68, 70, 73–75 and 78 (May 23, 1991).

Grove, W.M., "Sampling for Oscilloscopes and Other RF Systems: Dc through X–Band," *IEEE Transactions on Microwave Theory and Techniques*, IEEE, pp. 629–635 (Dec. 1966).

Haddon, J. et al., "Measurement of Microwave Scintillations on a Satellite Down–Link at X–Band," *Antennas and Propagation*, IEE, pp. 113–117 (1981).

Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP–34, No. 5, pp. 646–657 (May 1986).

Hafdallah, H. et al., "2–4 Ghz MESFET Sampler," *Electronics Letters*, IEE, vol. 24, No. 24, No. 3, pp. 151–153 (Feb. 4, 1988).

Herben, M.H.A.J., "Amplitude and Phase Scintillation Measurements on 8–2 km Line–Of–Sight Path at 30 Ghz," *Electronics Letters*, IEE, vol. 18, No. 7, pp. 287–289 (Apr. 1, 1982).

Hewitt, A. et al., "An 18 Ghz Wideband LOS Multipath Experiment," *International Conference on Measurements for Telecommunication Transmission System—MTTS 85*, IEE, pp. 112–116 (Nov. 27–28, 1985).

Hewitt, A. et al., "An Autoregressive Approach to the Identification of Multipath Ray Parameters from Field Measurements," *IEEE Transactions on Communications*, IEEE Communications Society, vol. 37, No. 11, pp. 1136–1143 (Nov. 1989).

Hewitt, A. and Vilar, E., "Selective fading on LOS Microwave Links: Classical and Spread–Spectrum Measurement Techniques," *IEEE Transactions on Communications*, IEEE Communications Society, vol. 36, No. 7, pp. 789–796 (Jul. 1988).

Hospitalier, E., "Instruments for Recording and Observing Rapidly Varying Phenomena," *Science Abstracts*, IEE, vol. VII, pp. 22–23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115–121 (Sep. 18–20, 1990).

Hu, X., *A Switched–Current Sample–and–Hold Amplifier for FM Demodulation*, Thesis for Master of Applied Science, Dept. of Electrical and Computer Engineering, University of Toronto, UMI Dissertatioin Services, pp. 1–64 (1995).

Hung, H–L. A. et al., "Characterization of Microwave Integrated Circuits Using An Optical Phase–Locking and Sampling System," *IEEE MTT–S Digest*, IEEE, pp. 507–510 (1991).

Hurst, P.J., "Shifting the Frequency Response of Switched–Capacitor Filters by Nonuniform Sampling," *IEEE Transactions on Circuits and Systems*, IEEE Circuits and Systems Society, vol. 38, No. 1, pp. 12–19 (Jan. 1991).

Itakura, T., "Effects of the sampling pulse width on the frequency characteristics of a sample–and–hold circuit," *IEE Proceedings Circuits, Devices and Systems*, IEE, vol. 141, No. 4, pp. 328–336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52–59 (Aug. 1950).

Janssen, J.M.L. and Michels, A.J., "An Experimental 'Stroboscopic' Oscilloscope for Frequencies up to about 50 Mc/s: II. Electrical Build–Up," *Philips Technical Review*, Philips Research Laboratories, vol. 12, No. 3, pp. 73–82 (Sep. 1950).

Jondral, V.F. et al., "Doppler Profiles for Communication Satellites," *Frequenz*, Herausberger, pp. 111–116 (May–Jun. 1996).

Kaleh, G.K., "A Frequency Diversity Spead Spectrum System for Communication in the Presence of In–band Interference," *1995 IEEE Globecom*, IEEE Communications Society, pp. 66–70 (1995).

Karasawa, Y. et al., "A New Prediction Method for Tropospheric Scintillation on Earth–Space Paths," *IEEE Transactions on Antennas and Propagation, IEEE Antennas and Propogation Society*, vol. 36, No. 11, pp. 1608–1614 (Nov. 1988).

Kirsten, J. and Fleming, J., "Undersampling reduces data–acquisition costs for select applications," *EDN*, Cahners Publishing, vol. 35, No. 13, pp. 217–222, 224, 226–228 (Jun. 21, 1990).

Lam, W.K. et al., "Measurement of the Phase Noise Characteristics of an Unlocked Communications Channel Identifier," *Proceedings Of the 1993 IEEE International Frequency Control Symposium*, IEEE, pp. 283–288 (Jun. 2–4, 1993).

Lam, W.K. et al., "Wideband sounding of 11.6 Ghz transhorizon channel," *Electronics Letters*, IEE, vol. 30, No. 9, pp. 738–739 (Apr. 28, 1994).

Larkin, K.G., "Efficient demodulator for bandpass sampled AM signals," *Electronics Letters*, IEE, vol. 32, No. 2, pp. 101–102 (Jan. 18, 1996).

Lau, W.H. et al., "Analysis of the Time Variant Structure of Microwave Line–of–sight Multipath Phenomena," *IEEE Global Telecommunications Conference & Exhibition*, IEEE, pp. 1707–1711 (Nov. 28–Dec. 1, 1988).

Lau, W.H. et al., "Improved Prony Algorithm to Identify Multipath Components," *Electronics Letters*, IEE, vol. 23, No. 20, pp. 1059–1060 (Sep. 24, 1987).

Lesage, P. and Audoin, C., "Effect of Dead–Time on the Estimation of the Two–Sample Variance," *IEEE Transactions on Instrumentation and Measurement*, IEEE Instrumentation and Measurement Society, vol. IM–28, No. 1, pp. 6–10 (Mar. 1979).

Liechti, C.A., "Performance of Dual–gate GaAs MESFET's as Gain–Controlled Low–Noise Amplifiers and High–Speed Modulators," *IEEE Transactions on Microwave Theory and Techniques*, IEEE Microwave Theory and Techniques Society, vol. MTT–23, No. 6, pp. 461–469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS–26, No. 4, pp. 4443–4449 (Aug. 1979).

Liou, M.L., "A Tutorial on Computer–Aided Analysis of Switched–Capacitor Circuits," *Proceedings of the IEEE*, IEEE, vol. 71, No. 8, pp. 987–1005 (Aug. 1983).

Lo, P. et al., "Coherent Automatic Gain Control," *IEE Colloquium on Phase Locked Techniques*, IEE, pp. 2/1–2/6 (Mar. 26, 1980).

Lo, P. et al., "Computation of Rain Induced Scintillations on Satellite Down–Links at Microwave Frequencies," *Third International Conference on Antennas and Propagation (ICAP 83)*, pp. 127–131 (Apr. 12–15, 1983).

Lo, P.S.L.O. et al., "Observations of Amplitude Scintillations on a Low–Elevation Earth–Space Path," *Electronics Letters*, IEE, vol. 20, No. 7, pp. 307–308 (Mar. 29, 1984).

Madani, K. and Aithison, C.S., "A 20 Ghz Microwave Sampler," *IEEE Transactions on Microwave Theory and Techniques*, IEEE Microwave and Theory Techniques Society, vol. 40, No. 10, pp. 1960–1963 (Oct. 1992).

Marsland, R.A. et al., "130 Ghz GaAs monolithic integrated circuit sampling head," *Appl. Phys. Lett.*, American Institute of Physics, vol. 55, No. 6, pp. 592–594 (Aug. 7, 1989).

Martin, K. and Sedra, A.S., "Switched–Capacitor Building Blocks for Adaptive Systems," *IEEE Transactions on Circuits and Systems*, IEEE Circuits and Systems Society, vol. CAS–28, No. 6, pp. 576–584 (Jun. 1981).

Marzano, F.S. and d'Auria, G., "Model–based Prediction of Amplitude Scintillation variance due to Clear–Air Tropospheric Turbulence on Earth–Satellite Microwave Links," *IEEE Transactions on Antennas and Propagation*, IEEE Antennas and Propagation Society, vol. 46, No. 10, pp. 1506–1518 (Oct. 1998).

Matricciani, E., "Prediction of faded durations due to rain in satellite communication systems," *Radio Science*, American Geophysical Union, vol. 32, No. 3, pp. 935–941 (May–Jun. 1997).

McQueen, J.G. "The Monitoring of High–Speed Waveforms," *Electronic Engineering*, Morgan Brothers Limited, vol. XXIV, No. 296, pp. 436–441 (Oct. 1952).

Merkelo, J. and Hall, R.D., "Broad–Band Thin–Film Signal Sampler," *IEEE Journal of Solid–State Circuits*, IEEE, vol. SC–7, No. 1, pp. 50–54 (Feb. 1972).

Merlo, U. et al., "Amplitude Scintillation Cycles in a Sirio Satellite–Earth Link," *Electronics Letters*, IEE, vol. 21, No. 23, pp. 1094–1096 (Nov. 7, 1985).

Morris, D., "Radio–holographic reflector measurement of the 30–m millimeter radio telescope at 22 Ghz with a cosmic signal source," *Astronomy and Astrophysics*, Springer–Verlag, vol. 203, No. 2, pp. 399–406 (Sep. (II) 1988).

Moulsley, T.J. et al., "The efficient acquisition and processing of propagation statistics," *Journal of the Institution of Electronic and Radio Engineers*, IERE, vol. 55, No. 3, pp. 97–103 (Mar. 1985).

Ndzi, D. et al., "Wide–Band Statistical Characterization of an Over–the–Sea Experimental Transhorizon Link," *IEE Colloquium on Radio Communications at Microwave and Millimetre Wave Frequencies*, IEE, pp. 1/1–1/6 (Dec. 16, 1996).

Ndzi, D. et al., "Wideband Statistics of Signal Levels and Doppler Spread on an Over–The–Sea Transhorizon Link," *IEE Colloquium on Propagation Characteristics and Related System Techniques for Beyond Line–of–Sight Radio*, IEE, pp. 9/1–9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130–135 (Apr. 12, 1979).

Oppenheim, A.V. et al., *Signals and Systems*, Prentice–Hall, pp. 527–531 and 561–562 (1983).

Ortgies, G., "Experimental Parameters Affecting Amplitude Scintillation Measurements on Satellite Links," *Electronics Letters*, IEE, vol. 21, No. 17, pp. 771–772 (Aug. 15, 1985).

Pärssinen et al., "A 2–Ghz Subharmonic Sampler for Signal Downconversion," *IEEE Transactions on Microwave Theory and Techniques*, IEEE, vol. 45, No. 12, 7 pages (Dec. 1997).

Peeters, G. et al., "Evaluation of Statistical Models for Clear–Air Scintillation Prediction Using Olympus Satellite Measurements," *International Journal of Satellite Communications*, John Wiley and Sons, vol. 15, No. 2, pp. 73–88 (Mar.–Apr. 1997).

Perrey, A.G. and Schoenwetter, H.K., *NBS Technical Note 1121: A Schottky Diode Bridge Sampling Gate*, U.S. Dept. of Commerce, pp. 1–14 (May 1980).

Poulton, K. et al., "A 1–Ghz 6–bit ADC System," *IEEE Journal of Solid–State Circuits*, IEEE, vol. SC–22, No. 6, pp. 962–969 (Dec. 1987).

Press Release, "Parkervision, Inc. Announces Fiscal 1993 Results," Lippert/Heilshorn and Associates, 2 Pages (Apr. 6, 1994).

Press Release, "Parkervision, Inc. Annouces the Appointment of Michael Baker to the New Position of National Sales Manager," Lippert/Heilshorn and Associates, 1 Page (Apr. 7, 1994).

Press Release, "Parkervison's Cameraman Well–Received By Distance Learning Market," Lippert/Heilshorn and Associates, 2 Pages (Apr. 8, 1994).

Press Release, "Parkervision, Inc. Announces First Quarter Financial Results," Lippert/Heilshorn and Associates, 2 Pages (Apr. 26, 1994).

Press Release, "Parkervision, Inc. Announces The Retirement of William H. Fletcher, Chief Financial Officer," Lippert/Heilshorn and Associates, 1 Page (May 11, 1994).

Press Release, "Parkervision, Inc. Announces New Cameraman System II™ At Infocomm Trade Show," Lippert/Heilshorn and Associates, 3 Pages (Jun. 9, 1994).

Press Release, "Parkervision, Inc. Anounces Appointments to its National Sales Force," Lippert/Heilshorn and Associates, 2 Pages (Jun. 17, 1994).

Press Release, "Parkervision, Inc. Announces Second Quarter and Six Months Financial Results," Lippert/Heilshorn and Associates, 3 Pages (Aug. 9, 1994).

Press Release, "Parkervision, Inc. Announces Third Quarter and Nine Months Financial Results," Lippert/Heilshorn and Associates, 3 Pages (Oct. 28, 1994).

Press Release, "Parkervision, Inc. Announces First Significant Dealer Sale of Its *Cameraman®* System II," Lippert/Heilshorn and Associates, 2 Pages (Nov. 7, 1994).

Press Release, "Parkervision, Inc. Announces Fourth Quarter and Year End Results," Lippert/Heilshorn and Associates, 2 Pages (Mar. 1, 1995).

Press Release, "Parkervision, Inc. Announces Joint Product Developments With VTEL," Lippert/Heilshorn and Associates, 2 Pages (Mar. 21, 1995).

Press Release, "Parkervision, Inc. Announces First Quarter Financial Results," Lippert/Heilshorn and Associates, 3 Pages (Aug. 28, 1995).

Press Release, "Parkervision Wins Top 100 Product Districts' Choice Award," Parkervison Marketing and Manufacturing Headquarters, 1 Page (Jun. 29, 1995).

Press Release, "Parkervision National Sales Manager Next President of USDLA," Parkervison Marketing and Manufacturing Headquarters, 1 Page (Jul. 6, 1995).

Press Release, "Parkervision Granted New Patent," Parkervision Marketing and Manufacturing Headquarters, 1 Page (Jul. 21, 1995).

Press Release, "Parkervision, Inc. Announces Second Quarter and Six Months Financial Results," Parkervision Marketing and Manufacturing Headquarters, 2 Pages (Jul. 31, 1995).

Press Release, "Parkervision, Inc. Expands Its Cameraman System II Product Line," Parkervision Marketing and Manufacturing Headquarters, 2 Pages (Sep. 22, 1995).

Press Release, "Parkervision Announces New Camera Control Technology," Parkervision Marketing and Manufacturing Headquarters, 2 Pages (Oct. 25, 1995).

Press Release, "Parkervision, Inc. Announces Completion of VTEL/Parkervision Joint Product Line," Parkervision Marketing and Manufacturing Headquarters, 2 Pages (Oct. 30, 1995).

Press Release, "Parkervision, Inc. Anounces Third Quarter and Nine Months Financial Results," Parkervision Marketing and Manufacturing Headquarters, 2 Pages (Oct. 30, 1995).

Press Release, "Parkervision's Cameraman Personal Locator Camera System Wins Telecom XV Award," Parkervision Marketing and Manufacturing Headquarters, 2 Pages (Nov. 1, 1995).

Press Release, "Parkervision, Inc. Announces Purchase Committment From VTEL Corporation," Parkervision Marketing and Manufacturing Headquarters, 1 Page (Feb. 26, 1996).

Press Release, "ParkerVision, Inc. Announces Fourth Quarter and Year End Results," Parkervision Marketing and Manufacturing Headquarters, 2 Pages (Feb. 27, 1996).

Press Release, "ParkerVision, Inc. Expands its Product Line," Parkervision Marketing and Manufacturing Headquarters, 2 Pages (Mar. 7, 1996).

Press Release, "ParkerVision Files Patents for its Research of Wireless Technology," Parkervision Marketing and Manufacturing Headquarters, 1 Page (Mar. 28, 1996).

Press Release, "Parkervision, Inc. Announces First Significant Sale of Its Cameraman® Three–Chip System," Parkervision Marketing and Manufacturing Headquarters, 2 pages (Apr. 12, 1996).

Press Release, "Parkervision, Inc. Introduces New Product Line For Studio Production Market," Parkervision Marketing and Manufacturing Headquarters, 2 Pages (Apr. 15, 1996).

Press Release, "Parkervison, Inc. Announces Private Placement of 800,000 Shares," Parkervision Marketing and Manufacturing Headquarters, 1 Page (Apr. 15, 1996).

Press Release, "Parkervision, Inc. Announces First Quarter Financial Results," Parkervision Marketing and Manufactering Headquarters, 3 Pages (Apr. 30, 1996).

Press Release, "ParkerVision's New Studio Product Wins Award," Parkervision Marketing and Manufacturing Headquarters, 2 Pages (Jun. 5, 1996).

Press Release, "Parkervision, Inc. Announces Second Quarter and Six Months Financial Results," Parkervision Marketing and Manufacturing Headquarters, 3 Pages (Aug. 1, 1996).

Press Release, "Parkervision, Inc. Announces Third Quarter and Nine Months Financial Results," Parkervision Marketing and Manufacturing Headquarters, 2 Pages (Oct. 29, 1996).

Press Release, "PictureTel and ParkerVision Sign Reseller Agreement," Parkervision Marketing and Manufacturing Headquarters, 2 Pages (Oct. 30, 1996).

Press Release, "CLI and ParkerVision Bring Enhanced Ease–of–Use to Videoconferencing," CLI/Parkervisioin, 2 Pages (Jan. 20, 1997).

Press Release, "Parkervision, Inc. Announces Fourth Quarter and Year End Results," Parkervision Marketing and Manufacturing Headquarters, 3 Pages (Feb. 27, 1997).

Press Release, "Parkervision, Inc. Announces First Quarter Financial Results," Parkervision Marketing and Manufacturing Headquarters, 3 Pages (Apr. 29, 1997).

Press Release, "NEC and Parkervision Make Distance Learning Closer," NEC America, 2 Pages (Jun. 18, 1997).

Press Release, "Parkervision Supplies JPL with Robotic Cameras, Cameraman Shot Director for Mars Mission," Parkervision Marketing and Manufacturing Headquarters, 2 pages (Jul. 8, 1997).

Press Release, "ParkerVision and IBM Join Forces to Create Wireless Computer Peripherals," Parkervision Marketing and Manufacturing Headquarters, 2 Pages (Jul. 23, 1997).

Press Release, "ParkerVision, Inc. Announces Second Quarter and Six Months Financial Results," Parkervision Marketing and Manufacturing Headquarters, 3 Pages (Jul. 31, 1997).

Press Release, "Parkervision, Inc. Announces Private Placement of 990,000 Shares," Parkervision Marketing and Manufacturing Headquarters, 2 Pages (Sep. 8, 1997).

Press Release, "Wal–Mart Chooses Parkervision for Broadcast Production," Parkervision Marketing and Manufacturing Headquarters, 2 Pages (Oct. 24, 1997).

Press Release, "Parkervision, Inc. Announces Third Quarter Financial Results," Parkervision Marketing and Manufacturing Headquarters, 3 Pages (Oct. 30, 1997).

Press Release, "ParkerVision Anounces Breakthrough in Wireless Radio Frequency Technology," Parkervision Marketing and Manufacturing Headquarters, 3 Pages (Dec. 10, 1997).

Press Release, "Parkervision, Inc. Announces the Appointment of Joseph F. Skovron to the Position of Vice President, Licensing—Wireless Technologies," Parkervision Marketing and Manufacturing Headquarters, 2 Pages (Jan. 9, 1998).

Press Release, "Parkervision Announces Existing Agreement with IBM Terminates—Company Continues with Strategic Focus Announced in Dec.," Parkervision Marketing and Manufacturing Headquarters, 2 Pages (Jan. 27, 1998).

Press Release, "Laboratory Tests Verify Parkervision Wireless Technology," Parkervision Marketing and Manufacturing Headquarters, 2 Pages (Mar. 3, 1998).

Press Release, "Parkervision, Inc. Announces Fourth Quarter and Year End Financial Results," Parkervision Marketing and Manufacturing Headquarters, 3 Pages (Mar. 5, 1998).

Press Release, "Parkervision Awarded Editors' Pick of Show for NAB 98," Parkervision Marketing and Manufacturing Headquarters, 2 Pages (Apr. 15, 1998).

Press Release, "Parkervision Announces First Quarter Financial Results," Parkervision Marketing and Manufacturing Headquarters, 3 Pages (May 4, 1998).

Press Release, "Parkervision 'DIRECT2DATA' Introduced in Response to Market Demand," Parkervision Marketing and Manufacturing Headquarters, 3 Pages (Jul. 9, 1998).

Press Release, "Parkervision Expands Senior Manufacturing Team," Parkervision Marketing and Manufacturing Headquarters, 2 Pages (Jul. 29, 1998).

Press Release, "Parkervision Announces Second Quarter and Six Month Financial Results," Parkervision Marketing and Manufacturing Headquarters, 4 Pages (Jul. 30, 1998).

Press Release, "Parkervision Announces Third Quarter and Nine Month Financial Results," Parkervision Marketing and Manufacturing Headquarters, 3 Pages (Oct. 30, 1998).

Press Release, "Questar Infocomm, Inc. Invests $5 Million in Parkervision Common Stock," Parkervision Marketing and Manufacturing Headquarters, 3 Pages (Dec. 2, 1998).

Press Release, "Parkervision Adds Two New Directors," Parkervision Marketing and Manufacturing Headquarters, 2 Pages (Mar. 5, 1999).

Press Release, "Parkervision Announces Fourth Quarter and Year End Financial Results," Parkervision Marketing and Manufacturing Headquarters, 3 Pages (Mar. 5, 1999).

Press Release, "Joint Marketing Agreement Offers New Automated Production Solution," Parkervision Marketing and Manufacturing Headquarters, 2 Pages (Apr. 13, 1999).

"Project COST 205: Scintillations in Earth–satellite links," Alta Frequenza: Scientific Review in Electronics, AEI, vol. LIV, No. 3, pp. 209–211 (May–Jun., 1985).

Razavi, B., RF Microelectronics, Prentice–Hall, pp. 147–149 (1998).

Reeves, R.J.D., "The Recording and Collocation of Waveforms (Part 1)," Electronic Engineering, Morgan Brothers Limited, vol. 31, No. 373, pp. 130–137 (Mar. 1959).

Reeves, R.J.D., "The Recording and Collocation of Waveforms (Part 2)," Electronic Engineering, Morgan Brothers Limited, vol. 31, No. 374, pp. 204–212 (Apr. 1959).

Rein, H.M. and Zahn, M., "Subnanosecond–Pulse Generator with Variable Pulsewidth Using Avalanche Transistors," Electronics Letters, IEE, vol. 11, No. 1, pp. 21–23 (Jan. 9, 1975).

Riad, S.M. and Nahman, N.S., "Modeling of the Feed–through Wideband (DC to 12.4 Ghz) Sampling–Head," IEEE MTT–S International Microwave Symposium Digest, IEEE, pp. 267–269 (Jun. 27–29, 1978).

Rizzoli, V. et al., "Computer–Aided Noise Analysis of MESFET and HEMT Mixers," IEEE Transactions on Microwave Theory and Techniques, IEEE, vol. 37, No. 9, pp. 1401–1410 (Sep. 1989).

Rowe, H.E., *Signals and Noise in Communication Systems*, D. Van Nostrand Company, Inc., Princeton, New Jersey, including, for example, Chapter V, Pulse Modulation Systems (1965).

Rücker, F. and Dintelmann, F., "Effect of Antenna Size on OTS Signal Scintillations and Their Seasonal Dependence," *Electronics Letters*, IEE, vol. 19, No. 24, pp. 1032–1034 (Nov. 24, 1983).

Russell, R. and Hoare, L., "Millimeter Wave Phase Locked Oscillators," *Military Microwaves '78 Conference Proceedings*, Microwave Exhibitions and Publishers, pp. 238–242 (Oct. 25–27, 1978).

Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218–223 (Oct. 16–18, 1990).

Salous, S., "IF digital generation of FMCW waveforms for wideband channel characterization," *IEE Proceedings–I*, IEE, vol. 139, No. 3, pp. 281–288 (Jun. 1992).

"Sampling Loops Lock Sources to 23 Ghz," *Microwaves & RF*, Penton Publishing, p. 212 (Sep. 1990).

Sasikumar, M. et al., "Active Compensation in the Switched–Capacitor Biquad," *Proceedings of the IEEE*, IEEE, vol. 71, No. 8, pp. 1008–1009 (Aug. 1983).

Saul, P.H., "A GaAs MESFET Sample and Hold Switch," *Fifth European Solid State Circuits Conference–ESSCIRC 79*, IEE, pp. 5–7 (1979).

Shen, D.H. et al., "A 900–MHZ RF Front–End with Integrated Discrete–Time Filtering," *IEEE Journal of Solid–State Circuits*, IEEE Solid–State Circuits Council, vol. 31, No. 12, pp. 1945–1954 (Dec. 1996).

Shen, X.D. and Vilar, E., "Anomalous transhorizon propagation and meteorological processes of a multilink path," *Radio, Science*, American Geophysical Union, vol. 30, No. 5, pp. 1467–1479 (Sep.–Oct. 1995).

Shen, X. and Tawfik, A.N., "Dynamic Behaviour of Radio Channels Due to Trans–Horizon Propagation Mechanisms," *Electronics Letters*, IEE, vol. 29, No. 17, pp. 1582–1583 (Aug. 19, 1993).

Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1–4/7 (Mar. 8, 1996).

Shen, X. and Vilar, E., "Path loss statistics and mechanisms of transhorizon propagation over a sea path," *Electronics Letters*, IEE, vol. 32, No. 3, pp. 259–261 (Feb. 1, 1996).

Shen, D. et al., "A 900 MHZ Integrated Discrete–Time Filtering RF Front–End," *IEEE International Solid State Circuits Conference*, IEEE, vol. 39, pp. 54–55 and 417 (Feb. 1996).

Spillard, C. et al., "X–Band Tropospheric Transhorizon Propagation Under Differing Meteorolgical Conditions," *Sixth International Conference on Antennas and Propagation (ICAP 89) Part 2: Propagation*, IEE, pp. 451–455 (Apr. 4–7, 1989).

Stafford, K.R. et al, "A Complete Monolithic Sample/Hold Amplifier," *IEEE Journal of Solid–State Circuits*, IEEE, vol. SC–9, No. 6, pp. 381–387 (Dec. 1974).

Staruk, W. Jr. et al., "Pushing HF Data Rates," *Defense Electronics*, EW Communications, vol. 17, No. 5, pp. 211, 213, 215, 217, 220 and 222 (May 1985).

Stephenson, A.G., "Digitizing multiple RF Signal requires an optimum sampling rate," *Electronics*, McGraw–Hill, pp. 106–110 (Mar. 27, 1972).

Sugarman, R., "Sampling Oscilloscope for Statistically Varying Pulses," *The Review of Scientific Instruments*, American Institute of Physics, vol. 28, No. 11, pp. 933–938 (Nov. 1957).

Sylvain, M., "Experimental probing of multipath microwave channels," *Radio Science*, American Geophysical Union, vol. 24, No. 2, pp. 160–178 (Mar.–Apr. 1989).

Takano, T., "Novel GaAs Pet Phase Detector Operable To Ka Band," *IEEE MT–S Digest*, IEEE, pp. 381–383 (1984).

Tan, M.A., "Biquadratic Transconductance Switched–Capacitor Filters," *IEEE Transactions on Circuits and Systems– I: Fundamental Theory and Applications*, IEEE Circuits and Systems Society, vol. 40, No. 4, pp. 272–275 (Apr. 1993).

Tanaka, K. et al., "Single Chip Multisystem AM Stereo Decoder IC," *IEEE Transactions on Consumer Electronics*, IEEE Consumer Electronics Society, vol. CE–32, No. 3, pp. 482–496 (Aug. 1986).

Tawfik, A.N., "Amplitude, Duration and Predictability of Long Hop Trans–Horizon X–Band Signals Over the Sea," *Electronics Letters*, IEE, vol. 28, No. 6, pp. 571–572 (Mar. 12, 1992).

Tawfik, A.N. and Vilar, E., "Correlation of Transhorizon Signal Level Strength with Localized Surface Meteorological Parameters," *Eight International Conference on Antennas and Propagation*, Electronics Division of the IEE, pp. 335–339 (Mar. 30–Apr. 2, 1993).

Tawfik, A.N. and Vilar, E., "Dynamic Structure of a Transhorizon Signal at X–band Over a Sea Path," *Sixth International Conference on Antennas and Propagation (ICAP 89) Part 2: Propagation*, IEE, pp. 446–450 (Apr. 4–7, 1989).

Tawfik, A.N. and Vilar, E., "Statistics of Duration and Intensity of Path Loss in a Microwave Transhorizon Sea–Path," *Electronics Letters*, IEE, vol. 26, No. 7, pp. 474–476 (Mar. 29, 1990).

Tawfik, A.N. and Vilar, E., "X–Band Transhorizon Measurements of CW Transmissions Over the Sea– Part 1: Path Loss, Duration of Events, and Their Modeling," *IEEE Transactions on Antennas and Propagation*, IEEE Antennas and Propagation Society, vol. 41, No. 11, pp. 1491–1500 (Nov. 1993).

Temes, G.C. and Tsividis, T., "The Special Section on Switched–Capacitor Circuits," *Proceedings of the IEEE*, IEEE, vol. 71, No. 8, pp. 915–916 (Aug. 1983).

Thomas, G.B., *Calculas and Analytic Geometry*, Third Edition, Addison–Wesley Publishing, pp. 119–133 (1960).

Tomassetti, Q., "An Unusual Microwave Mixer," *16th European Microwave Conference*, Microwave Exhibitions and Publishers, pp. 754–759 (Sep. 8–12, 1986).

Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectronics, and Frequency Control Society, vol. 41, No. 1, pp. 1–3 (Jan. 1984).

Tsividis, Y. and Antognetti, P. (Ed.), *Design of MOS VLSI Circuits for Telecommunications*, Prentice–Hall, p. 304 (1985).

Tsividis, Y., "Principles of Operation and Analysis of Switched–Capacitor Circuits," *Proceedings of the IEEE*, IEEE, vol. 71, No. 8, pp. 926–940 (Aug. 1983).

Tsurumi, H. and Maeda, T., "Design Study on a Direct Conversion Receiver Front–End for 280 MHZ, 900 MHZ, and 2.6 Ghz Band Radio Communication Systems," *41st IEEE Vehicular Technology Conference*, IEEE Vehicular Technology Society, pp. 457–462 (May 19–22, 1991).

Valdmanis, J.A. et al., "Picosecond and Subpicosend Optoelectronics for Measurements of Future High Speed Electronic Devices," *IEDM Technical Digest*, IEEE, pp. 597–600 (Dec. 5–7, 1983).

van de Kamp, M.M.J.L., "Asymmetric signal level distribution due to tropospheric scintillation," *Electronics Letters*, IEE, vol. 34, No. 11, pp. 1145–1146 (May 28, 1998).

Vasseur, H. and Vanhoenacker, D., "Characterization of tropospheric turbulent layers from radiosonde data," *Electronics Letters*, IEE, vol. 34, No. 4, pp. 318–319 (Feb. 19, 1998).

Verdone, R., "Outage Probability Analysis for Short–Range Communication Systems at 60 Ghz in ATT Urban Environments," *IEEE Transactions on Vehicular Technology*, IEEE Vehicular Technology Society, vol. 46, No. 4, pp. 1027–1039 (Nov. 1997).

Vierira–Ribeiro, S.A., *Single–IF DECT Receiver Architecture using a Quadrature Sub–Sampling Band–Pass Sigma–Delta Modulator*, Thesis for Degree of Master's of Engineering, Carleton University, UMI Dissertation Services, pp. 1–180 (Apr. 1995).

Vilar, E. et al., "A Comprehensive/Selective MM–Wave Satellite Downlink Experiment on Fade Dynamics," *Tenth International Conference on Antennas and Propagation*, Electronics Division of the IEE, pp. 2.98–2.101 (Apr. 14–17, 1997).

Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8–1—8–16 (Oct. 4–7, 1983).

Vilar, E. and Smith, H., "A Theoretical and Experimental Study of Angular Scintillations in Earth Space Paths," *IEEE Transactions on Antennas and Propagation*, IEEE, vol. AP–34, No. 1, pp. 2–10 (Jan. 1986).

Vilar, E. et al., "A Wide Band Transhorizon Experiment at 11.6 Ghz," *Eighth International Conference on Antennas and Propagation*, Electronics Division of the IEE, pp. 441–445 (Mar. 30–Apr. 2, 1993).

Vilar, E. and Matthews, P.A., "Amplitude Dependence of Frequency in Oscillators," *Electronics Letters*, IEE, vol. 8, No. 20, pp. 509–511 (Oct. 5, 1972).

Vilar, E. et al., "An experimental mm–wave receiver system for measuring phase noise due to atmospheric turbulence," *Proceedings of the 25th European Microwave Conference*, Nexus House, pp. 114–119 (1995).

Vilar, E. and Burgueño, A., "Analysis and Modeling of Time Intervals Between Rain Rate Exceedances in the Context of Fade Dynamics," *IEEE Transactions on Communications*, IEEE Communications Society, vol. 39, No. 9, pp. 1306–1312 (Sep. 1991).

Vilar, E. et al., "Angle of Arrival Fluctuations in High and Low Elevation Earth Space Paths," *Fourth International Conference on Antennas and Propagation (ICAP 85)*, Electronics Division of the IEE, pp. 83–88 (Apr. 16–19, 1985).

Vilar, E., "Antennas and Propagation: A Telecommunications Systems Subject," *Electronics Division Colloquium on Teaching Antennas and Propagation to Undergraduates*, IEE, pp. 7/1–7/6 (Mar. 8, 1988).

Vilar, E. et al., "CERS*. Millimetre–Wave Beacon Package and Related Payload Doppler Correction Strategies," *Electronics Division Colloquium on CERS– Commumicatons Engineering Reseach Satellite*, IEE, pp. 10/1–10/10 (Apr. 10, 1984).

Vilar, E. and Moulsley, T.J., "Comment and Reply: Probability Density Function of Amplitude Scintillations," *Electronics Letters*, IEE, vol. 21, No. 14, pp. 620–622 (Jul. 4, 1985).

Vilar, E. et al., "Comparison of Rainfall Rate Duration Distributions for ILE–IFE and Barcelona," *Electronics Letters*, IEE, vol. 28, No. 20, pp. 1922–1924 (Sep. 24, 1992).

Vilar, E., "Depolarization and Field Transmittances in Indoor Communications," *Electronics Letters*, IEE, vol. 27, No. 9, pp. 732–733 (Apr. 25, 1991).

Vilar, E. and Larsen, J.R., "Elevation Dependence of Amplitude Scintillations on Low Elevation Earth Space Paths," *Sixth International Conference on Antennas and Propagation (ICAP 89) Part 2: Propagation*, IEE, pp. 150–154 (Apr. 4–7, 1989).

Vilar, E. et al., "Experimental System and Measurements of Transhorizon Signal Levels at 11 Ghz," *18th European Microwave Conference*, Microwave Exhibitions and Publishers Ltd., pp. 429–435 (Sep. 12–15, 1988).

Vilar, E. and Matthews, P.A., "Importance of Amplitude Scintillations in Millimetric Radio Links," *Proceedings of the 4th European Microwave Conference*, Microwave Exhibitions and Publishers, pp. 202–206 (Sep. 10–13, 1974).

Vilar, E. and Haddon, J., "Measurement and Modeling of Scintillation Intensity to Estimate Turbulence Parameters in an Earth–Space Path," *IEEE Transactions on Antennas and Propagation*, IEEE Antennas and Propagation Society, vol. AP–32, No. 4, pp. 340–346 (Apr. 1984).

Vilar, E. and Matthews, P.A., "Measurement of Phase Fluctuations on Millimetric Radiowave Propagation," *Electronics Letters*, IEE, vol. 7, No. 18, pp. 566–568 (Sep. 9, 1971).

Vilar, E. and Wan, K.W., "Narrow and Wide Band Estimates of Field Strength for Indoor Communications in the Millimetre Band," *Electronics Division Colloquium on Radiocommunications in the Range 30–60 Ghz*, IEE, pp. 5/1–5/8 (Jan. 17, 1991).

Vilar, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).

Vilar, E. and Senin, S., "Propagation phase noise identified using 40 Ghz satellite downlink," *Electronic Letters*, IEE, vol. 33, No. 22, pp. 1901–1902 (Oct. 23, 1997).

Vilar, E. et al., "Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230–2.233 (Apr. 14–17, 1997).

Vilar, E. and Haddon, J., "Scintillation Modeling and Measurement—A Tool for Remote–Sensing Slant Paths," *AGARD Confenece Proceedings No. 332: Propagation Aspects of Frequency Sharing, Interference And System Diversity*, AGARD, pp. 27–1—27–13 (Oct. 18–22, 1982).

Vilar, E., "Some Limitations on Digital Transmission Through Turbulent Atmosphere," *International Conference on Satellite Commumication Systems Technology*, Electronics Division of the IEE, pp. 169–187 (Apr. 7–10, 1975).

Vilar, E. and Matthews, P.A., "Summary of Scintillation Observations in a 36 Ghz Link Across London," *International Conference on Antennas and Propagation Part 2: Propagation*, IEE, pp. 36–40 (Nov. 28–30, 1978).

Vilar, E. et al., "Wideband Characterization of Scattering Channels," *Tenth International Conference on Antennas and Propagation*, Electronics Division of the IEE, pp. 2.353–2.358 (Apr. 14–17, 1997).

Vollmer, A., "Complete GPS Receiver Fits on Two Chips," *Electronic Design*, Penton Publishing, pp. 50, 52, 54 and 56 (Jul. 6, 1998).

*Voltage and Time Resolution in Digitizing Oscilloscopes: Application Note 348*, Hewlett Packard, pp. 1–11 (Nov. 1986).

Wan, K.W. et al., "A Novel Approach to the Simultaneous Measurement of Phase and Amplitude Noises in Oscillator," *Proceedings of the 19$^{th}$ European Microwave Conference*, Microwave Exhibitions and Publishers Ltd., pp. 809–813 (Sep. 4–7, 1989).

Wan, K.W. et al., "Extended Variances and Autoregressive/Moving Average Algorithm for the Measurement and Synthesis of Oscillator Phase Noise," *Proceedings Of the 43$^{rd}$ Annual Symposium on Frequency Control*, IEEE, pp. 331–335 (1989).

Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1–3/5 (Dec. 3, 1993).

Wang, H., "A 1–V Multigigahertz RF Mixer Core in 0.5–βm CMOS," *IEEE Journal of Solid–State Circuits*, IEEE Solid–State Circuits Society, vol. 33, No. 12, pp. 2265–2267 (Dec. 1998).

Watson, A.W.D. et al., "Digital Conversion and Signal Processing for High Performance Communications Receivers," *Digital Processing of Signals in Communications*, Institution of Electronic and Radio Engineers, pp. 367–373 (Apr. 22–26, 1985).

Weast, R.C. et al. (Ed.), *Handbook of Mathematical Tables*, Second Edition, The Chemical Rubber Co., pp. 480–485 (1964).

Wiley, R.G., "Approximate FM Demodulation Using Zero Crossings," *IEEE Transactions on Communications*, IEEE, vol. COM–29, No. 7, pp. 1061–1065 (Jul. 1981).

Wothman, W., "Convergence . . . Again," *RF Design*, Primedia, p. 102 (Mar. 1999).

Young, I.A. and Hodges, D.A., "MOS Switched–Capacitor Analog Sampled–Data Direct–Form Recursive Filters," *IEEE Journal of Solid–State Circuits*, IEEE, vol. SC–14, No. 6, pp. 1020–1033 (Dec. 1979).

Translation of Specification and Claims of FR Patent No. 2245130, 3 pages.

Fest, Jean–Pierre, "Le Convertisseur A/N Revolutionne Le Recepteur Radio," *Electronique*, JMJ (Publisher), No. 54, pp. 40–42 (Dec. 1995).

Translation of DE Patent No. 35 41 031 A1, 22 pages.

Translation of EP Patent No. 0 732 803 A1, 9 pages.

Fest, Jean–Pierre, "The A/D Converter Revolutionizes the Radio Receiver," *Electronique*, JMJ (Publisher), No. 54, 3 pages (Dec. 1995). (Translation of Doc. AQ50).

Translation of German Patent No. DE 197 35 798 C1, 8 pages.

Miki, S. and Nagahama, R., *Modulation System II*, Common Edition 7, Kyoritsu Publishing Co., Ltd., pp. 146–154 (Apr. 30, 1956).

Miki, S. and Nagahama, R., *Modulation System II*, Common Edition 7, Kyoritsu Publishing Co., Ltd., pp. 146–149 (Apr. 30, 1956). (Partial Translation of Doc. AQ51).

Rabiner, L.R. and Gold, B., *Theory And Application Of Digital Signal Processing*, Prentice–Hall, Inc., pp. xiii–xii and 40–46 (1975).

English–language Abstract of Japanese Patent Publication No. 08–032566, from http://www1.ipdl.jpo.go.jp, 2 Pages (Feb. 2, 1996—Date of publication of application).

English–language Abstract of Japanese Patent Publication No. 08–139524, http://www1.ipdl.jpo.go.jp, 2 Pages (May 31, 1996—Date of publication of application).

English–language Abstract of JapanesePatent Publication No. 59–144249, from http://www1.ipdl.jpo.go.jp, 2 Pages (Aug. 18, 1984—Date of publication of application).

English–language Abstract of Japanese Patent Publication No. 63–054002, from http://www1.ipdl.jpo.go.jp, 2 Pages (Mar. 8, 1988—Date of publication of application).

English–language Abstract of Japanese Patent Publication No. 06–237276, from http://www1.ipdl.jpo.go.jp, 2 Pages (Aug. 23, 1994—Date of publication of application).

English–language Abstract of Japanese Patent Publication No. 08–023359, from http://www1.ipdl.jpo.go.jp, 2 Pages (Jan. 23, 1996—Date of publication of application).

Partial Translation of Japanese Patent Publication No. 47–2314, 3 pages.

Partial Translation of Japanese Patent Publication No. 58–7903, 3 pages.

English–language Abstract of Japanese Patent Publication No. 58–133004, from http://www1.ipdl.jpo.go.jp, 2 Pages (Aug. 8, 1993—Date of publication of application).

English–language Abstract of Japanese Patent Publication No. 60–058705, from http://www1.ipdl.jpo.go.jp, 2 Pages (Apr. 4, 1985—Date of publication of application).

English–language Abstract of Japanese Patent Publication No. 04–123614, from http://www1.ipdl.jpo.go.jp, 2 Pages (Apr. 23, 1992—Date of publication of application).

English–language Abstract of Japanese Patent Publication No. 04–127601, from http://www1.ipdl.jpo.go.jp, 2 Pages (Apr. 28, 1992—Date of publication of application).

English–language Abstract of Japanese Patent Publication No. 05–175730, from http://www1.ipdl.jpo.go.jp, 2 Pages (Jul. 13, 1993—Date of publication of application).

English–language Abstract of Japanese Patent Publication No. 05–175734, from http://www1.ipdl.jpo.go.jp, 2 Pages (Jul. 13, 1993—Date of publication of application).

English–language Abstract of Japanese Patent Publication No. 07–154344, from http://www1.ipdl.jpo.go.jp, 2 Pages (Jun. 16, 1995—Date of publication of application).

English–language Abstract of Japanese Patent Publication No. 07–307620, from http://www1.ipdl.jpo.go.jp, 2 Pages (No. 21, 1995—Date of publication of application).

Oppenheim, A.V. and Schafer, R.W., *Digital Signal Processing*, Prentice–Hall, pp. vii–x, 6–35, 45–78, 87–121 and 136–165 (1975).

English–language Abstract of Japanese Patent Publication No. 55–066057, from http://www1.ipdl.jpo.go.jp, 1 Page (May 19, 1980—Date of publication of application).

English–language Abstract of Japanese Patent Publication No. 63–065587, from http://www1.ipdl.jpo.go.jp, 1 Page (Mar. 24, 1988—Date of publication of application).

English–language Abstract of Japanese Patent Publication No. 63–153691, from http://www1.ipdl.jpo.go.jp, 1 Page (Jun. 27, 1988—Date of publication of application).

Translation of Japanese Patent Publication No. 60–130203, 3 pages (Jul. 11, 1985– Date of publication of application).

Razavi, B., "A 900–MHz/1.8–Ghz CMOS Transmitter for Dual–Band Applications," *Symposium on VLSI Circuits Digest of Technical Papers*, IEEE, pp. 128–131 (1998).

Ritter, G.M., "SDA, A New Solution for Transceivers," *16th European Microwave Conference*, Microwave Exhibitions and Publishers, pp. 729–733 (Sep. 8, 1986).

DIALOG File 351 (Derwent WPI) English Language Patent Abstract for FR 2 669 787, 1 page (May 29, 1992– Date of publication of application).

Akos, D.M. et al., "Direct Bandpass Sampling of Multiple Distinct RF Signals," *IEEE Transactions on Communications*, IEEE, vol. 47, No. 7, pp. 983–988 (Jul. 1999).

Patel, M. et al., "Bandpass Sampling for Software Radio Recievers, and the Effect of Oversampling on Aperture Jitter," *VTC 2002*, IEEE, pp. 1901–1905 (2002).

English–language Abstract of Japanese Patent Publication No. 61–030821, 1 Page (Feb. 13, 1986– Date of publication of application).

English–language Abstract of Japanese Patent Publication No. 05–327356, 1 Page (Dec. 10, 1993—Date of publication of application).

Tayloe, D., "A Low–noise, High–performance Zero IF Quadrature Detector/Preamplifier," *RF Design*, Primedia Business Magazines & Media, Inc., pp. 58, 60, 62 and 69 (Mar. 2003).

Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117–120 (Apr. 1996).

Simoni, A. et al., "A Digital Camera for Machine Vision," *20th International Conference on Industrial Electronics, Control and Instrumentation*, IEEE, pp. 879–883 (Sep. 1994).

Stewart, R.W. and Pfann, E., "Oversampling and sigma–delta strategies for data conversion," *Electronics & Communication Engineering Journal*, IEEE, pp. 37–47 (Feb. 1998).

Rudell, J.C. et al., "A 1.9–Ghz Wide–Band IF Double Conversion CMOS Receiver for Cordless Telephone Applications," *IEEE Journal of Solid–State Circuits*, IEEE, vol. 32, No. 12, pp. 2071–2088 (Dec. 1997).

* cited by examiner

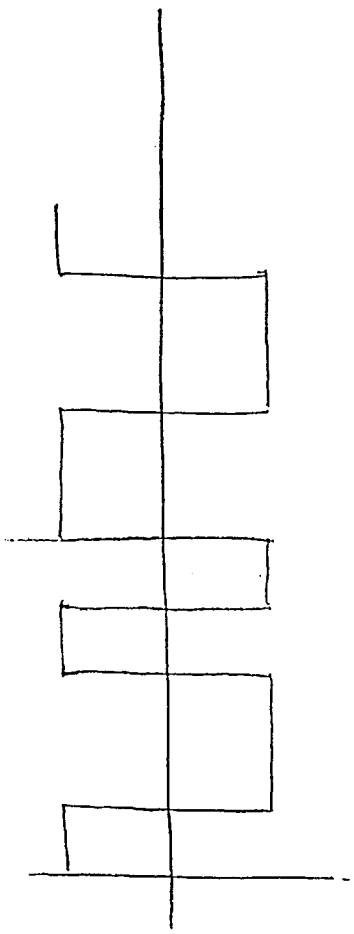
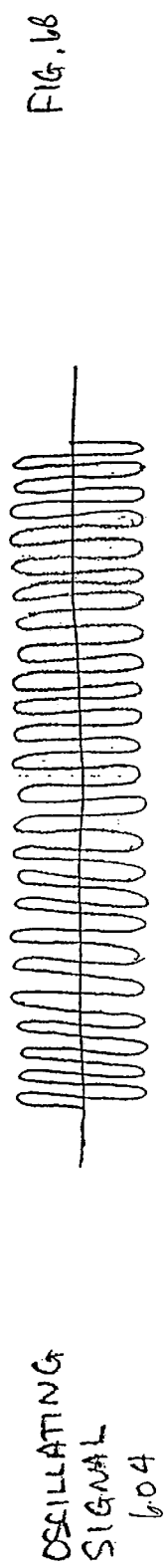
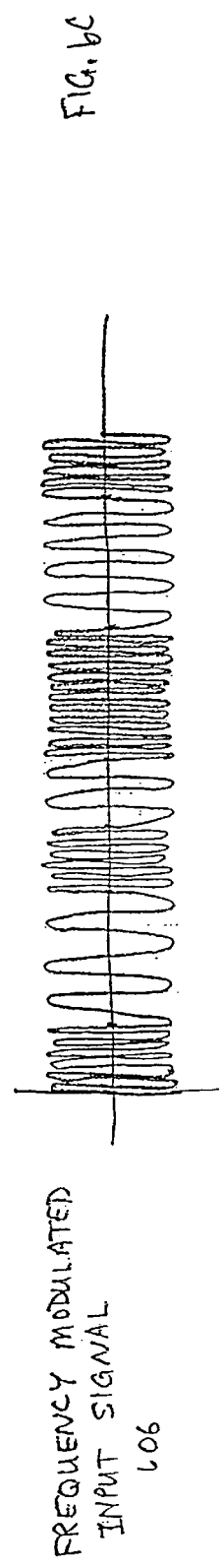
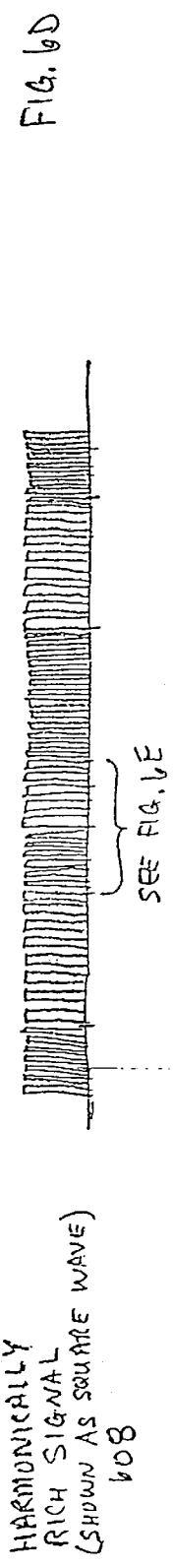
FIG. 6A
FIG. 6B
FIG. 6C
FIG. 6D
INFORMATION SIGNAL 602
OSCILLATING SIGNAL 604
FREQUENCY MODULATED INPUT SIGNAL 606
HARMONICALLY RICH SIGNAL (SHOWN AS SQUARE WAVE) 608
SEE FIG. 6E
FIG. 6

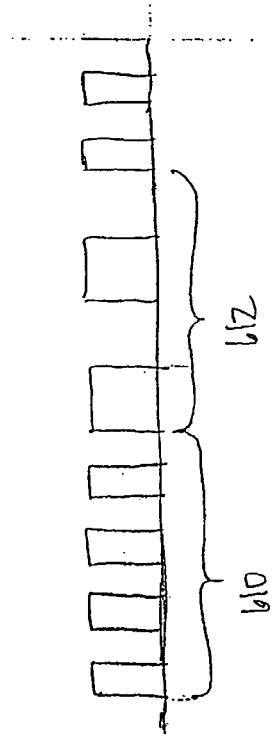
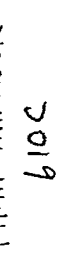
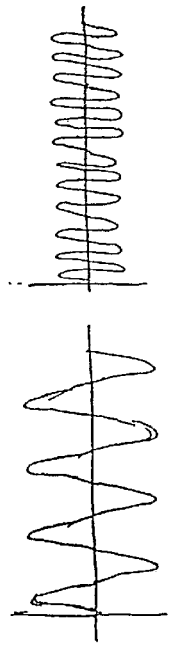
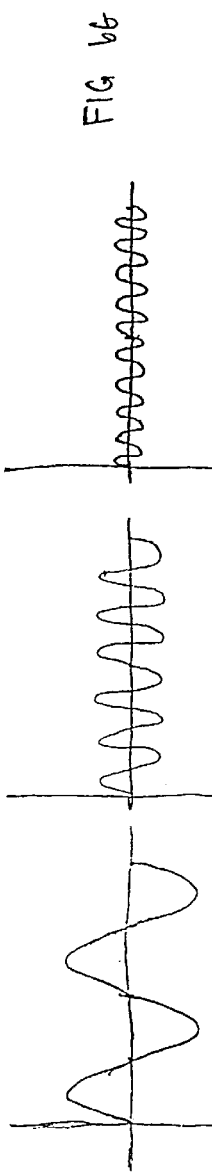
FIG. 6 (cont.)

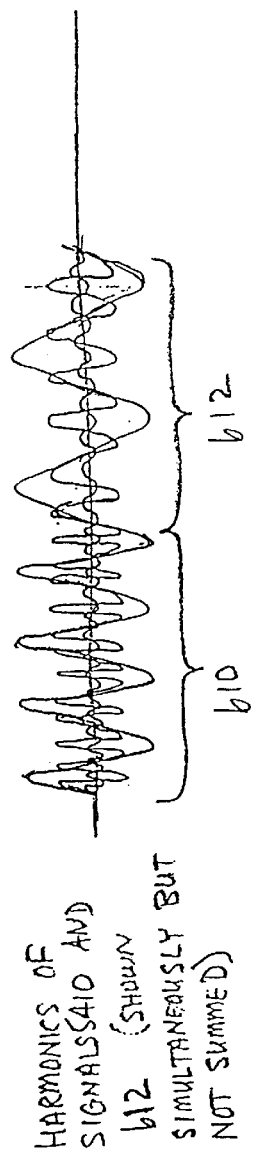
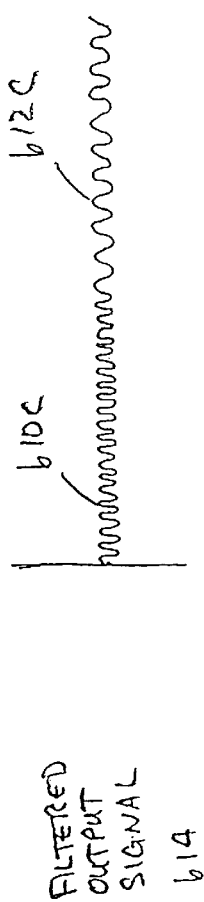
FIG. 6H
FIG. 6I
FIG 6 (cont)

1802

| Time / Node | t-1 (rising edge of $\phi_1$) | t-1 (rising edge of $\phi_2$) | t (rising edge of $\phi_1$) | t (rising edge of $\phi_2$) | t+1 (rising edge of $\phi_1$) |
|---|---|---|---|---|---|
| 1902 | $VI_{t-1}$ 1804 | $VI_{t-1}$ 1808 | $VI_t$ 1816 | $VI_t$ 1826 | $VI_{t+1}$ 1838 |
| 1904 | — | $VI_{t-1}$ 1810 | $VI_{t-1}$ 1818 | $VI_t$ 1828 | $VI_t$ 1840 |
| 1906 | $VO_{t-1}$ 1806 | $VO_{t-1}$ 1812 | $VO_t$ 1820 | $VO_t$ 1830 | $VO_{t+1}$ 1842 |
| 1908 | — | $VO_{t-1}$ 1814 | $VO_{t-1}$ 1822 | $VO_t$ 1832 | $VO_t$ 1844 |
| 1910 | — 1807 | — | $VO_{t-1}$ 1824 | $VO_{t-1}$ 1834 | $VO_t$ 1846 |
| 1912 | — | — 1815 | — | $VO_{t-1}$ 1836 | $VO_{t-1}$ 1848 |
| 1918 | — | — | — | — | $VI_t -$ 1850<br>$0.1 * VO_t -$<br>$0.8 * VO_{t-1}$ |

FIG. 18

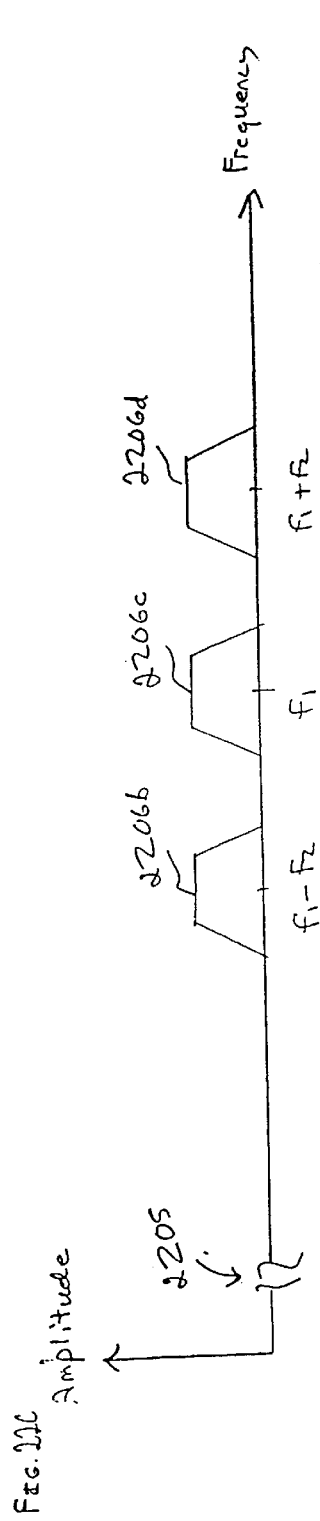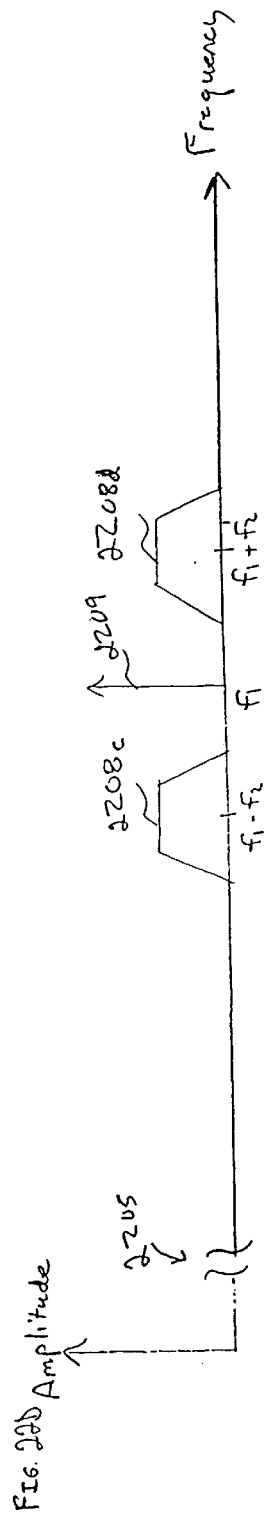

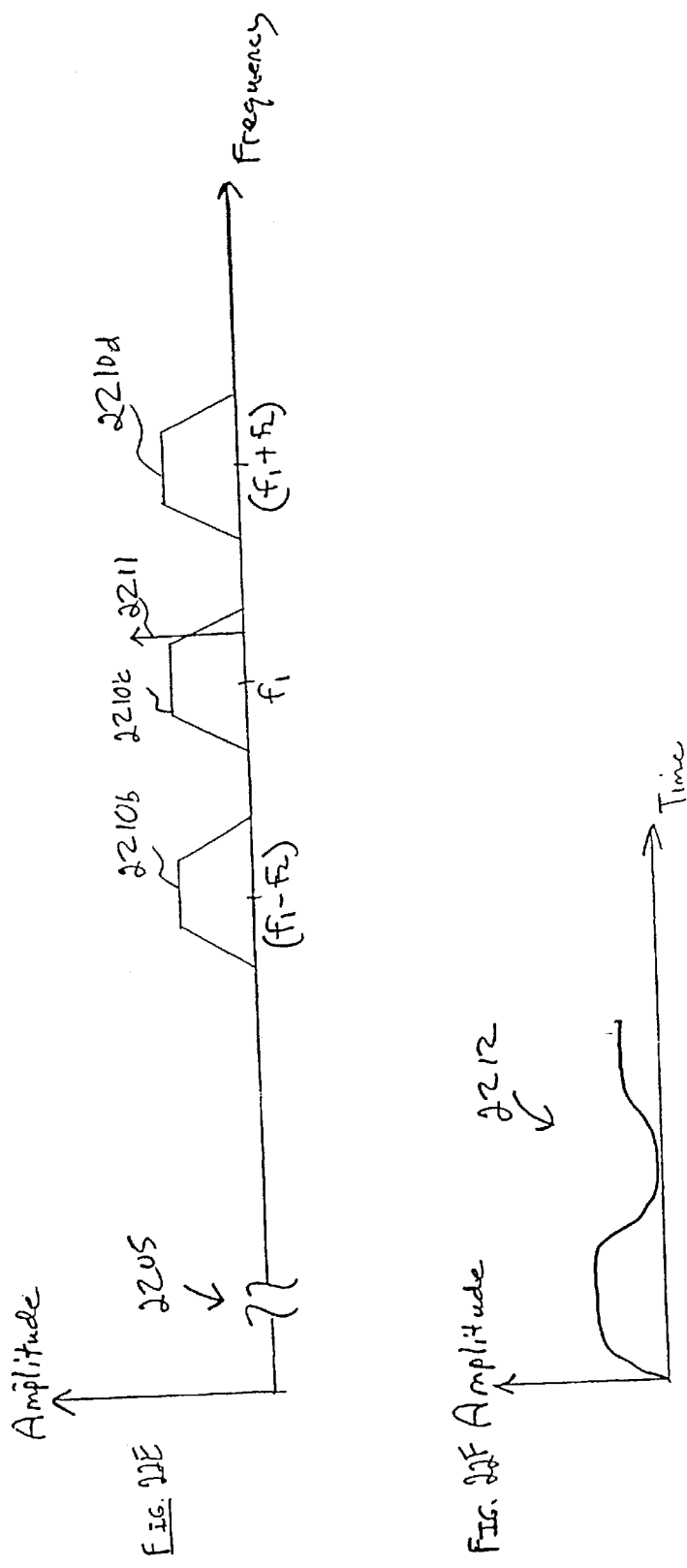

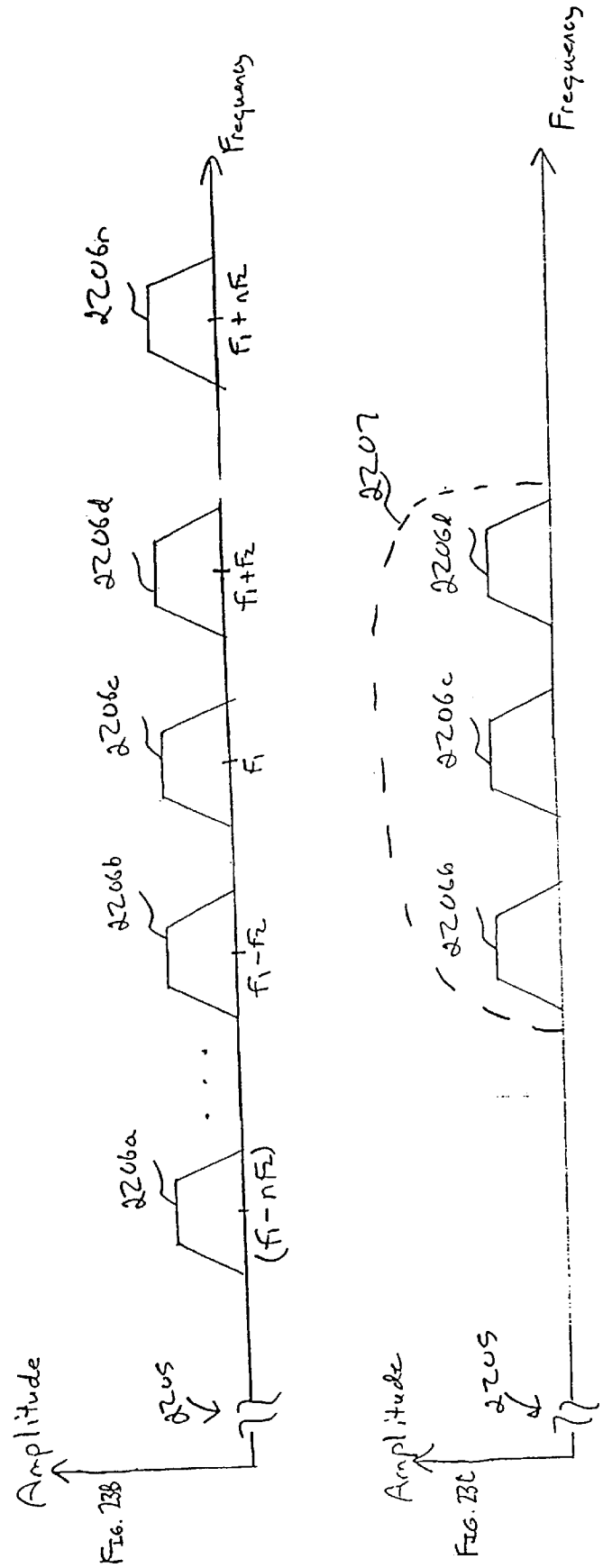

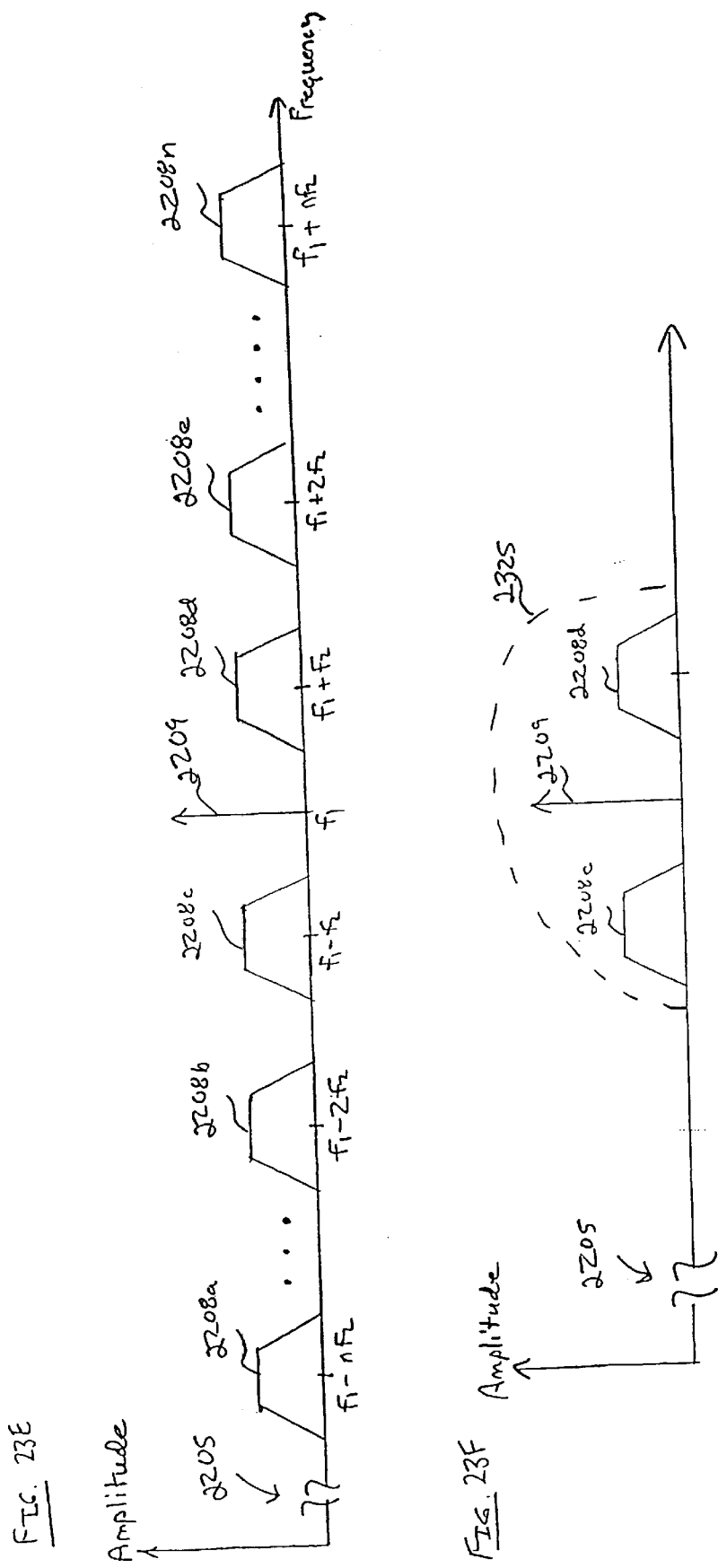

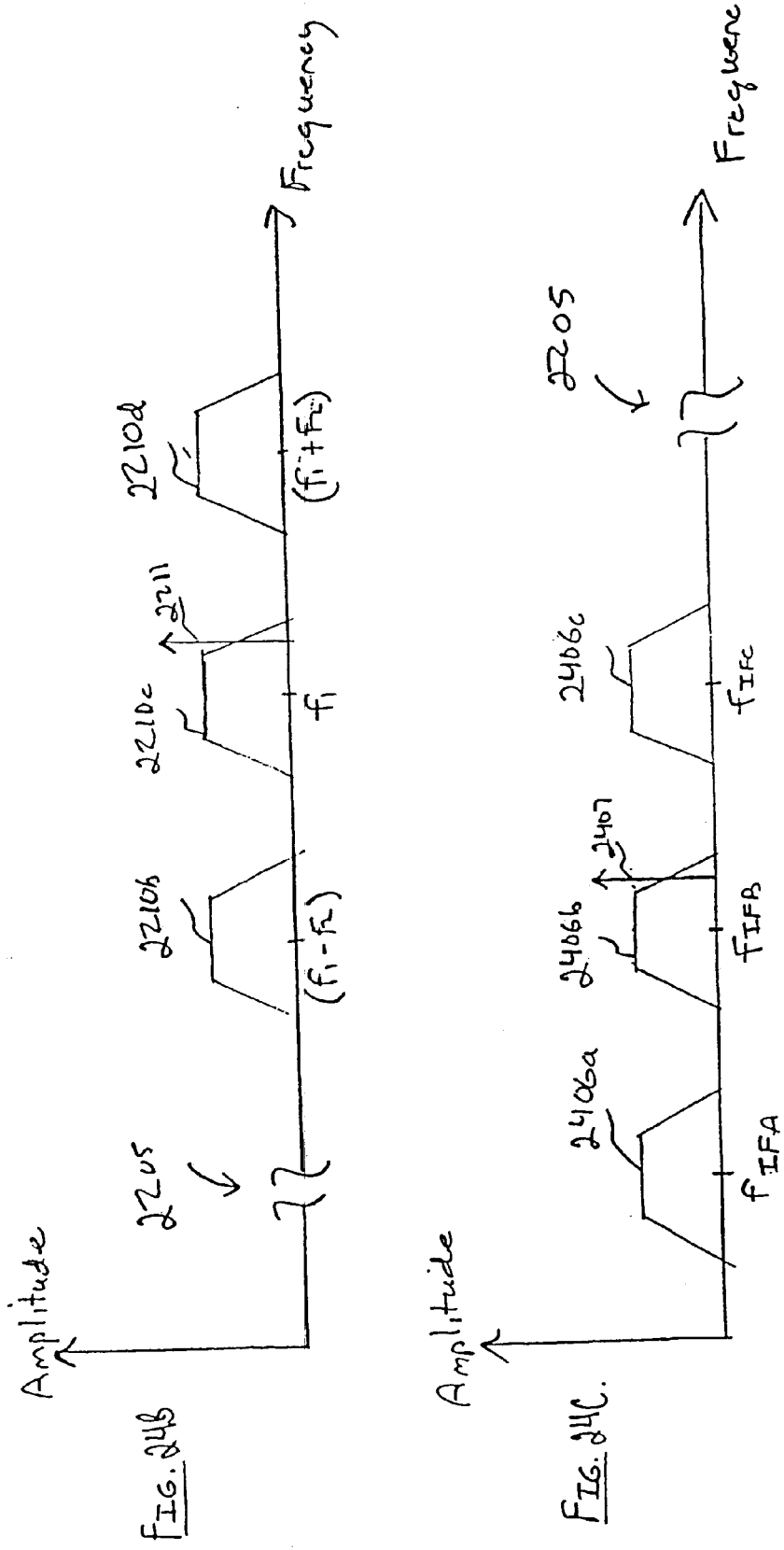

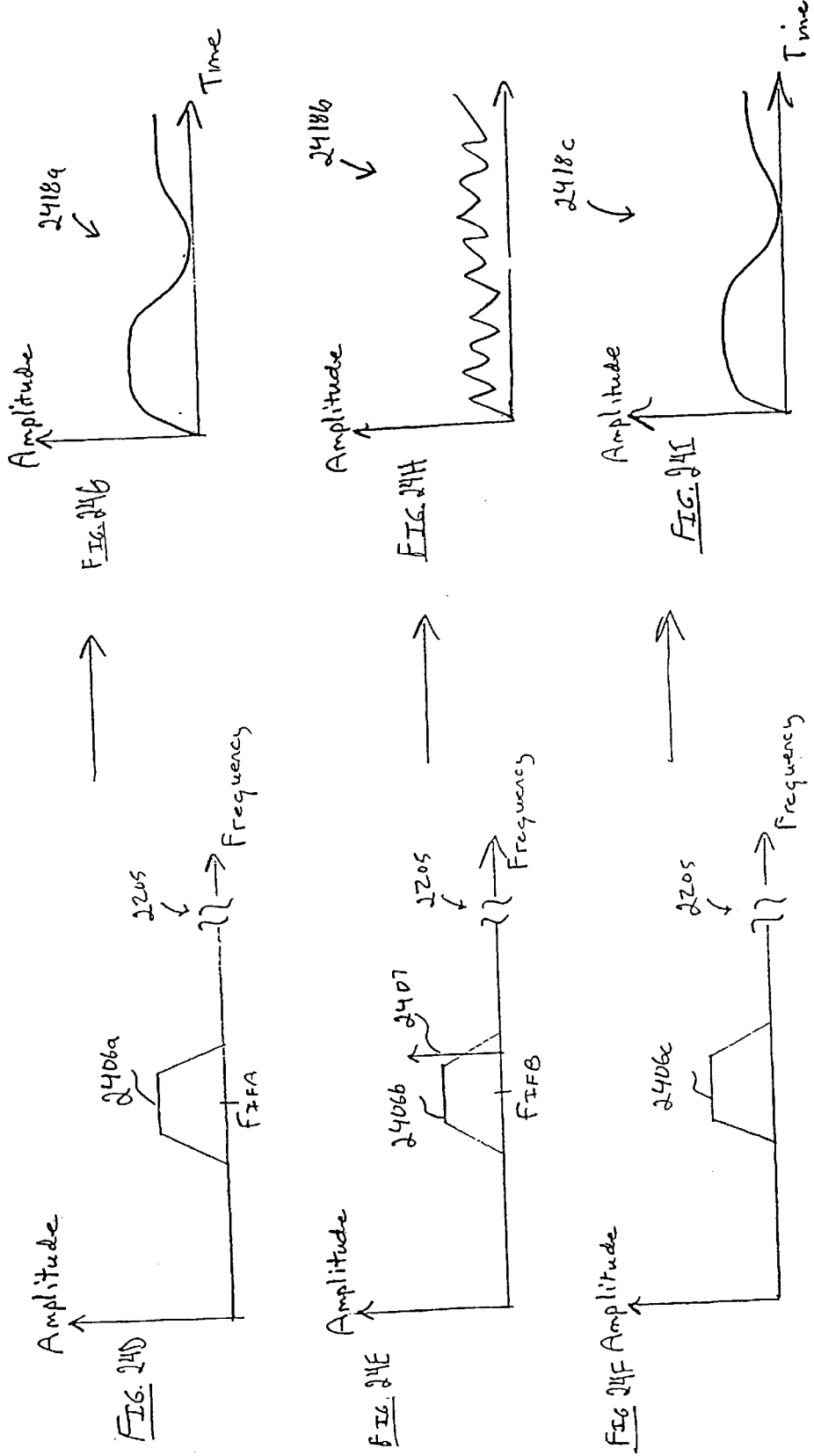

EXAMPLE OF AMR SYSTEM

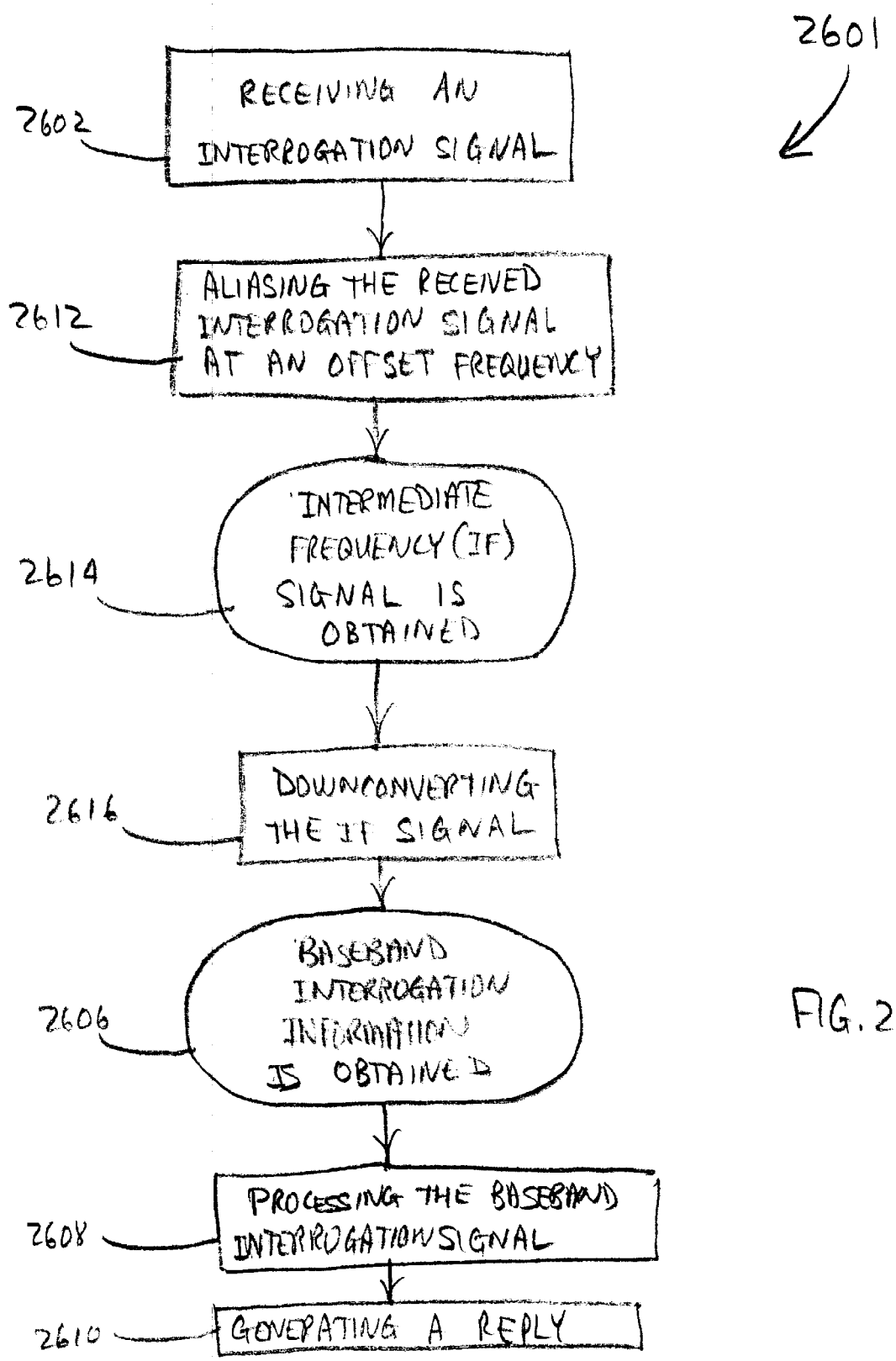

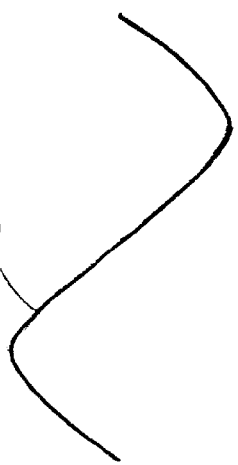
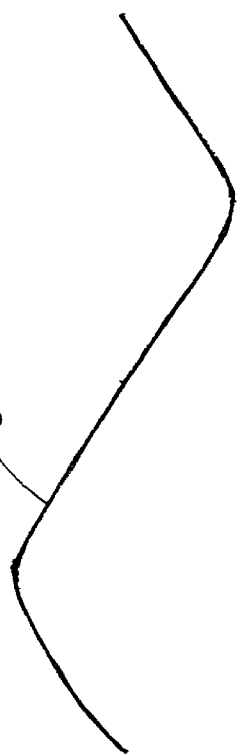
FIG. 34A
FIG. 34B
FIG. 34C

US 6,798,351 B1

AUTOMATED METER READER APPLICATIONS OF UNIVERSAL FREQUENCY TRANSLATION

The present application is a continuation-in-part of pending U.S. application "Applications of Universal Frequency Translation," Ser. No. 09/261,129, filed Mar. 3, 1999, which is a continuation-in-part of U.S. application "Universal Frequency Translation, and Applications of Same," Ser. No. 09/176,027, filed Oct. 21, 1998 now abandoned.

CROSS-REFERENCE TO OTHER APPLICATIONS

The following applications of common assignee are related to the present application, and are herein incorporated by reference in their entireties:

"Method and System for Down-Converting Electromagnetic Signals," Ser. No. 09/176,022, filed Oct. 21, 1998.

"Method and System for Frequency Up-Conversion," Ser. No. 09/176,154, filed Oct. 21, 1998.

"Method and System for Ensuring Reception of a Communications Signal," Ser. No. 09/176,415, filed Oct. 21, 1998.

"Integrated Frequency Translation and Selectivity," Ser. No. 09/175,966, filed Oct. 21, 1998, now U.S. Pat. No. 6,049,706.

"Applications of Universal Frequency Translation," Ser. No. 09/261,129, filed March 3, 1999.

BACKGROUND OF THE INVENTION

1. Field of the Invention

The present invention is generally related to frequency translation, and applications of same. More particularly, the present invention relates to non-heterodyning systems and methods for up-converting and/or down-converting signals for automated meter reading.

2. Related Art

Various aspects of conventional automated meter reader (AMR) systems are taught in the following U.S. Patents which are incorporated herein by reference in their entireties:

U.S. Pat. No. 3,656,112, "Utility Meter Remote Automatic Reading System;"

U.S. Pat. No. 3,705,385, "Remote Meter Reading System;"

U.S. Pat. No. 3,747,068, "Remote Meter Reading System for KWH Watt Hour Meters and Demand Meters;" and U.S. Pat. No. 5,764,158, "Meter Reading Data Transmission System and Method of Using Same."

Conventional AMR systems use frequency up-converters and frequency down-converters, which use electrical components whose properties are frequency dependent. For example, conventional AMR systems typically use conventional heterodyne or super-heterodyne designs. These conventional systems generate unwanted image signals and thus must include filters for filtering the unwanted image signals. However, such filters reduce the power level of the modulated carrier signals and thus must include power amplifiers, which require external energy sources.

What is needed are AMR systems and methods that use non-heterodyning techniques to up-convert and/or down-convert electromagnetic signals.

SUMMARY OF THE INVENTION

The present invention is related to frequency translation, and applications of same. Such include, but are not limited to, frequency down-conversion, frequency up-conversion, enhanced signal reception, unified down-conversion and filtering, and combinations and applications of same.

Further features and advantages of the invention, as well as the structure and operation of various embodiments of the invention, are described in detail below with reference to the accompanying drawings.

BRIEF DESCRIPTION OF THE INVENTION

The present invention is described with reference to the accompanying drawings, wherein:

FIGS. 6A–6I illustrate exemplary waveforms used to describe the operation of the UFU module;

FIG. 18 is a table of exemplary values at nodes in the UDF module of FIG. 17;

FIGS. 22A–22F are exemplary waveforms used to describe the system of FIG. 21;

FIGS. 23B and 23C are exemplary waveforms used to further describe the enhanced signal reception system according to an embodiment of the invention;

FIGS. 23E and 23F are exemplary waveforms used to further describe the enhanced signal reception system according to an embodiment of the invention;

FIGS. 24B–24J are exemplary waveforms used to further describe the enhanced signal reception system according to an embodiment of the invention;

FIG. 26B is a flowchart illustrating a second implementation method for receiving and processing an interrogation signal;

FIG. 34A illustrates an exemplary digital information signal;

FIGS. 34B & 34C illustrate exemplary pulses for modulating bits in the interrogation signal;

DETAILED DESCRIPTION OF THE PREFERRED EMBODIMENTS

Table of Contents

1. Universal Frequency Translation
2. Frequency Down-Conversion
3. Frequency Up-Conversion
4. Enhanced Signal Reception
5. Unified Down-Conversion and Filtering
6. Exemplary Application Embodiments of the Invention
7. Automated Meter Reading (AMR)
   7.1 Method of Operation
      7.1.1 Method for Receiving Interrogation Signals
      7.1.2 Method for Transmitting Reply Messages
      7.1.3 Method for Transmitting Interrogation Messages
      7.1.4 Method for Receiving Reply Messages
   7.2 Exemplary Implementation of a Transponder
      7.2.1 Receiver
      7.2.2 Transmitter
      7.2.3 Embodiment Employing a Single Universal Frequency Translator
      7.2.4 AM and AM-Hybrid Interrogation Schemes
   7.3 Exemplary Implementation of an Interrogator
      7.3.1 Transmitter
      7.3.2 Receiver
8. Other Exemplary Applications
9. Conclusions

1. Universal Frequency Translation

The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
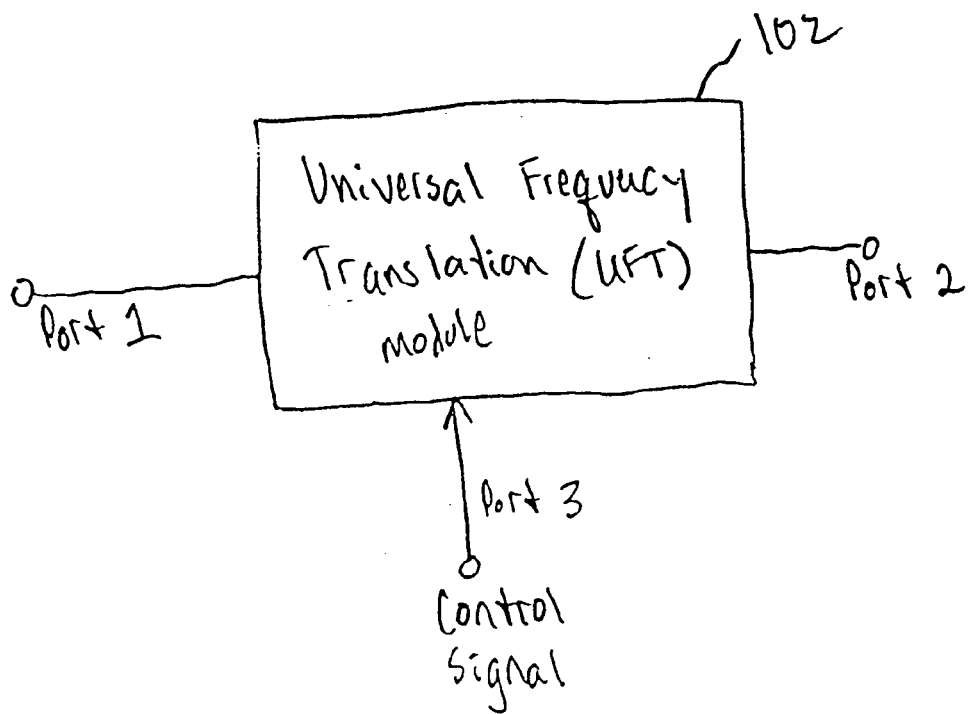
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of UFT module 102 include three ports (nodes), designated in FIG. 1A as Port 1, Port 2, and Port 3. Other UFT embodiments include other than three ports.

Generally, UFT module 102 (perhaps in combination with other components) operates to generate an output signal from an input signal, where the frequency of the output signal differs from the frequency of the input signal. In other words, UFT module 102 (and perhaps other components) operates to generate the output signal from the input signal by translating the frequency (and perhaps other characteristics) of the input signal to the frequency (and perhaps other characteristics) of the output signal.

Figure 1B:
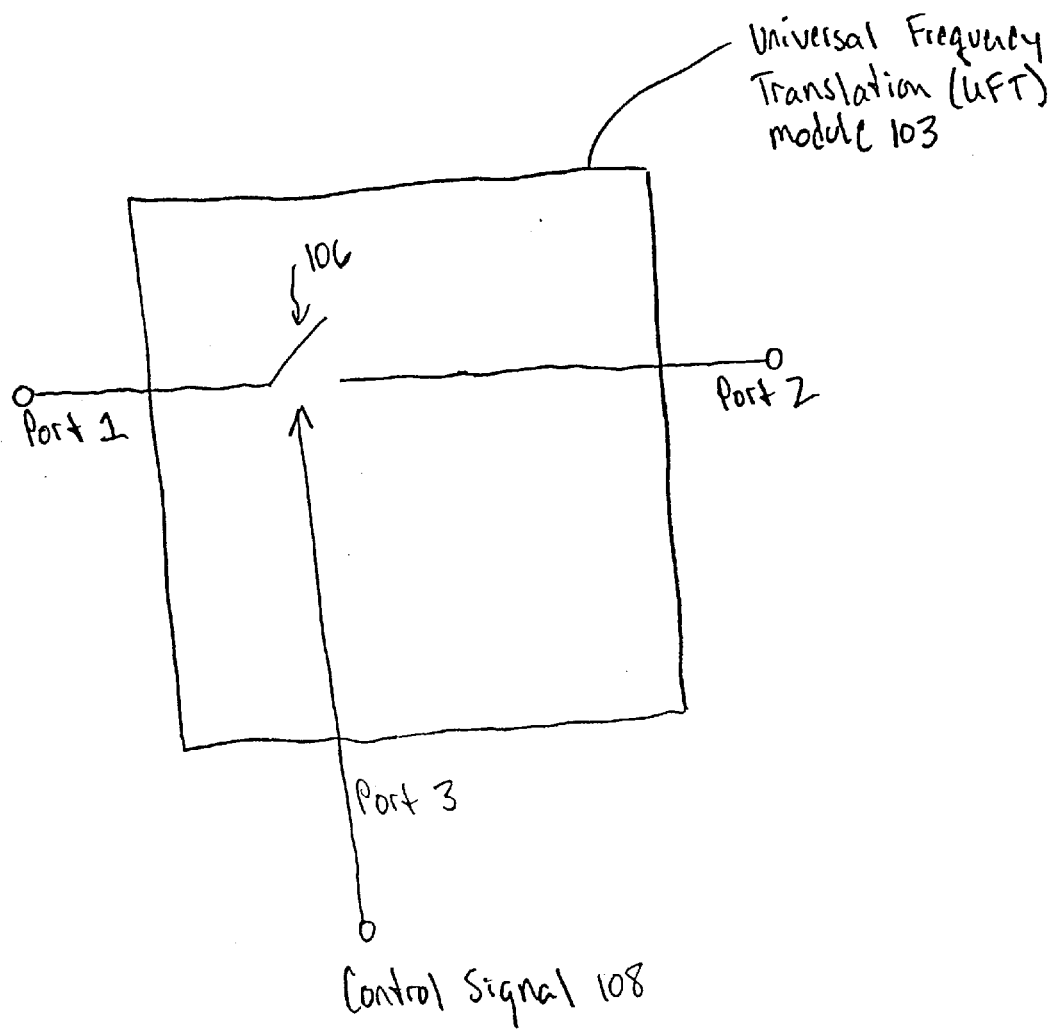
FIG. 1B is a more detailed diagram of a UFT module according to an embodiment of the invention.

An exemplary embodiment of UFT module 103 is generally illustrated in FIG. 1B. Generally, UFT module 103 includes a switch 106 controlled by a control signal 108. Switch 106 is said to be a controlled switch.

Figure 2:
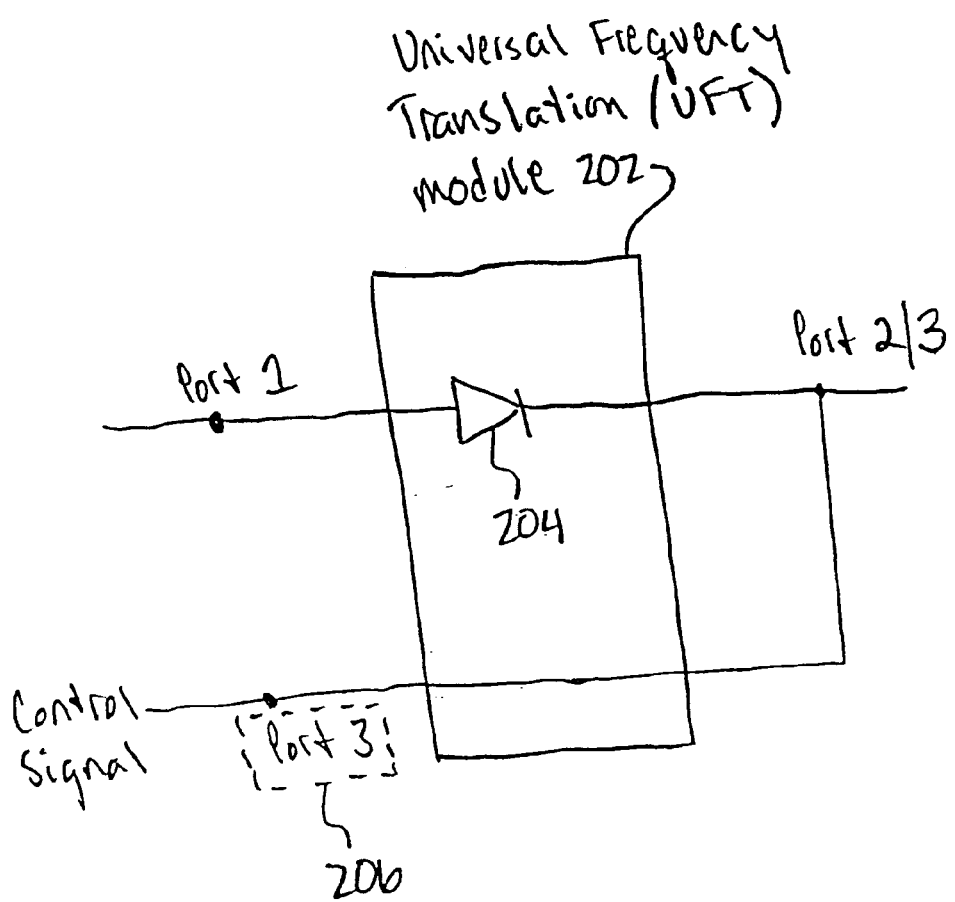
FIG. 2 is a block diagram of a UFT module according to an alternative embodiment of the invention.

As noted above, some UFT embodiments include other than three ports. For example, and without limitation, FIG. 2 illustrates an exemplary UFT module 202. Exemplary UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
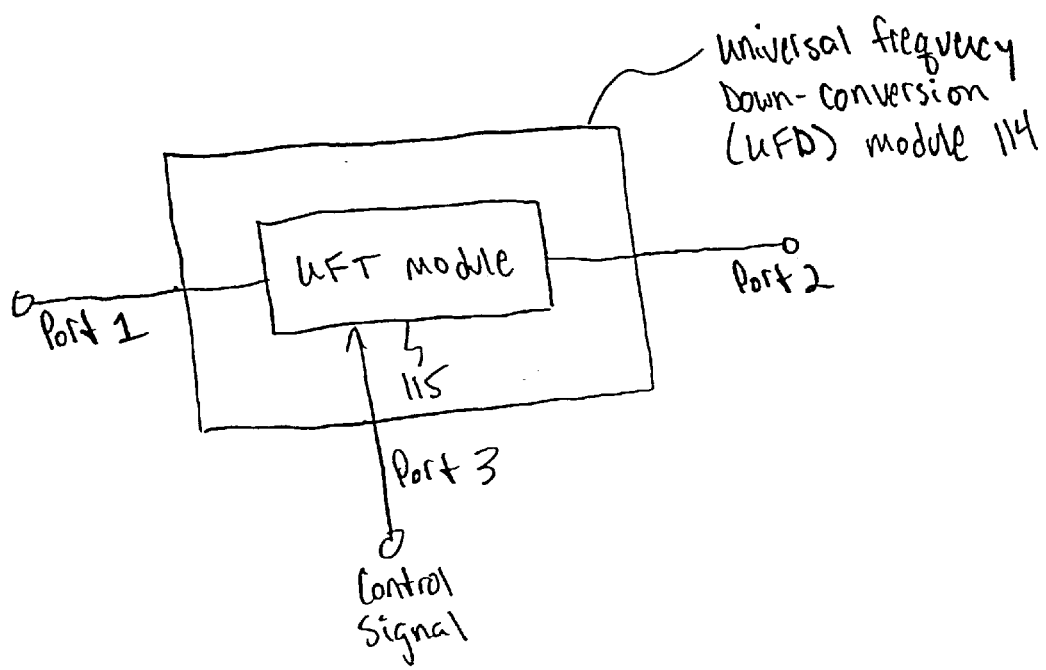
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, UFT module 115 frequency down-converts an input signal to an output signal.

Figure 1D:
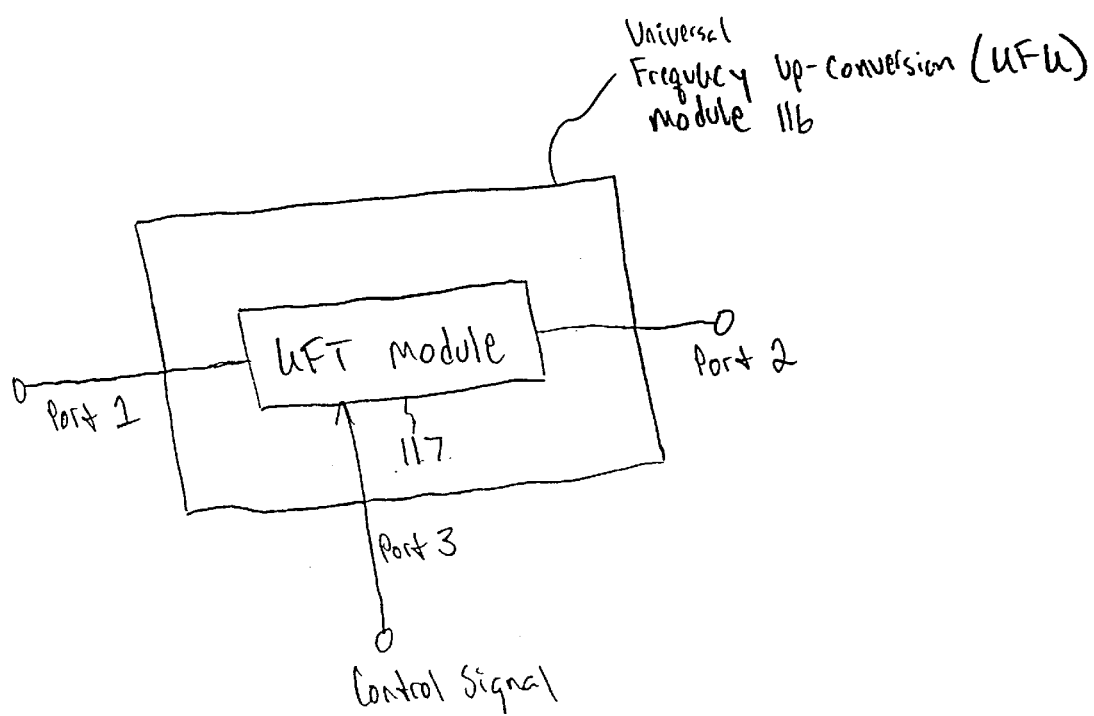
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2. Frequency Down-conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in co-pending U.S. Patent Application entitled "Method and System for Down-Converting Electromagnetic Signals," Ser. No. 09/176,022, filed Oct. 21, 1998, the full disclosure of which is incorporated herein by reference. A relevant portion of the above mentioned patent application is summarized below to describe down-converting an input signal to produce a down-converted signal that exists at a lower frequency or a baseband signal.

Figure 20A:
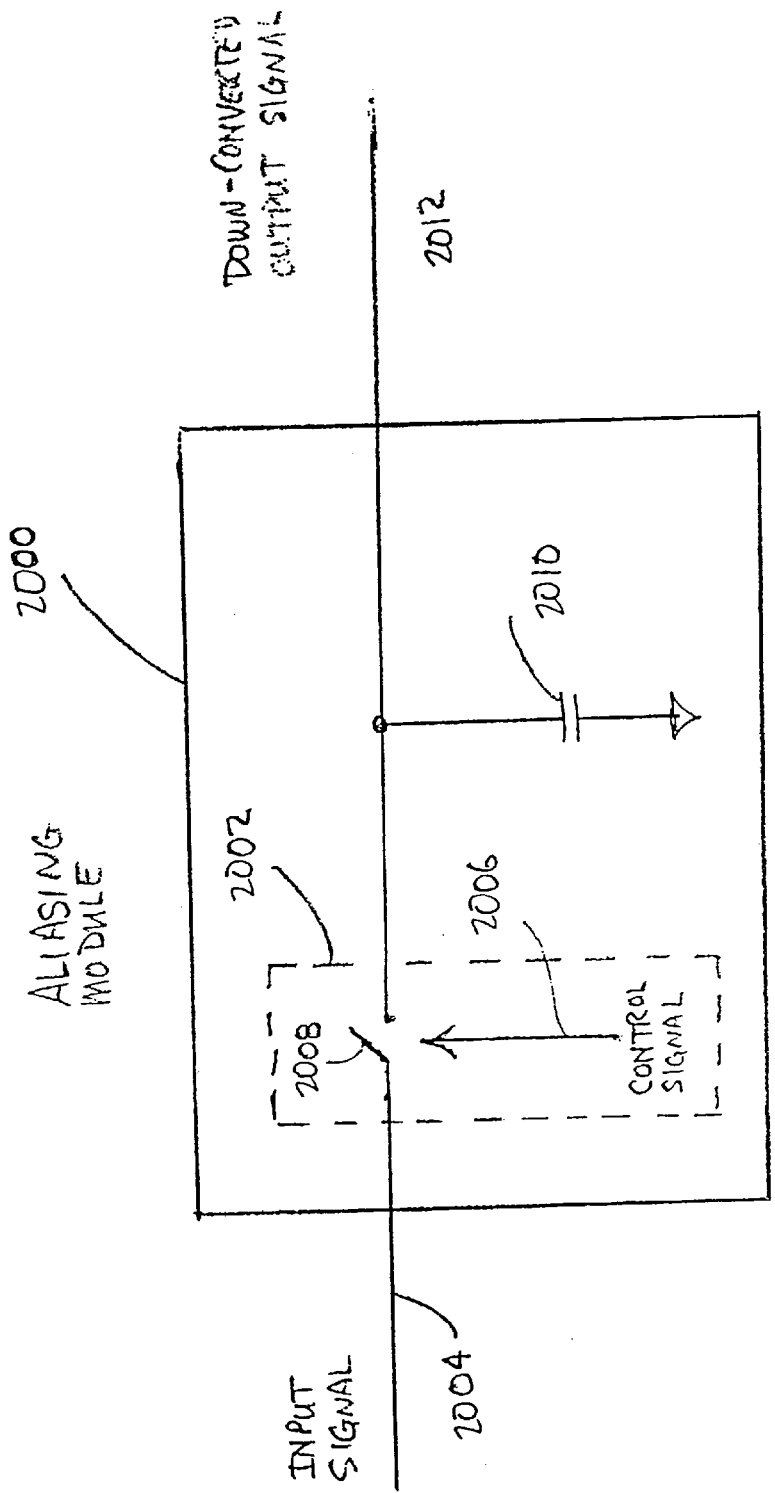
FIGS. 20A and 20A-1 are exemplary aliasing modules according to embodiments of the invention.
Figures 1, 20A:
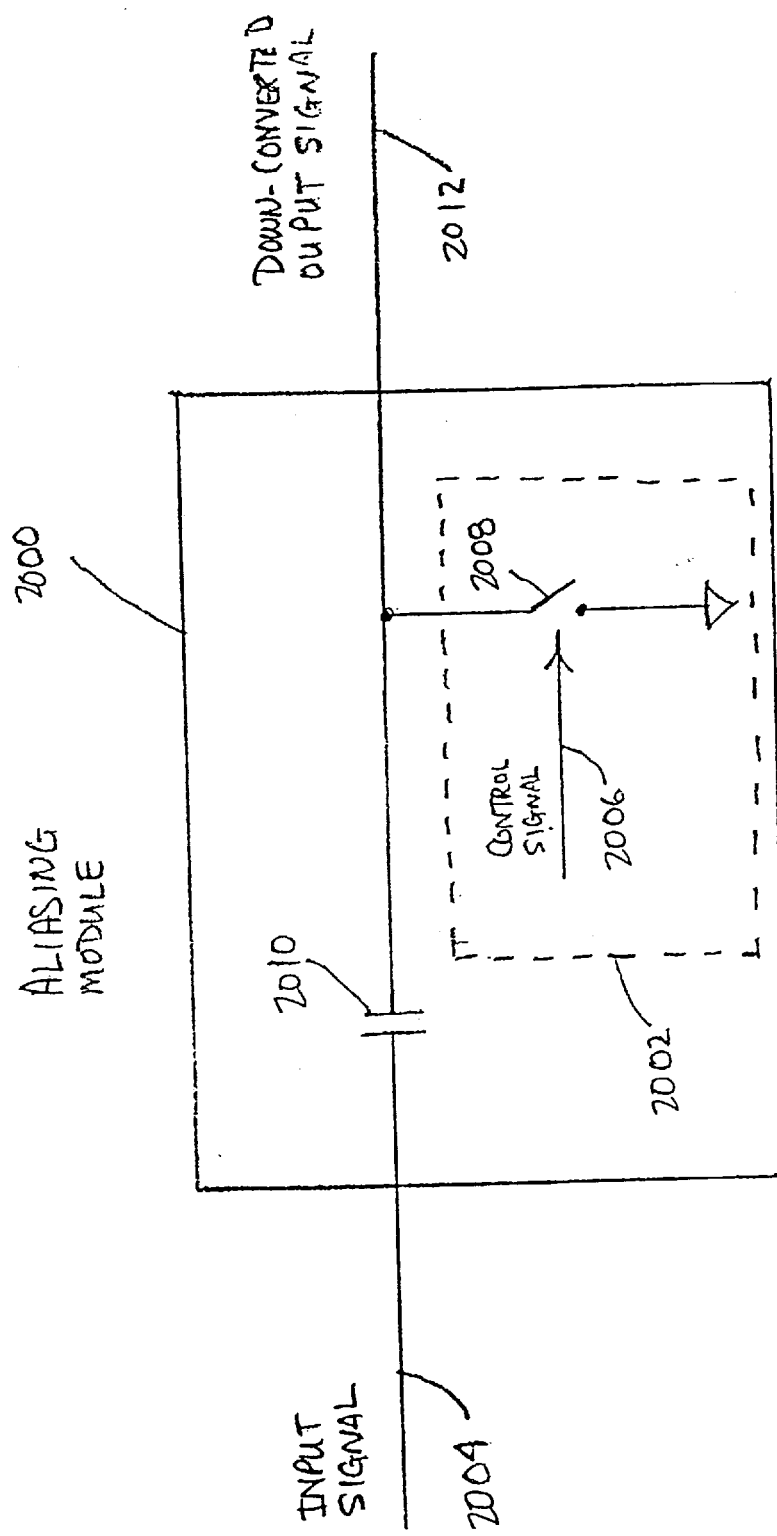

FIG. 20A illustrates an aliasing module 2000 for down-conversion using a universal frequency translation (UFT) module 2002 which down-converts an EM input signal 2004. In particular embodiments, aliasing module 2000 includes a switch 2008 and a capacitor 2010. The electronic alignment of the circuit components is flexible. That is, in one implementation, switch 2008 is in series with input signal 2004 and capacitor 2010 is shunted to ground (although it may be other than ground in configurations such as differential mode). In a second implementation (see FIG. 20A-1), capacitor 2010 is in series with input signal 2004 and switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of EM input signal 2004.

In one implementation, aliasing module 2000 down-converts input signal 2004 to an intermediate frequency (IF) signal. In another implementation, aliasing module 2000 down-converts input signal 2004 to a demodulated baseband signal. In yet another implementation, input signal 2004 is a frequency modulated (FM) signal, and aliasing module 2000 down-converts it to a non-FM signal, such as a phase modulated (PM) signal or an amplitude modulated (AM) signal. Each of the above implementations is described below.

In an embodiment, control signal 2006 includes a train of pulses that repeat at an aliasing rate that is equal to, or less than, twice the frequency of input signal 2004. In this embodiment, control signal 2006 is referred to herein as an aliasing signal because it is below the Nyquist rate for the frequency of input signal 2004. Preferably, the frequency of control signal 2006 is much less than input signal 2004.

Figure 20B:
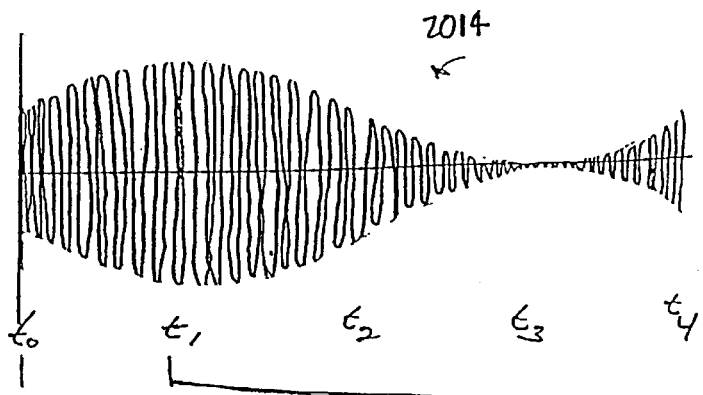
FIGS. 20B–20F are exemplary waveforms used to describe the operation of the aliasing modules of FIGS. 20A and 20A-1.
Figure 20C:
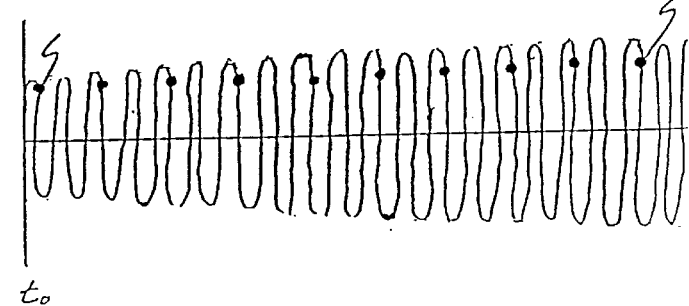
Figure 20D:
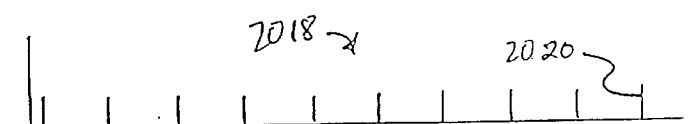
Figure 20E:
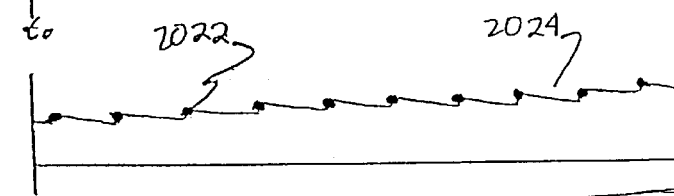

A train of pulses 2018 as shown in FIG. 20D controls switch 2008 to alias input signal 2004 with control signal 2006 to generate a down-converted output signal 2012. More specifically, in an embodiment, switch 2008 closes on a first edge of each pulse 2020 of FIG. 20D and opens on a second edge of each pulse. When switch 2008 is closed, input signal 2004 is coupled to capacitor 2010, and charge is transferred from input signal 2004 to capacitor 2010. The charge stored during successive pulses forms a down-converted output signal 2012.

Exemplary waveforms are shown in FIGS. 20B–20F.

FIG. 20B illustrates an analog amplitude modulated (AM) carrier signal 2014 that is an example of input signal 2004. For illustrative purposes, in FIG. 20C, an analog AM carrier signal portion 2016 illustrates a portion of analog AM carrier signal 2014 on an expanded time scale. Analog AM carrier signal portion 2016 illustrates analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as analog AM carrier signal portion 2016. In the example shown in FIG. 20D, aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). Pulses 2020 repeat at an aliasing rate, or pulse repetition rate of aliasing signal 2018. The aliasing rate is determined as described below, and further described in co-pending U.S. Patent Application entitled "Method and System for Down-converting Electromagnetic Signals," application Ser. No. 09/176,022, Filed Oct. 21, 1998, and is incorporated herein by reference in its entirety.

Figure 20F:
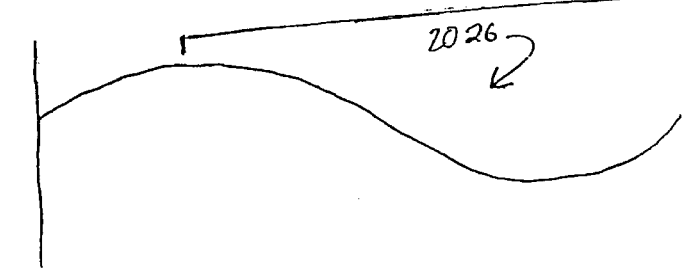

As noted above, train of pulses 2020 (i.e., control signal 2006) control switch 2008 to alias analog AM carrier signal 2016 (i.e., input signal 2004) at the aliasing rate of aliasing signal 2018. Specifically, in this embodiment, switch 2008 closes on a first edge of each pulse and opens on a second edge of each pulse. When switch 2008 is closed, input signal 2004 is coupled to capacitor 2010, and charge is transferred from input signal 2004 to capacitor 2010. The charge transferred during a pulse is referred to herein as an under-sample. Exemplary under-samples 2022 form down-converted signal portion 2024 (FIG. 20E) that corresponds to analog AM carrier signal portion 2016 (FIG. 20C) and train of pulses 2020 (FIG. 20D). The charge stored during successive under-samples of AM carrier signal 2014 form down-converted signal 2024 (FIG. 20E) that is an example of down-converted output signal 2012 (FIG. 20A). In FIG. 20F, a demodulated baseband signal 2026 represents demodulated baseband signal 2024 after filtering on a compressed time scale. As illustrated, down-converted signal 2026 has substantially the same "amplitude envelope" as AM carrier signal 2014. Therefore, FIGS. 20B–20F illustrate down-conversion of AM carrier signal 2014.

The waveforms shown in FIGS. 20B–20F are discussed herein for illustrative purposes only, and are not limiting. Additional exemplary time domain and frequency domain drawings, and exemplary methods and systems of the invention relating thereto, are disclosed in co-pending U.S. Patent Application entitled "Method and System for Down-converting Electromagnetic Signals," application Ser. No. 09/176,022, Filed Oct. 21, 1998, and is incorporated herein by reference in its entirety.

The aliasing rate of control signal 2006 determines whether input signal 2004 is down-converted to an IF signal, down-converted to a demodulated baseband signal, or down-converted from an FM signal to a PM or an AM signal. Generally, relationships between input signal 2004, the aliasing rate of control signal 2006, and down-converted output signal 2012 are illustrated below:

(Freq. of input signal 2004)=n·(Freq. of control signal 2006)±(Freq. of down-converted output signal 2012)

For the examples contained herein, only the "+" condition will be discussed. The value of n represents a harmonic or sub-harmonic of input signal 2004 (e.g., n=0.5, 1, 2, 3, . . . ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHz input signal to a 1 MHz IF signal, the frequency of control signal 2006 would be calculated as follows:

$(Freq_{input} - Freq_{IF})/n = Freq_{control}$ $(901 \text{ MHz} - 1 \text{ MHz})/n = 900/n$ For n=0.5, 1, 2, 3, 4, etc., the frequency of control signal 2006 would be substantially equal to 1.8 GHz, 900 MHz, 450 MHz, 300 MHz, 225 MHz, etc.

Exemplary time domain and frequency domain drawings, illustrating down-conversion of analog and digital AM, PM and FM signals to IF signals, and exemplary methods and systems thereof, are disclosed in co-pending U.S. Patent Application entitled "Method and System for Down-converting Electromagnetic Signals," application Ser. No. 09/176,022, Filed Oct. 21, 1998, and is incorporated herein by reference in its entirety.

Alternatively, when the aliasing rate of control signal 2006 is substantially equal to the frequency of input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of input signal 2004. As a result, the under-samples form a constant output baseband signal. If input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHz input signal to a demodulated baseband signal (i.e., zero IF), the frequency of control signal 2006 would be calculated as follows:

$(Freq_{input} - Freq_{IF})/n = Freq_{control}$ $(900 \text{ MHz} - 0 \text{ MHz})/n = 900 \text{ MHz}/n$ For n=0.5, 1, 2, 3, 4, etc., the frequency of control signal 2006 should be substantially equal to 1.8 GHz, 900 MHz, 450 MHz, 300 MHz, 225 MHz, etc.

Exemplary time domain and frequency domain drawings, illustrating direct down-conversion of analog and digital AM and PM signals to demodulated baseband signals, and exemplary methods and systems thereof, are disclosed in the co-pending U.S. Patent Application entitled "Method and System for Down-converting Electromagnetic Signals," application Ser. No. 09/176,022, Filed Oct. 21, 1998, and is incorporated herein by reference in its entirety.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHz and $F_2$ equal to 901 MHz, to a PSK signal, the aliasing rate of control signal 2006 would be calculated as follows:

Frequency of the input = $(F_1 + F_2) \div 2$ $= (899 \text{ MHz} + 901 \text{ MHz}) \div 2$ $= 900 \text{ MHz}$ Frequency of the down-converted signal=0 (i.e., baseband)

$(Freq_{input} - Freq_{IF})/n = Freq_{control}$ $(900 \text{ MHz} - 0 \text{ MHz})/n = 900 \text{ MHz}/n$ For n=0.5, 1, 2, 3, etc., the frequency of control signal 2006 should be substantially equal to 1.8 GHz, 900 MHz, 450 MHz, 300 MHz, 225 MHz, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHz and $F_2$ equal to 901 MHz, to an ASK signal, the aliasing rate of control signal 2006 should be substantially equal to:

(900 MHz – 0 MHz)/n = 900 MHz/n, or (901 MHz – 0 MHz)/n = 901 MHz/n.

For the former case of 900 MHz/n, and for n=0.5, 1, 2, 3, 4, etc., the frequency of control signal 2006 should be substantially equal to 1.8 GHz, 900 MHz, 450 MHz, 300 MHz, 225 MHz, etc. For the latter case of 901 MHz/n, and for n=0.5, 1, 2, 3, 4, etc., the frequency of control signal 2006 should be substantially equal to 1.802 GHz, 901 MHz, 450.5 MHz, 300.333 MHz, 225.25 MHz, etc. The frequency of the down-converted AM signal is substantially equal to the difference between the lower frequency F, and the upper frequency $F_2$ (i.e., 1 MHz).

Exemplary time domain and frequency domain drawings, illustrating down-conversion of FM signals to non-FM signals, and exemplary methods and systems thereof, are disclosed in the co-pending U.S. Patent Application entitled "Method and System for Down-converting Electromagnetic Signals," application Ser. No. 09/176,022, Filed Oct. 21, 1998, and is incorporated herein by reference in its entirety.

In an embodiment, the pulses of control signal 2006 have negligible apertures that tend towards zero. This makes UFT module 2002 a high input impedance device. This configuration is useful for situations where minimal disturbance of the input signal may be desired.

In another embodiment, the pulses of control signal 2006 have non-negligible apertures that tend away from zero. This makes UFT module 2002 a lower input impedance device. This allows the lower input impedance of UFT module 2002 to be substantially matched with a source impedance of input signal 2004. This also improves the energy transfer from input signal 2004 to down-converted output signal 2012, and hence the efficiency and signal to noise (s/n) ratio of UFT module 2002. In this embodiment, control signal 2006 has an aliasing frequency selected as described above, an aliasing period, "T," that is the inverse of the aliasing frequency, and each of the non-negligible apertures of the pulses of control signal 2006 are said to have an aliasing pulse width, "$PW_A$." The output of UFT module 2002 is stored in capacitor 2010.

In order to effectively transfer energy from input signal 2004 to down-converted output signal 2012, the size of capacitor 2010 is selected based on the ratio of "$PW_A$" to "T" and must be matched with the other circuit elements. Preferably, the capacitor will be "large," as will be understood by one skilled in the relevant art(s). When the size of the capacitor is properly selected for the open-switch and closed-switch impedances and for a specific "$PW_A$" to "T" ratio, the capacitor will charge quickly when switch 2008 of UFT 2002 is closed, and will discharge slowly when switch 2008 is open. The difference in the charging and discharging rates is due to the switching of impedances in and out of the circuit. That is, when switch 2008 is closed, the closed-switch impedance can be said to be $R_C$, and when switch 2008 is open, the open-switch impedance can be said to be $R_O$.

The voltage on capacitor 2010 during charging (i.e., when switch 2008 is closed) can be represented by the equation (assuming there is no charge on the capacitor at t=0)

$$V_{cap/charging} = V_{input} \cdot (1 - e^{-[t/(R_C \cdot C)]})$$

and the voltage on capacitor 2010 during discharge (i.e., when switch 2008 is open) can be seen by the equation (assuming the capacitor is fully charged at t=0)

$$V_{cap/discharging} = V_{full} \cdot e^{-[t/(R_O \cdot C)]}$$

It should be noted that for the capacitor to charge quickly and discharge slowly, the discharging time constant, $R_O \cdot C$, must be greater than the charging time constant, $R_C \cdot C$.

Capacitor 2010 can be characterized as having a first charged state corresponding to the charge on capacitor 2010 at the end of each pulse of control signal 2006 (i.e., at the end of the charging cycle); a second charged state corresponding to the charge on capacitor 2010 at the beginning of the next pulse in control signal 2006 (i.e., at the end of the discharge cycle); and a discharge rate which is the rate at which the first charged state changes to the second charged state and is a function of the size of capacitor 2010. The ratio of the second charged state to the first charged state is the charged ratio, and to effect large energy transfer, the capacitance should be chosen so that the charged ratio is substantially equal to or greater than 0.10. In an alternate embodiment, the capacitor fully discharges while switch 2008 is closed. The discussion herein is provided for illustrative purposes only, and is not meant to be limiting. In another embodiment, the capacitor is replaced by another storage device, such as, and without limitation, an inductor.

Exemplary systems and methods for generating and optimizing control signal 2006, and for otherwise improving energy transfer and s/n ratio, are disclosed in the co-pending U.S. Patent Application entitled "Method and System for Down-converting Electromagnetic Signals," application Ser. No. 09/176,022, Filed Oct. 21, 1998, and is incorporated herein by reference in its entirety.

3. Frequency Up-conversion

The present invention is directed to systems and methods of frequency up-conversion, and applications of same.

Figure 3:
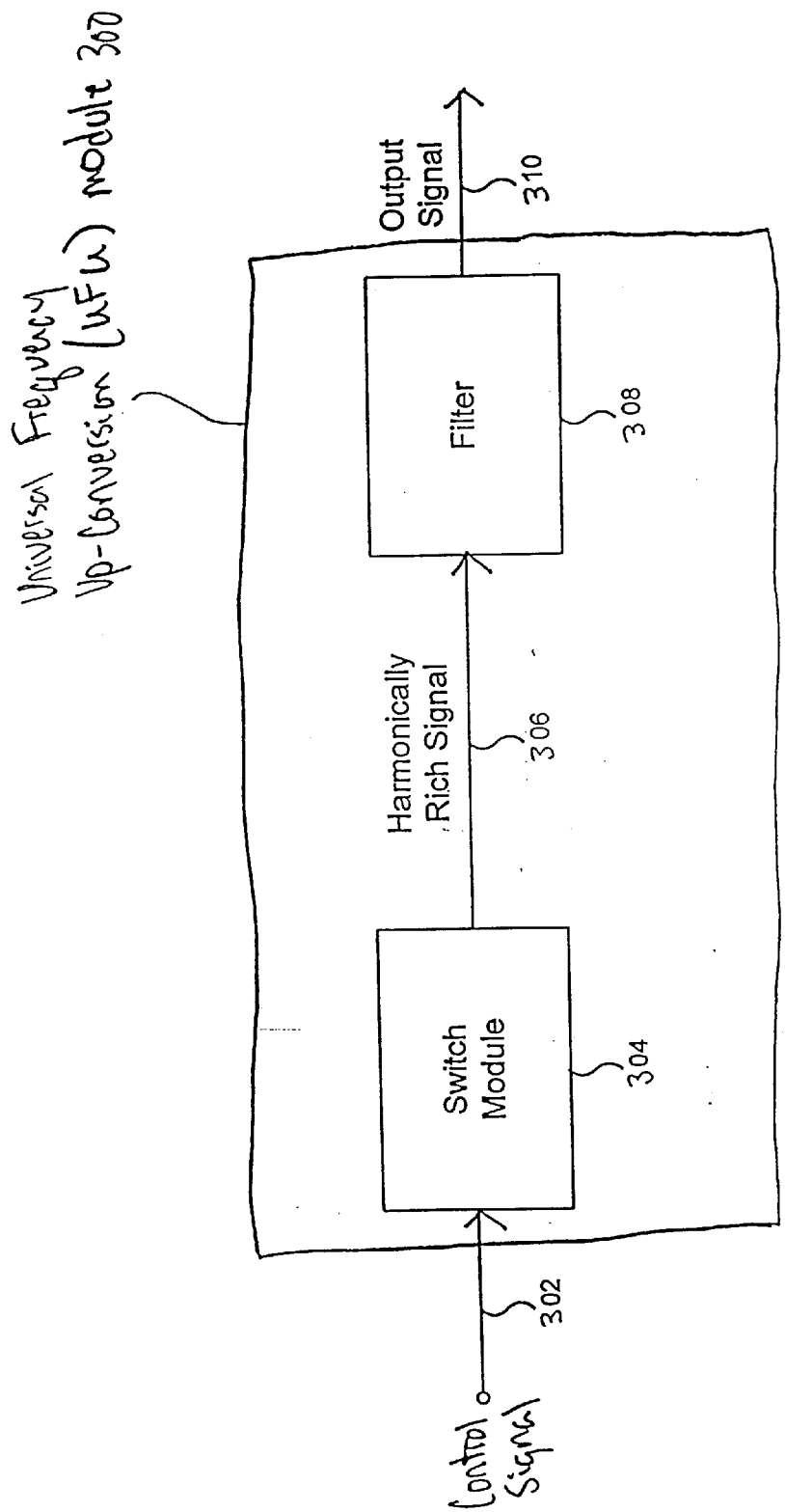
FIG. 3 is a block diagram of a UFU module according to an embodiment of the invention.

An exemplary frequency up-conversion system 300 is illustrated in FIG. 3. Frequency up-conversion system 300 is now described.

An input signal 302 (designated as "Control Signal" in FIG. 3) is accepted by a switch module 304. For purposes of example only, assume that input signal 302 is an FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. Information signal 602 can be analog, digital, or any combination thereof, and any modulation scheme can be used.

The output of switch module 304 is a harmonically rich signal 306, shown for example in FIG. 6D as a harmonically rich signal 608. Harmonically rich signal 608 has a continuous and periodic waveform.

FIG. 6E is an expanded view of two sections of harmonically rich signal 608, section 610 and section 612. Harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Harmonically rich signal 608 is comprised of a plurality of sinusoidal waves whose frequencies are integer multiples of the fundamental frequency of the waveform of harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, input signal 606 may be shaped to ensure that the amplitude of the desired harmonic is sufficient for its intended use (e.g., transmission).

A filter 308 filters out any undesired frequencies (harmonics), and outputs an electromagnetic (EM) signal at the desired harmonic frequency or frequencies as an output signal 310, shown for example as a filtered output signal 614 in FIG. 6I.

Figure 4:
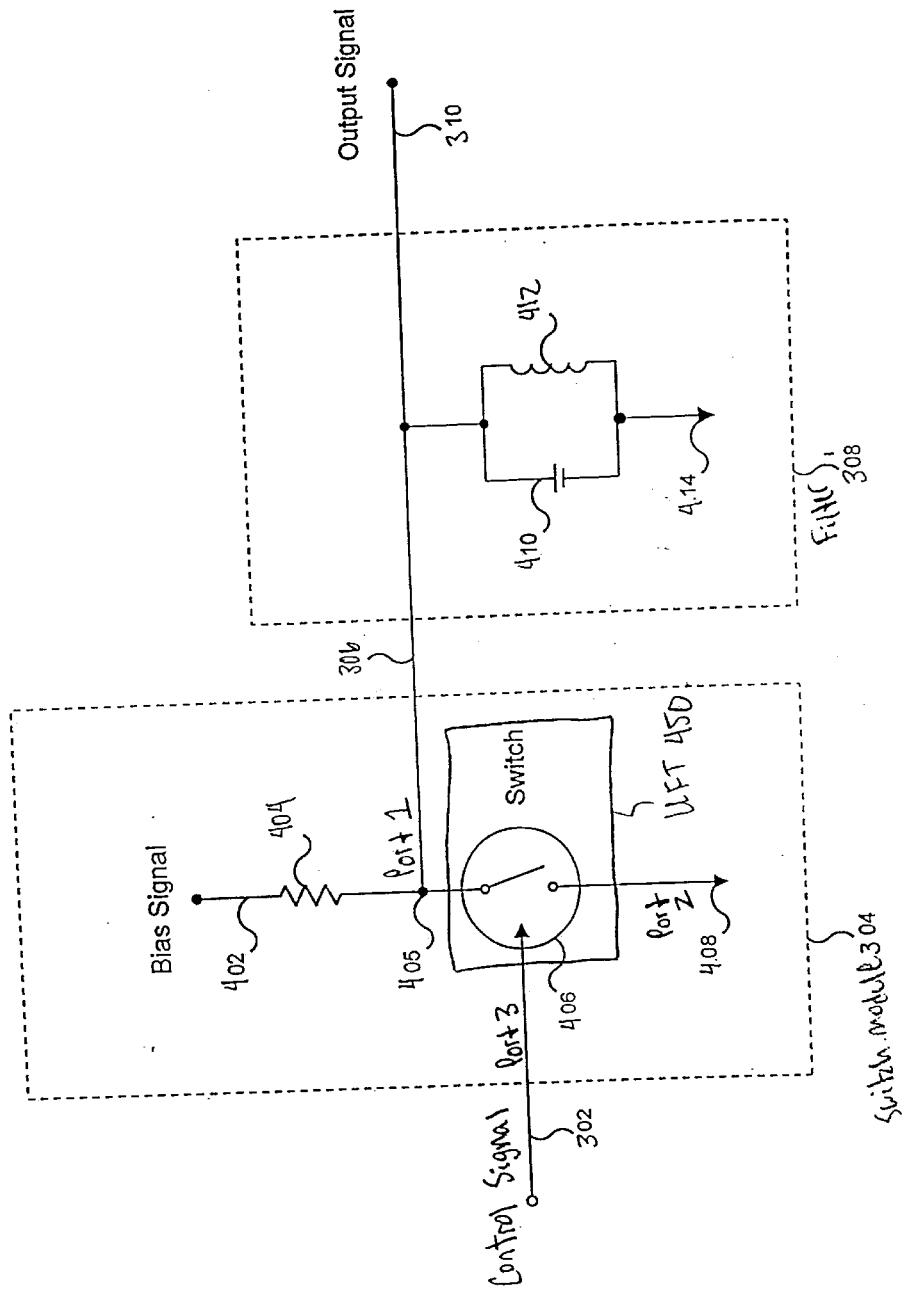
FIG. 4 is a more detailed diagram of a UFU module according to an embodiment of the invention.

FIG. 4 illustrates an exemplary universal frequency up-conversion (UFU) module 401. UFU module 401 includes an exemplary switch module 304, which comprises a bias signal 402, a resistor (or impedance) 404, a universal frequency translator (UFT) 450, and a ground 408. UFT 450 includes a switch 406. Input signal 302 (designated as "Control Signal" in FIG. 4) controls switch 406 in UFT 450, and causes it to close and open. Harmonically rich signal 306 is generated at a node 405 located between resistor (or impedance) 404 and switch 406.

Also in FIG. 4, it can be seen that an exemplary filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

Figure 5:
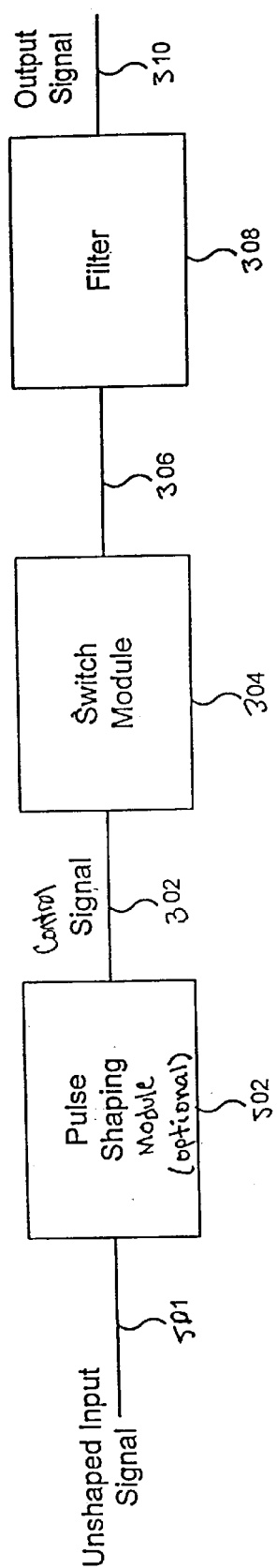
FIG. 5 is a block diagram of a UFU module according to an alternative embodiment of the invention.

For example, in an alternate embodiment shown in FIG. 5, an unshaped input signal 501 is routed to a pulse shaping module 502. Pulse shaping module 502 modifies unshaped input signal 501 to generate a (modified) input signal 302 (designated as the "Control Signal" in FIG. 5). Input signal 302 is routed to switch module 304, which operates in the manner described above. Also, filter 308 of FIG. 5 operates in the manner described above.

The purpose of pulse shaping module 502 is to define the pulse width of input signal 302. Recall that input signal 302 controls the opening and closing of switch 406 in switch module 304. During such operation, the pulse width of input signal 302 establishes the pulse width of harmonically rich signal 306. As stated above, the relative amplitudes of the harmonics of harmonically rich signal 306 are a function of at least the pulse width of harmonically rich signal 306. As such, the pulse width of input signal 302 contributes to setting the relative amplitudes of the harmonics of harmonically rich signal 306.

Further details of up-conversion as described in this section are presented in pending U.S. application "Method and System for Frequency Up-Conversion," Ser. No. 09/176,154, filed Oct. 21, 1998, incorporated herein by reference in its entirety.

4. Enhanced Signal Reception

The present invention is directed to systems and methods of enhanced signal reception (ESR), and applications of same.

Figure 21:
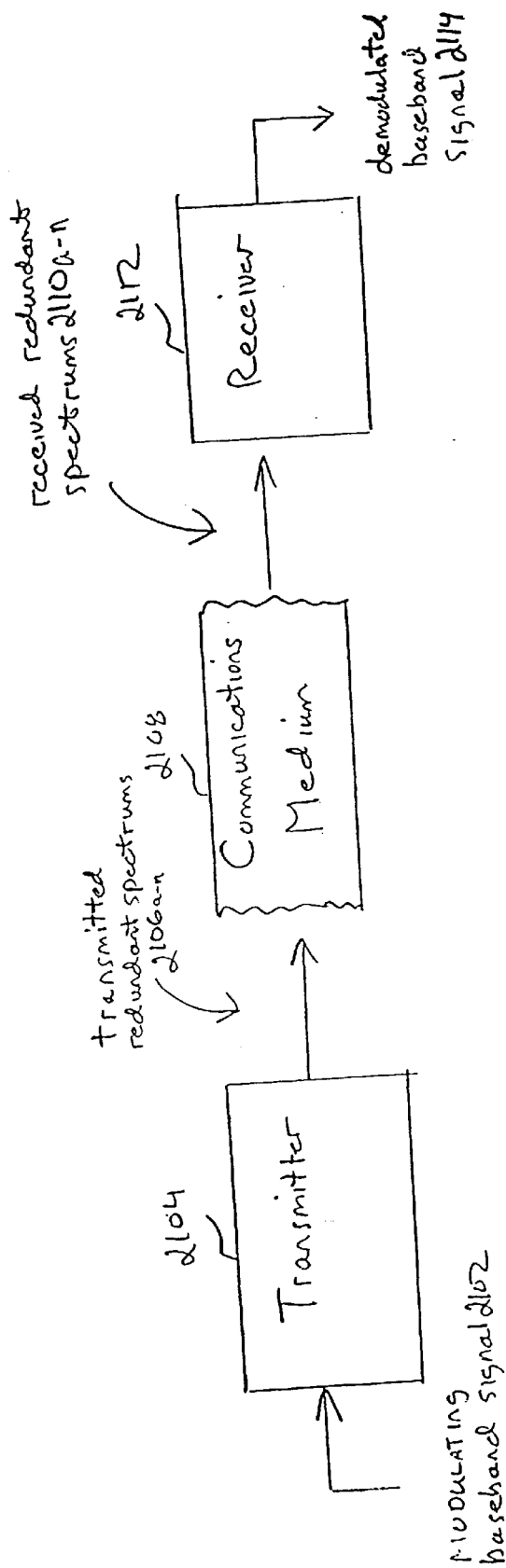
FIG. 21 illustrates an enhanced signal reception system according to an embodiment of the invention.

Referring to FIG. 21, transmitter 2104 accepts a modulating baseband signal 2102 and generates (transmitted) redundant spectra 2106a–n, which are sent over a communications medium 2108. Receiver 2112 recovers a demodulated baseband signal 2114 from (received) redundant spectra 2110a–n. Demodulated baseband signal 2114 is representative of modulating baseband signal 2102, where the level of similarity between modulating baseband signal 2114 and modulating baseband signal 2102 is application dependent.

Modulating baseband signal 2102 is preferably any information signal desired for transmission and/or reception. An exemplary modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22a, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106a–n contains the necessary information to substantially reconstruct modulating baseband signal 2102. In other words, each redundant spectrum 2106a–n contains the necessary amplitude, phase, and frequency information to reconstruct modulating baseband signal 2102.

FIG. 22C illustrates exemplary transmitted redundant spectra 2206b–d. Transmitted redundant spectra 2206b–d are illustrated to contain three redundant spectra for illustration purposes only. Any number of redundant spectra could be generated and transmitted as will be explained in following discussions.

Transmitted redundant spectra 2206b–d are centered at $f_1$, with a frequency spacing $f_2$ between adjacent spectra. Frequencies $f_1$ and $f_2$ are dynamically adjustable in real-time as will be shown below. FIG. 22D illustrates an alternate embodiment, where redundant spectra 2208c,d are centered on unmodulated oscillating signal 2209 at $f_1$ (Hz). Oscillating signal 2209 may be suppressed if desired using, for example, phasing techniques or filtering techniques. Transmitted redundant spectra are preferably above baseband frequencies as is represented by break 2205 in the frequency axis of FIGS. 22C and 22D.

Received redundant spectra 2110a–n are substantially similar to transmitted redundant spectra 2106a–n, except for the changes introduced by communications medium 2108. Such changes can include but are not limited to signal attenuation, and signal interference. FIG. 22E illustrates exemplary received redundant spectra 2210b–d. Received redundant spectra 2210b–d are substantially similar to transmitted redundant spectra 2206b–d, except that redundant spectrum 2210c includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

As stated above, demodulated baseband signal 2114 is extracted from one or more of received redundant spectra 2210*b–d*. FIG. 22F illustrates exemplary demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectra are transmitted, where each redundant spectrum carries the necessary information to reconstruct the baseband signal. At the destination, the redundant spectra are isolated from each other so that the baseband signal can be recovered even if one or more of the redundant spectra are corrupted by a jamming signal.

Figure 23A:
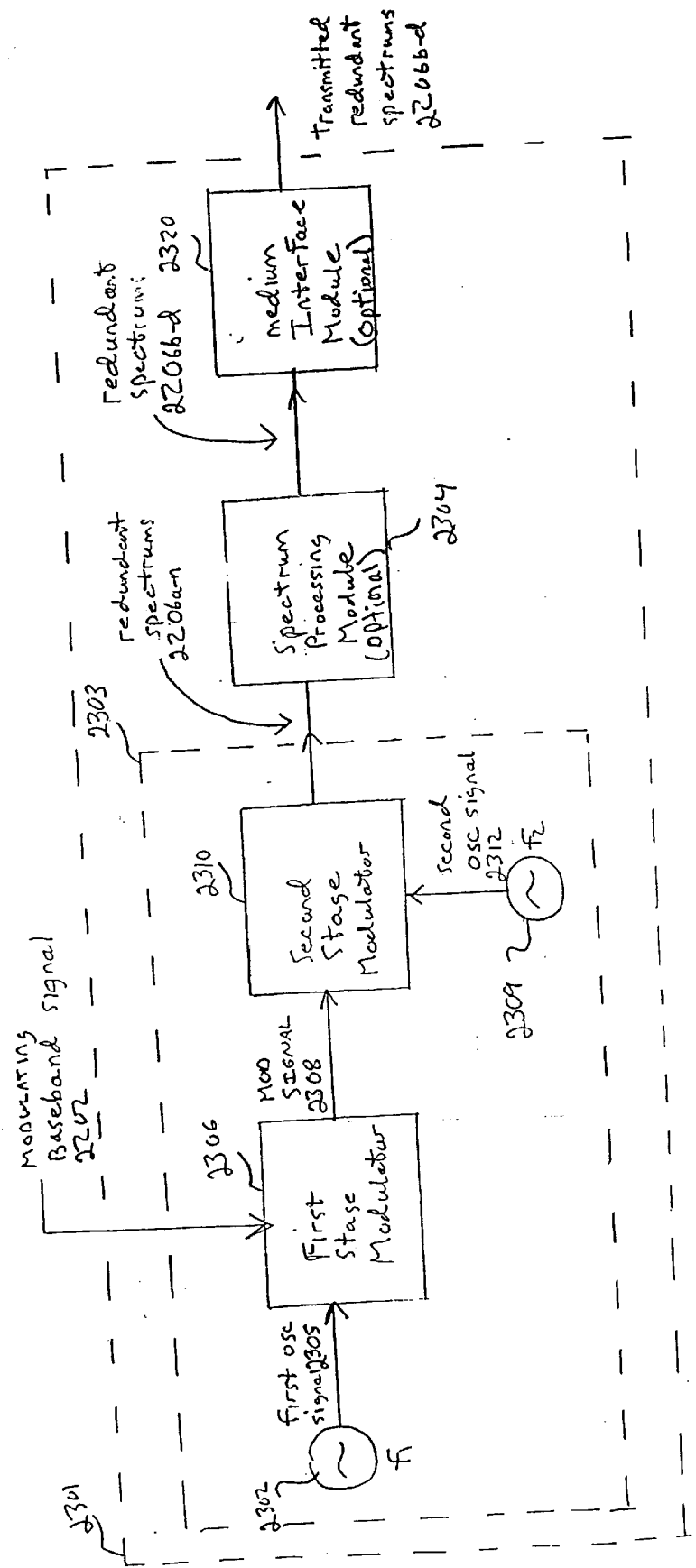
FIG. 23A illustrates an exemplary transmitter in an enhanced signal reception system according to an embodiment of the invention.

Transmitter 2104 will now be explored in greater detail. FIG. 23A illustrates transmitter, 2301, which is one embodiment of transmitter 2104 that generates redundant spectra configured similar to redundant spectra 2206*b–d*. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectra 2206*a–n* shown in FIG. 23B. Second stage modulator 2310 is preferably a phase modulator, or a frequency modulator, although other types of modulation may be implemented including but not limited to amplitude modulation. Each redundant spectrum 2206*a–n* contains the necessary amplitude, phase, and frequency information to substantially reconstruct modulating baseband signal 2202.

Redundant spectra 2206*a–n* are substantially centered around $f_1$, which is the characteristic frequency of first oscillating signal 2305. Also, each redundant spectrum 2206*a–n* (except for 2206*c*) is offset from $f_1$ by approximately a multiple of $f_2$ (Hz), where $f_2$ is the frequency of second oscillating signal 2312. Thus, each redundant spectrum 2206*a–n* is offset from an adjacent redundant spectrum by $f_2$ (Hz). This allows the spacing between adjacent redundant spectra to be adjusted (or tuned) by changing $f_2$ that is associated with second oscillator 2309. Adjusting the spacing between adjacent redundant spectra allows for dynamic real-time tuning of the bandwidth occupied by redundant spectra 2206*a–n*.

In one embodiment, the number of redundant spectra 2206*a–n* generated by transmitter 2301 is arbitrary and may be unlimited as indicated by the "a–n" designation for redundant spectra 2206*a–n*. However, a typical communications medium will have a physical and/or administrative limitations (i.e. FCC regulations) that restrict the number of redundant spectra that can be practically transmitted over the communications medium. Also, there may be other reasons to limit the number of redundant spectra transmitted. Therefore, preferably, transmitter 2301 will include an optional spectrum processing module 2304 to process redundant spectra 2206*a–n* prior to transmission over communications medium 2108.

In one embodiment, spectrum processing module 2304 includes a filter with a passband 2207 (FIG. 23C) to select redundant spectra 2206*b–d* for transmission. This will substantially limit the frequency bandwidth occupied by the redundant spectra to passband 2207. In one embodiment, spectrum processing module 2304 also up converts redundant spectra and/or amplifies redundant spectra prior to transmission over communications medium 2108. Finally, medium interface module 2320 transmits redundant spectra over communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
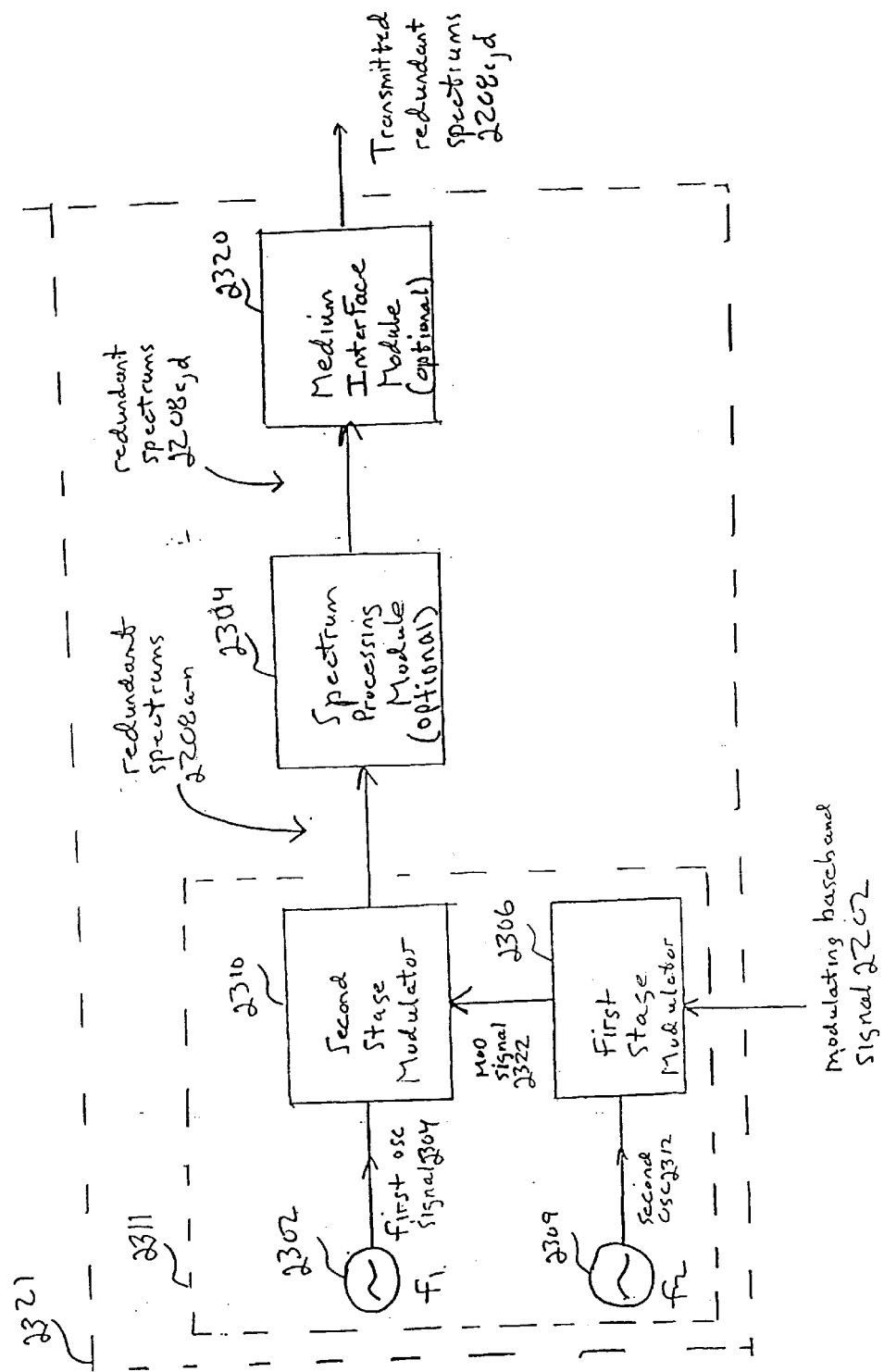
FIG. 23D illustrates another exemplary transmitter in an enhanced signal reception system according to an embodiment of the invention.

FIG. 23D illustrates transmitter 2321, which is one embodiment of transmitter 2104 that generates redundant spectra configured similar to redundant spectra 2208*c–d* and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to: amplitude modulation frequency modulation, combinations thereof, or any other type of modulation. Second stage modulator 2310 modulates first oscillating signal 2304 with modulated signal 2322, resulting in redundant spectra 2208*a–n*, as shown in FIG. 23E. Second stage modulator 2310 is preferably a phase or frequency modulator, although other modulators could used including but not limited to an amplitude modulator.

Redundant spectra 2208*a–n* are centered on unmodulated spectrum 2209 (at $f_1$ Hz), and adjacent spectra are separated by $f_2$ Hz. The number of redundant spectra 2208*a–n* generated by generator 2311 is arbitrary and unlimited, similar to spectra 2206*a–n* discussed above. Therefore, optional spectrum processing module 2304 may also include a filter with passband 2325 to select, for example, spectra 2208*c,d* for transmission over communications medium 2108. In addition, optional spectrum processing module 2304 may also include a filter (such as a bandstop filter) to attenuate unmodulated spectrum 2209. Alternatively, unmodulated spectrum 2209 maybe attenuated by using phasing techniques during redundant spectrum generation. Finally, (optional) medium interface module 2320 transmits redundant spectra 2208*c,d* over communications medium 2108.

Figure 24A:
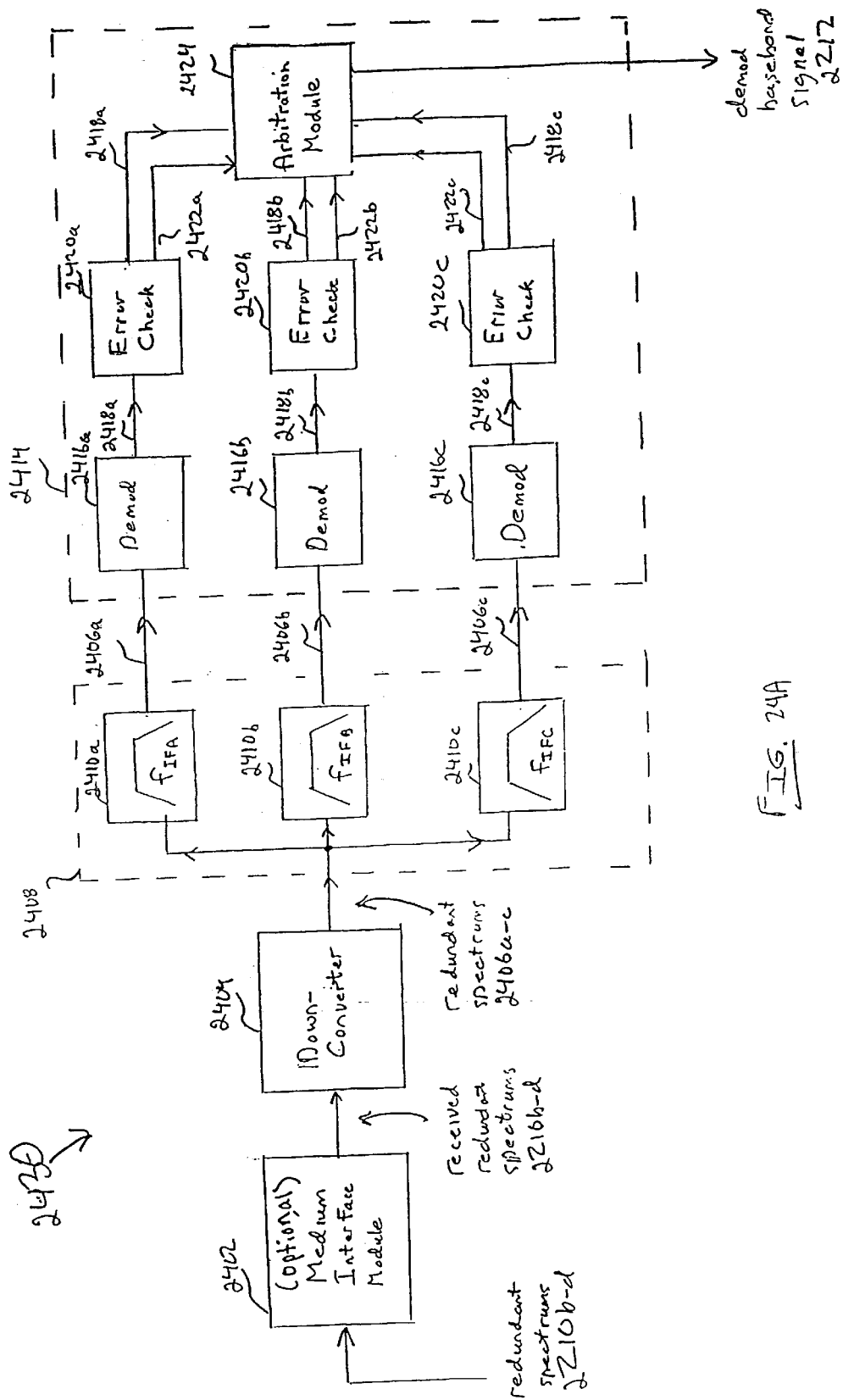
FIG. 24A illustrates an exemplary receiver in an enhanced signal reception system according to an embodiment of the invention.
Figure 345:

Receiver 2112 will now be explored in greater detail to illustrate recovery of a demodulated baseband signal from received redundant spectra. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410a–c. Data extraction module 2414 includes demodulators 2416a–c, error check modules 2420a–c, and arbitration module 2424. Receiver 2430 will be discussed in relation to the signal diagrams in FIGS. 24B–24J.

In one embodiment, optional medium interface module 2402 receives redundant spectra 2210b–d (FIG. 22E, and FIG. 24B). Each redundant spectrum 2210b–d includes the necessary amplitude, phase, and frequency information to substantially reconstruct the modulating baseband signal used to generated the redundant spectra. However, in the present example, spectrum 2210c also contains jamming signal 2211, which may interfere with the recovery of a baseband signal from spectrum 2210c. Down-converter 2404 down-converts received redundant spectra 2210b–d to lower intermediate frequencies, resulting in redundant spectra 2406a–c (FIG. 24C). Jamming signal 2211 is also down-converted to jamming signal 2407, as it is contained within redundant spectrum 2406b. Spectrum isolation module 2408 includes filters 2410a–c that isolate redundant spectra 2406a–c from each other (FIGS. 24D–24F, respectively). Demodulators 2416a–c independently demodulate spectra 2406a–c, resulting in demodulated baseband signals 2418a–c, respectively (FIGS. 24G–24I). Error check modules 2420a–c analyze demodulate baseband signal 2418a–c to detect any errors. In one embodiment, each error check module 2420a–c sets an error flag 2422a–c whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectra, where the degree of similarity is application dependent.

Referring to FIGS. 24G–I, arbitration module 2424 will select either demodulated baseband signal 2418a or 2418c, because error check module 2420b will set error flag 2422b that is associated with demodulated baseband signal 2418b.

The error detection schemes implemented by the error detection modules include but are not limited to: cyclic redundancy check (CRC) and parity check for digital signals, and various error detections schemes for analog signal.

Further details of enhanced signal reception as described in this section are presented in pending U.S. application "Method and System for Ensuring Reception of a Communications Signal," Ser. No. 09/176,415, filed Oct. 21, 1998, incorporated herein by reference in its entirety.

5. Unified Down-conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
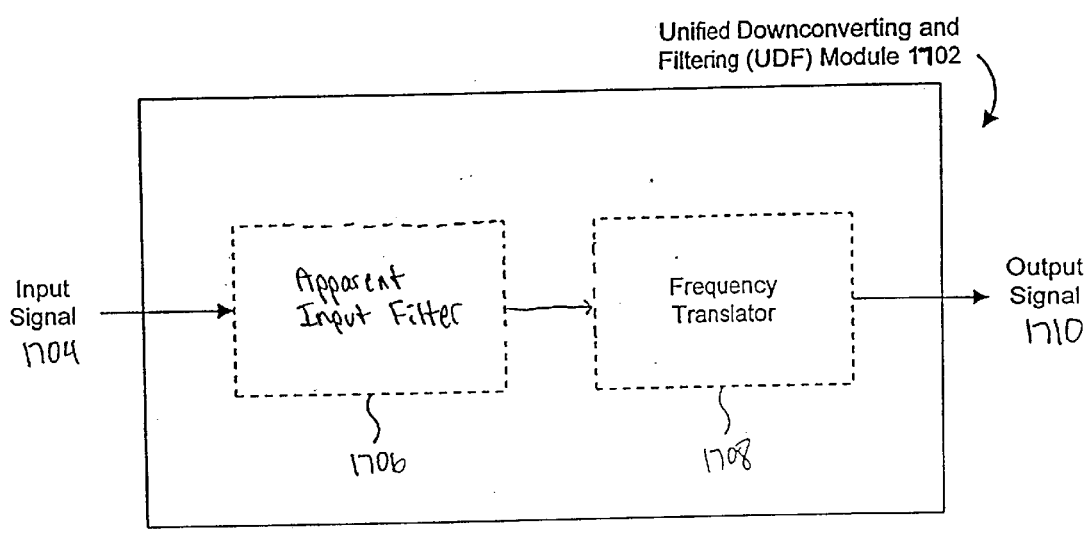
FIG. 17 illustrates a UDF module according to an embodiment of the invention.

FIG. 17 is a conceptual block diagram of a DF module 1702 according to an embodiment of the present invention. UDF module 1702 performs at least frequency translation and frequency selectivity.

The effect achieved by UDF module 1702 is to perform the frequency selectivity operation prior to the performance of the frequency translation operation. Thus, UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by UDF module 1702 are at radio frequencies. UDF module 1702 effectively operates to input filter these RF input signals 1704. Specifically, in these embodiments, UDF module 1702 effectively performs input, channel select filtering of RF input signal 1704. Accordingly, the invention achieves high selectivity at high frequencies.

UDF module 1702 effectively performs various types of filtering, including but not limited to bandpass filtering, low pass filtering, high pass filtering, notch filtering, all pass filtering, band stop filtering, etc., and combinations thereof.

Conceptually, UDF module 1702 includes a frequency translator 1708. Frequency translator 1708 conceptually represents that portion of UDF module 1702 that performs frequency translation (down conversion).

UDF module 1702 also conceptually includes an apparent input filter 1706 (also sometimes called an input filtering emulator). Conceptually, apparent input filter 1706 represents that portion of UDF module 1702 that performs input filtering.

In practice, the input filtering operation performed by UDF module 1702 is integrated with the frequency translation operation. The input filtering operation can be viewed as being performed concurrently with the frequency translation operation. This is a reason why input filter 1706 is herein referred to as an "apparent" input filter 1706.

UDF module 1702 of the present invention includes a number of advantages. For example, high selectivity at high frequencies is realizable using UDF module 1702. This feature of the invention is evident by the high Q factors that are attainable. For example, and without limitation, UDF module 1702 can be designed with a filter center frequency $f_C$ on the order of 900 MHz, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of UDF module 1702 can be electrically adjusted, either statically or dynamically.

Also, UDF module 1702 can be designed to amplify input signals.

Further, UDF module 1702 can be implemented without large resistors, capacitors, or inductors. Also, UDF module 1702 does not require that tight tolerances be maintained on the values of its individual components, i.e., its resistors, capacitors, inductors, etc. As a result, the architecture of UDF module 1702 is friendly to integrated circuit design techniques and processes.

The features and advantages exhibited by UDF module 1702 are achieved at least in part by adopting a new technological paradigm with respect to frequency selectivity and translation. Specifically, according to the present invention, UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19:
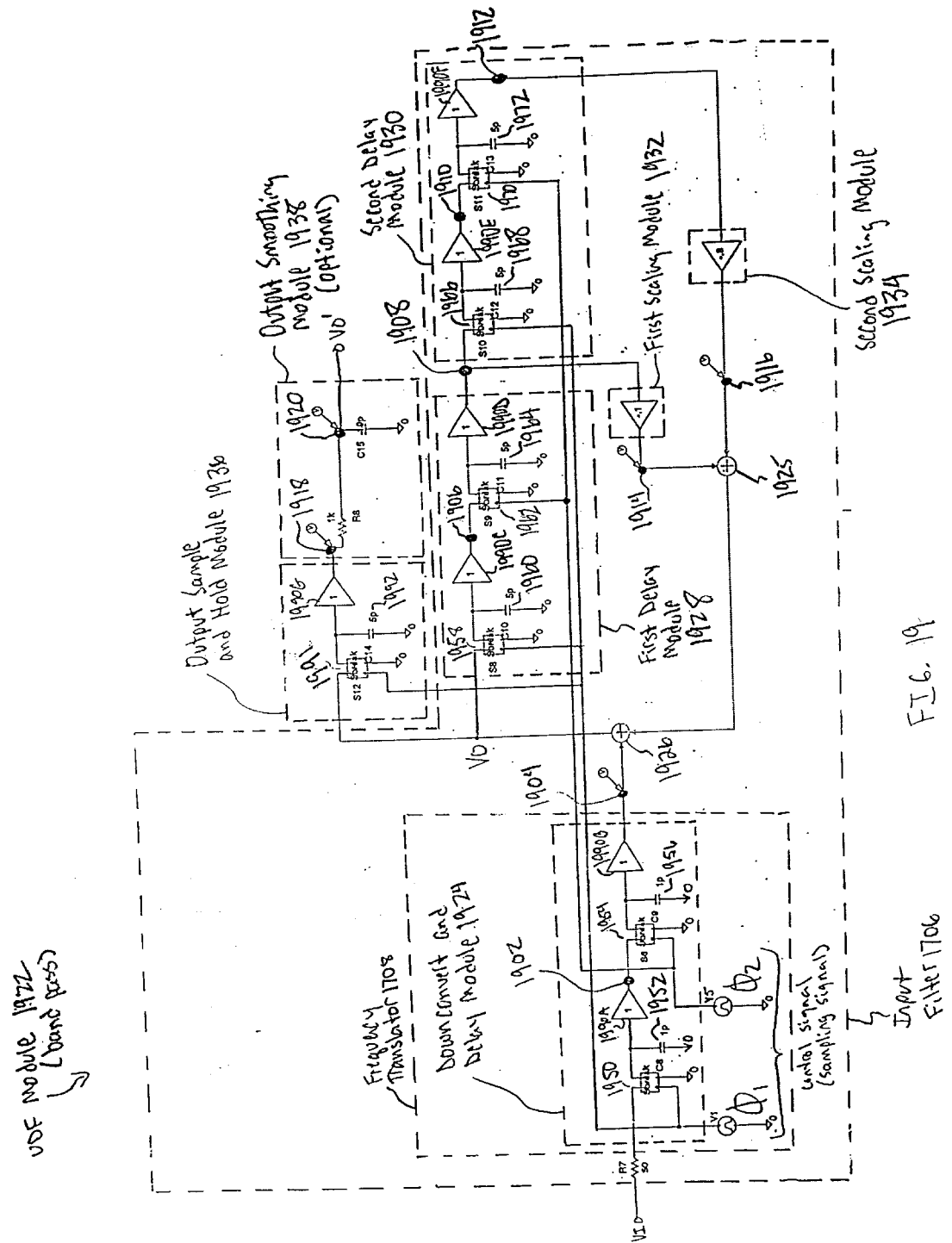
FIG. 19 is a detailed diagram of an exemplary UDF module according to an embodiment of the invention.

FIG. 19 illustrates an exemplary implementation of a unified down-converting and filtering (UDF) module 1922. UDF module 1922 performs the frequency translation operation and the frequency selectivity operation in an integrated, unified manner as described above, and as further described below.

In the example of FIG. 19, the frequency selectivity operation performed by UDF module 1922 comprises a band-pass filtering operation according to EQ. 1, below, which is an exemplary representation of a band-pass filtering transfer function.

$$VO = \alpha_1 z^{-1} VI - \beta_1 z^{-1} VO - \beta_0 z^{-2} VO \qquad \text{EQ. 1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ. 1 is referred to herein for illustrative purposes only, and is not limiting.

UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, output smoothing module 1938 is optional.

As further described below, in the example of FIG. 19, down-convert and delay module 1924 and first and second delay modules 1928 and 1930 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 19, it is assumed that $\alpha_1$ is equal to one. Thus, the output of down-convert and delay module 1924 is not scaled. As evident from the embodiments described above, however, the invention is not limited to this example.

Exemplary UDF module 1922 has a filter center frequency of 900.2 MHz and a filter bandwidth of 570 KHz. The pass band of the UDF module 1922 is on the order of 899.915 MHz to 900.485 MHz. The Q factor of UDF module 1922 is approximately 1879 (i.e., 900.2 MHz divided by 570 KHz).

The operation of UDF module 1922 shall now be described with reference to a Table 1802 (FIG. 18) that indicates exemplary values at nodes in UDF module 1922 at a number of consecutive time increments. It is assumed in Table 1802 that UDF module 1922 begins operating at time t−1. As indicated below, UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 in down-convert and delay module 1924 closes. This allows a capacitor 1952 to charge to the current value of an input signal, $VI_{t-1}$, such that node 1902 is at $VI_{t-1}$. This is indicated by cell 1804 in FIG. 18. In effect, the combination of switch 1950 and capacitor 1952 in down-convert and delay module 1924 operates to translate the frequency of the input signal VI to a desired lower frequency, such as IF or baseband. Thus, the value stored in capacitor 1952 represents an instance of a down-converted image of the input signal VI.

The manner in which down-convert and delay module 1924 performs frequency down-conversion is further described elsewhere in this application, and is additionally described in pending U.S. application "Method and System for Down-Converting Electromagnetic Signals," Ser. No. 09/176,022, filed Oct. 21, 1998, which is herein incorporated by reference in its entirety.

Also at the rising edge of $\phi_1$ at time t−1, a switch 1958 in first delay module 1928 closes, allowing a capacitor 1960 to charge to $VO_{t-1}$, such that node 1906 is at $VO_{t-1}$. This is indicated by cell 1806 in Table 1802. (In practice, $VO_{t-1}$ is undefined at this point. However, for ease of understanding, $VO_{t-1}$ shall continue to be used for purposes of explanation.)

Also at the rising edge of $\phi_1$ at time t−1, a switch 1966 in second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\phi_2$ at time t−1, a switch 1954 in down-convert and delay module 1924 closes, allowing a capacitor 1956 to charge to the level of capacitor 1952. Accordingly, capacitor 1956 charges to $VI_{t-1}$, such that node 1904 is at $VI_{t-1}$. This is indicated by cell 1810 in Table 1802.

UDF module 1922 may optionally include a unity gain module 1990A between capacitors 1952 and 1956. Unity gain module 1990A operates as a current source to enable capacitor 1956 to charge without draining the charge from capacitor 1952. For a similar reason, UDF module 1922 may include other unity gain modules 1990B–1990G. It should be understood that, for many embodiments and applications of the invention, unity gain modules 1990A–1990G are optional. The structure and operation of unity gain modules 1990 will be apparent to persons skilled in the relevant art(s).

Also at the rising edge of $\phi_2$ at time t−1, a switch 1962 in first delay module 1928 closes, allowing a capacitor 1964 to charge to the level of capacitor 1960. Accordingly, capacitor 1964 charges to $VO_{t-1}$, such that node 1908 is at $VO_{t-1}$. This is indicated by cell 1814 in Table 1802.

Also at the rising edge of $\phi_2$ at time t−1, a switch 1970 in second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, switch 1950 in down-convert and delay module 1924 closes. This allows capacitor 1952 to charge to $VI_t$, such that node 1902 is at $VI_t$. This is indicated in cell 1816 of Table 1802.

Also at the rising edge of at time t, switch 1958 in first delay module 1928 closes, thereby allowing capacitor 1960 to charge to $VO_t$. Accordingly, node 1906 is at $VO_t$. This is indicated in cell 1820 in Table 1802.

Further at the rising edge of $\phi_1$ at time t, switch 1966 in second delay module 1930 closes, allowing a capacitor 1968 to charge to the level of capacitor 1964. Therefore, capacitor 1968 charges to $VO_{t-1}$, such that node 1910 is at $VO_{t-1}$. This is indicated by cell 1824 in Table 1802.

At the rising edge of $\phi_2$ at time t, switch 1954 in down-convert and delay module 1924 closes, allowing capacitor 1956 to charge to the level of capacitor 1952. Accordingly, capacitor 1956 charges to $VI_t$, such that node 1904 is at $VI_t$. This is indicated by cell 1828 in Table 1802.

Also at the rising edge of $\phi_2$ at time t, switch 1962 in first delay module 1928 closes, allowing capacitor 1964 to charge to the level in capacitor 1960. Therefore, capacitor 1964 charges to $VO_t$, such that node 1908 is at $VO_t$. This is indicated by cell 1832 in Table 1802.

Further at the rising edge of $\phi_2$ at time t, switch 1970 in second delay module 1930 closes, allowing capacitor 1972 in second delay module 1930 to charge to the level of capacitor 1968 in second delay module 1930. Therefore, capacitor 1972 charges to $VO_{t-1}$, such that node 1912 is at $VO_{t-1}$. This is indicated in cell 1836 of FIG. 18.

At time t+1, at the rising edge of $\phi_1$, switch 1950 in down-convert and delay module 1924 closes, allowing capacitor 1952 to charge to $V_{t+1}$. Therefore, node 1902 is at $VI_{t+1}$, as indicated by cell 1838 of Table 1802.

Also at the rising edge of $\phi_1$ at time t+1, switch 1958 in first delay module 1928 closes, allowing capacitor 1960 to charge to $VO_{t+1}$. Accordingly, node 1906 is at $VO_{t+1}$, as indicated by cell 1842 in Table 1802.

Further at the rising edge of $\phi_1$ at time t+1, switch 1966 in second delay module 1930 closes, allowing capacitor 1968 to charge to the level of capacitor 1964. Accordingly, capacitor 1968 charges to $VO_t$, as indicated by cell 1846 of Table 1802.

In the example of FIG. 19, first scaling module 1932 scales the value at node 1908 (i.e., the output of first delay module 1928) by a scaling factor of −0.1. Accordingly, the value present at node 1914 at time t+1 is $-0.1*VO_t$. Similarly, second scaling module 1934 scales the value present at node 1912 (i.e., the output of second scaling module 1930) by a scaling factor of −0.8. Accordingly, the value present at node 1916 is $-0.8*VO_{t-1}$ at time t+1.

At time t+1, the values at the inputs of summer 1926 are: $VI_t$ at node 1904, $-0.1*VO_t$ at node 1914, and $-0.8*VO_{t-1}$ at node 1916 (in the example of FIG. 19, the values at nodes 1914 and 1916 are summed by a second summer 1925, and this sum is presented to summer 1926). Accordingly, at time t+1, the summer generates a signal equal to $VI_t-0.1*VO_t-0.8*VO_{t-1}$.

At the rising edge of $\phi_1$ at time t+1, a switch 1991 in the output sample and hold module 1936 closes, thereby allowing a capacitor 1992 to charge to $VO_{t+1}$. Accordingly, capacitor 1992 charges to $VO_{t-1}$, which is equal to the sum generated by summer 1926. As just noted, this value is equal to: $VI_t-0.1*VO_t-0.8*VO_{t-1}$. This is indicated in cell 1850 of Table 1802. This value is presented to optional output smoothing module 1938, which smooths the signal to thereby generate the instance of the output signal $VO_{t+1}$. It is apparent from inspection that this value of $VO_{t+1}$ is consistent with the band pass filter transfer function of EQ. 1.

Further details of unified down-conversion and filtering as described in this section are presented in pending U.S. application "Integrated Frequency Translation And Selectivity," Ser. No. 09/175,966, filed Oct. 21, 1998, incorporated herein by reference in its entirety.

6. Exemplary Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Exemplary applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these exemplary applications. Additional applications of the UFT module will be apparent to persons skilled in the relevant art(s), based on the teachings contained herein.

Figure 7:
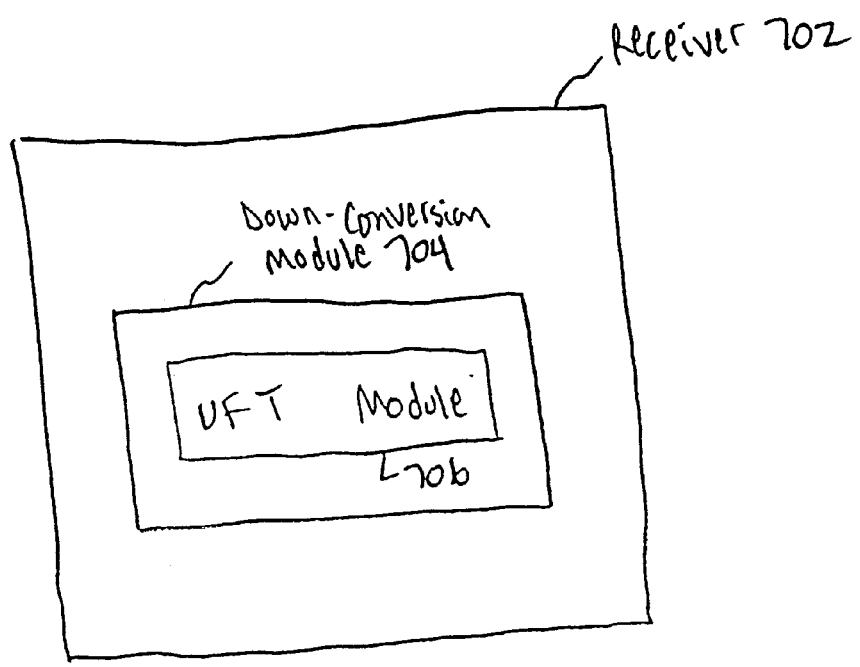
FIG. 7 illustrates a UFT module used in a receiver according to an embodiment of the invention.

For example, the present invention can be used in applications that involve frequency down-conversion. This is shown in FIG. 1C, for example, where an exemplary UFT module 115 is used in a down-conversion module 114. In this capacity, UFT module 115 frequency down-converts an input signal to an output signal. This is also shown in FIG. 7, for example, where an exemplary UFT module 706 is part of a down-conversion module 704, which is part of a receiver 702.

Figure 8:
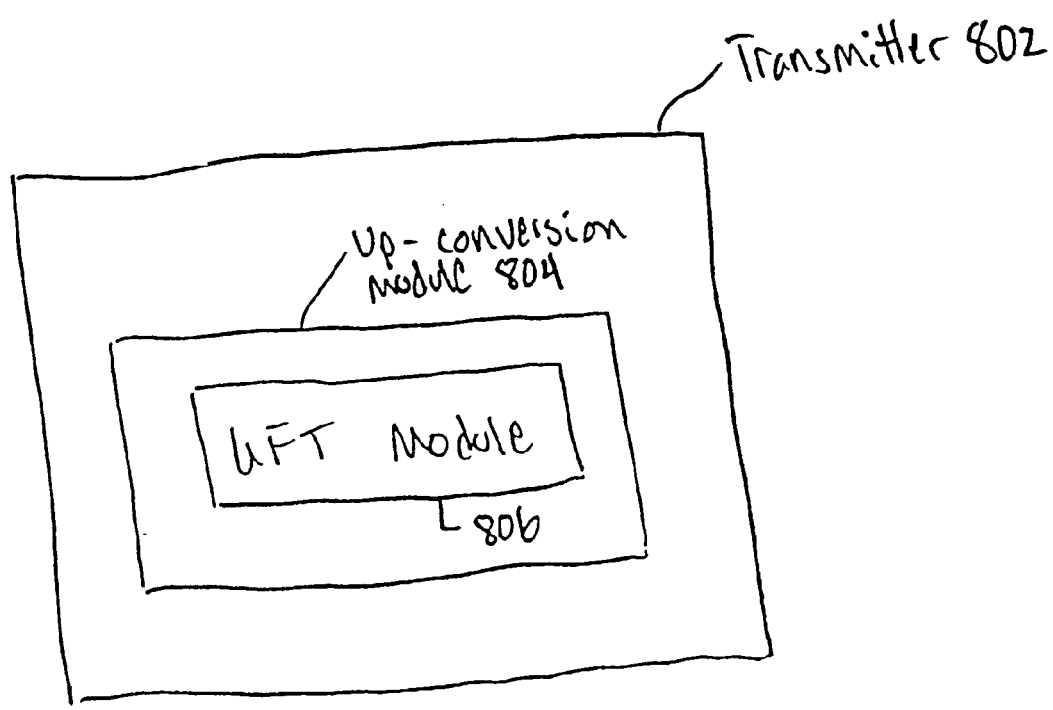
FIG. 8 illustrates a UFT module used in a transmitter according to an embodiment of the invention.

The present invention can be used in applications that involve frequency up-conversion. This is shown in FIG. 1D, for example, where an exemplary UFT module 117 is used in a frequency up-conversion module 116. In this capacity, UFT module 117 frequency up-converts an input signal to an output signal. This is also shown in FIG. 8, for example, where an exemplary UFT module 806 is part of up-conversion module 804, which is part of a transmitter 802.

Figure 9:
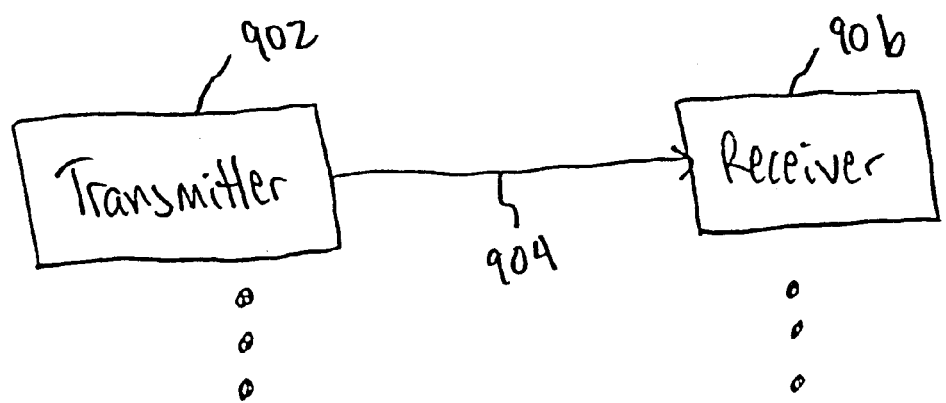
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more transmitters 902 may be implemented using a UFT module, as shown for example in FIG. 8. Also, one or more receivers 906 may be implemented using a UFT module, as shown for example in FIG. 7.

Figure 10:
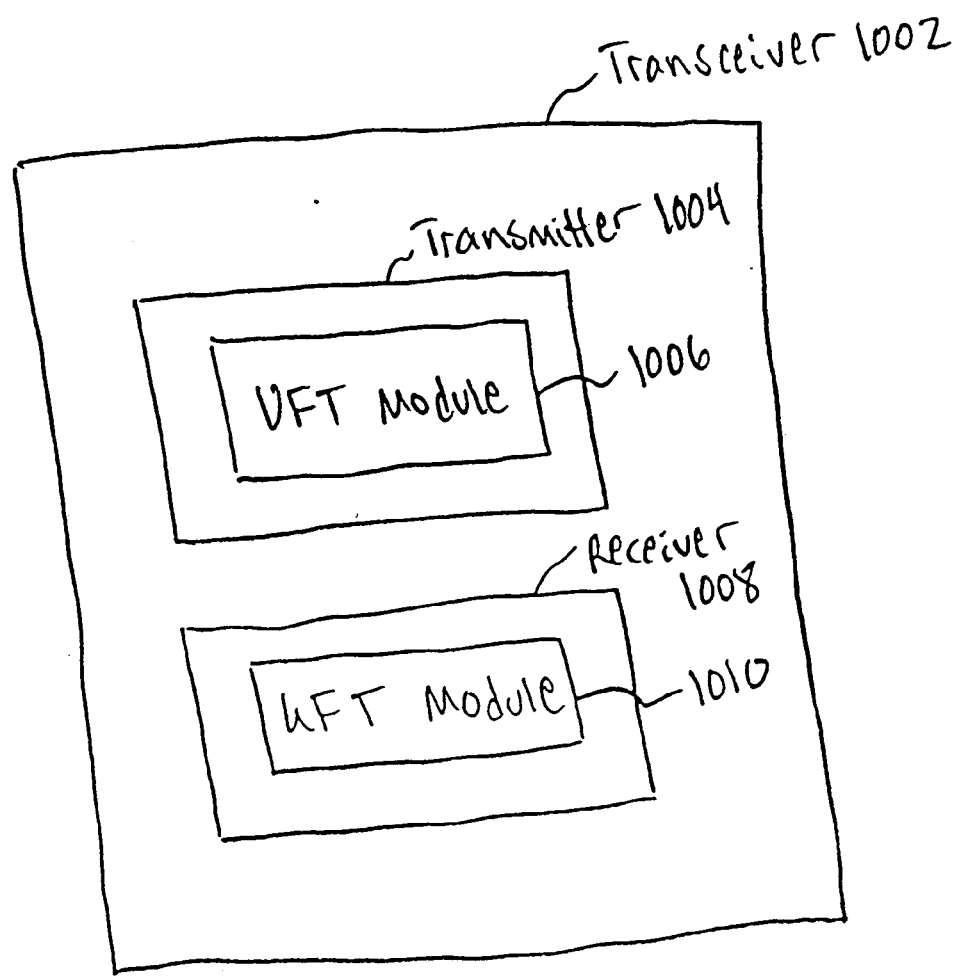
FIG. 10 illustrates a transceiver according to an embodiment of the invention.

The invention can be used to implement a transceiver. An exemplary transceiver 1002 is illustrated in FIG. 10. Transceiver 1002 includes a transmitter 1004 and a receiver 1008. Either transmitter 1004 or receiver 1008 can be implemented using a UFT module. Alternatively, transmitter 1004 can be implemented using a UFT module 1006, and receiver 1008 can be implemented using a UFT module 1010. This embodiment is shown in FIG. 10.

Figure 11:
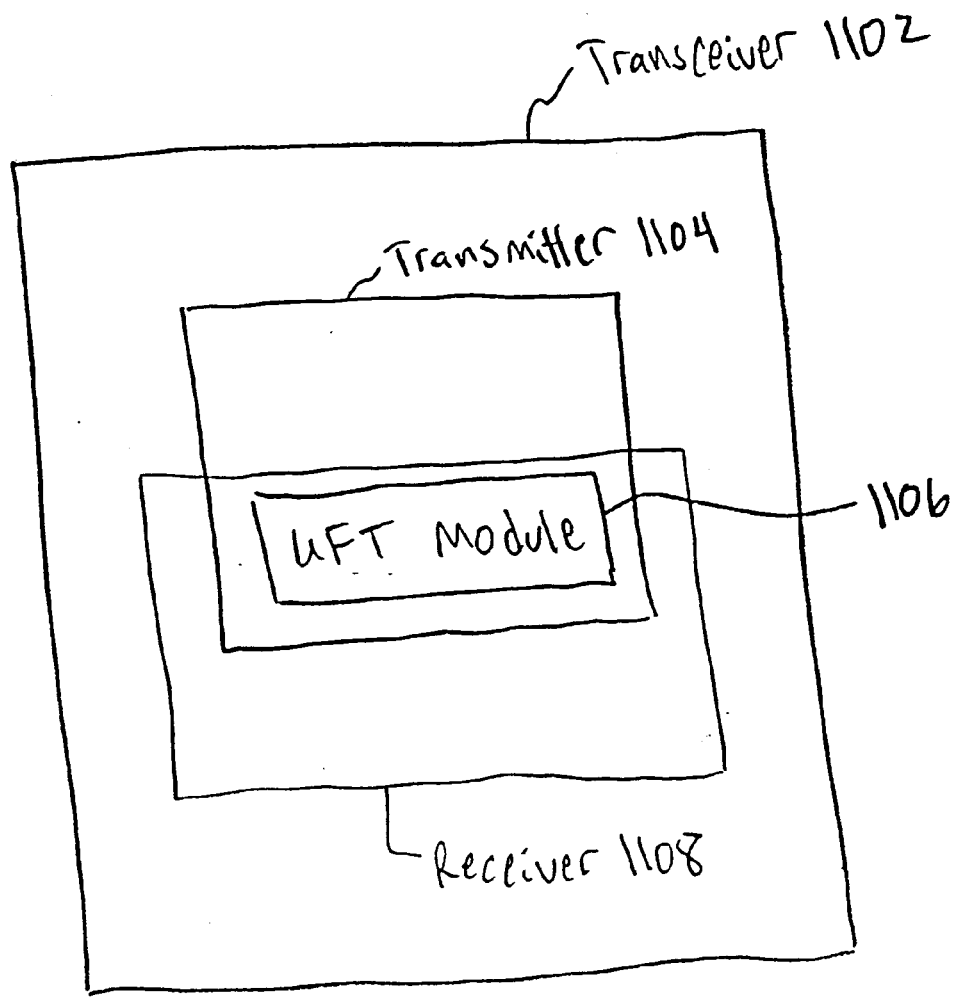
FIG. 11 illustrates a transceiver according to an alternative embodiment of the invention.

Another transceiver embodiment according to the invention is shown in FIG. 11. In this transceiver 1102, transmitter 1104 and receiver 1108 are implemented using a single UFT module 1106. In other words, transmitter 1104 and receiver 1108 share a UFT module 1106.

Figure 12:
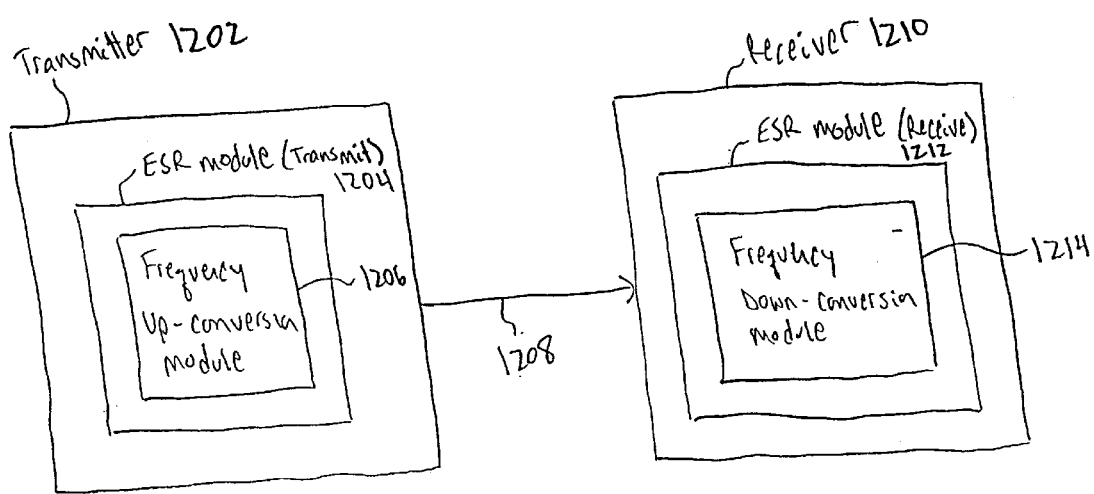
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) 1204 in a transmitter 1202, and an ESR module (receive) 1212 in a receiver 1210. An exemplary ESR embodiment configured in this manner is illustrated in FIG. 12.

ESR module (transmit) 1204 includes a frequency up-conversion module 1206. Some embodiments of frequency up-conversion module 1206 may be implemented using a UFT module, such as that shown in FIG. 1D.

ESR module (receive) 1212 includes a frequency down-conversion module 1214. Some embodiments of frequency down-conversion module 1214 may be implemented using a UFT module, such as that shown in FIG. 1C.

Figure 13:
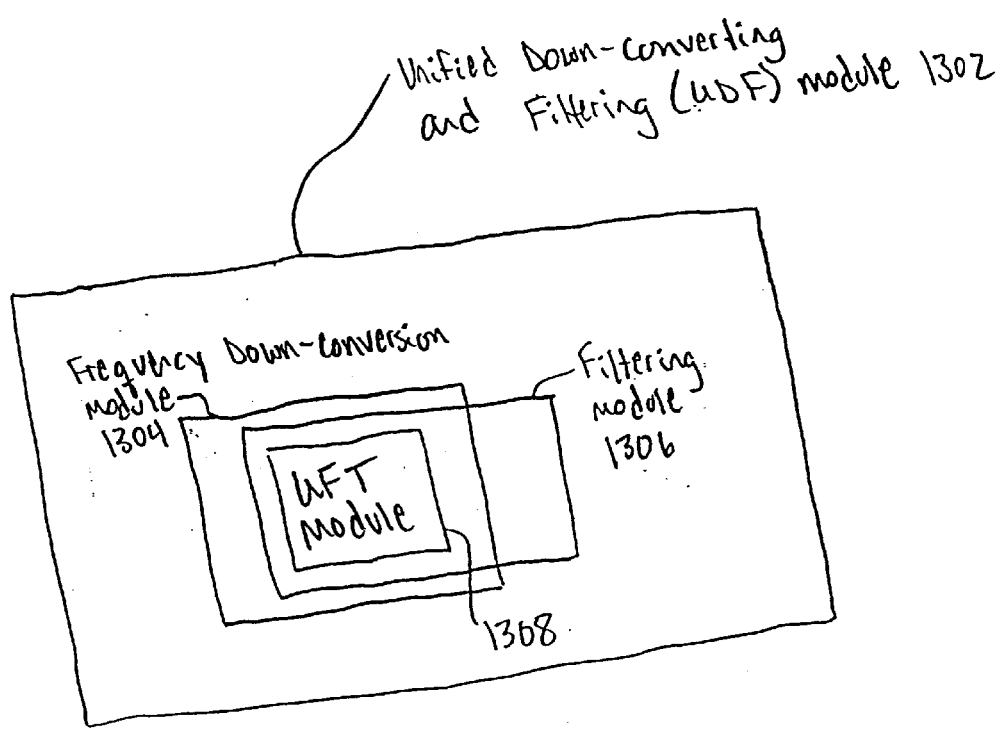
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An exemplary unified down-conversion and filtering module 1302 is illustrated in FIG. 13. Unified down-conversion and filtering module 1302 includes a frequency down-conversion module 1304 and a filtering module 1306. According to the invention, frequency down-conversion module 1304 and filtering module 1306 are implemented using a UFT module 1308, as indicated in FIG. 13.

Figure 15A:
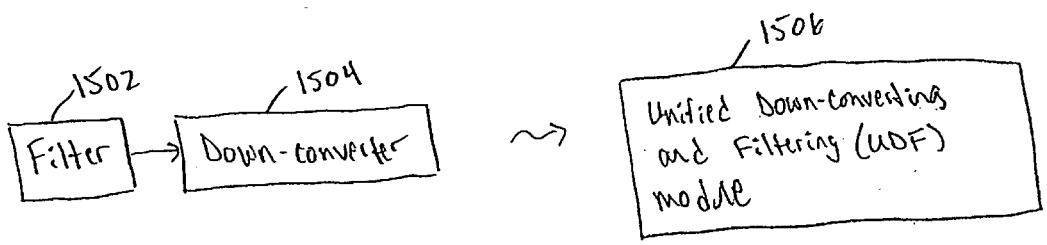
FIGS. 15A–15F illustrate exemplary applications of the UDF module according to embodiments of the invention.
Figure 15B:
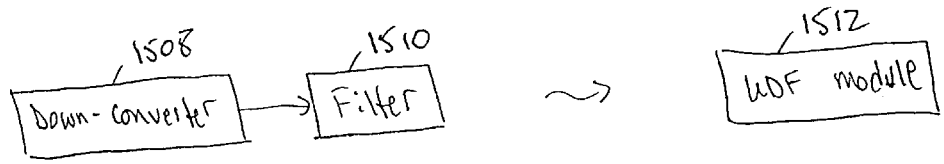
Figure 15C:
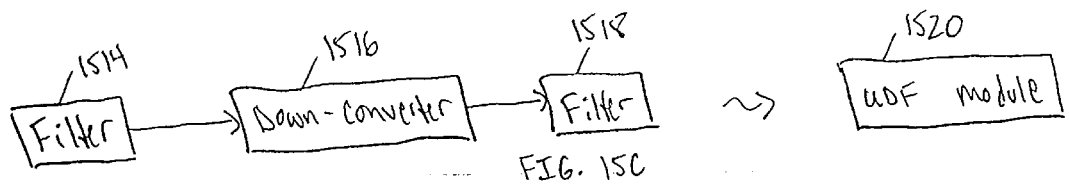
Figure 15D:
Figure 15E:
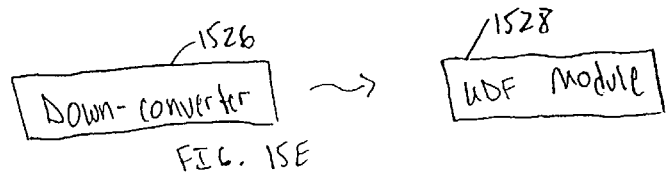
Figure 15F:
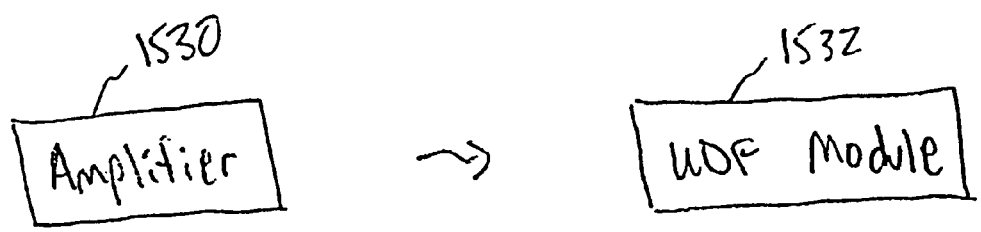

Unified down-conversion and filtering according to the invention is useful in applications involving filtering and/or frequency down-conversion. This is depicted, for example, in FIGS. 15A–15F. FIGS. 15A–15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be used as a filter 1522 (i.e., where the extent of frequency down-conversion by the down-converter in unified down-conversion and filtering module 1524 is minimized). FIG. 15E indicates that a unified down-conversion and filtering module 1528 according to the invention can be used as a down-converter 1526 (i.e., where the filter in unified down-conversion and filtering module 1528 passes substantially all frequencies). FIG. 15F illustrates that unified down-conversion and filtering module 1532 can be used as an amplifier. It is noted that one or more UDF modules can be used in applications that involve at least one or more of filtering, frequency translation, and amplification.

Figure 14:
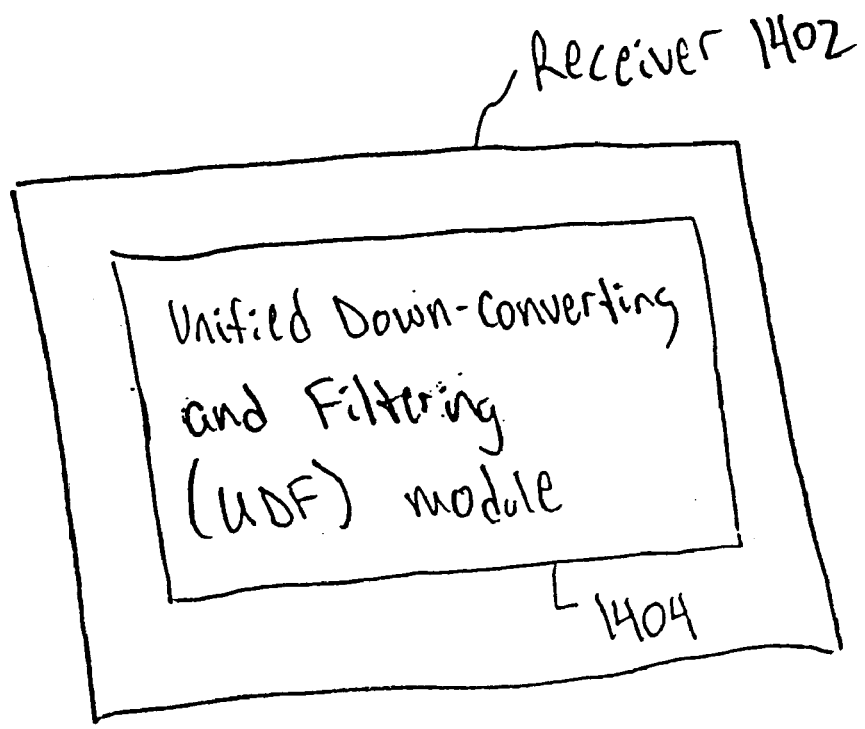
FIG. 14 illustrates an exemplary receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
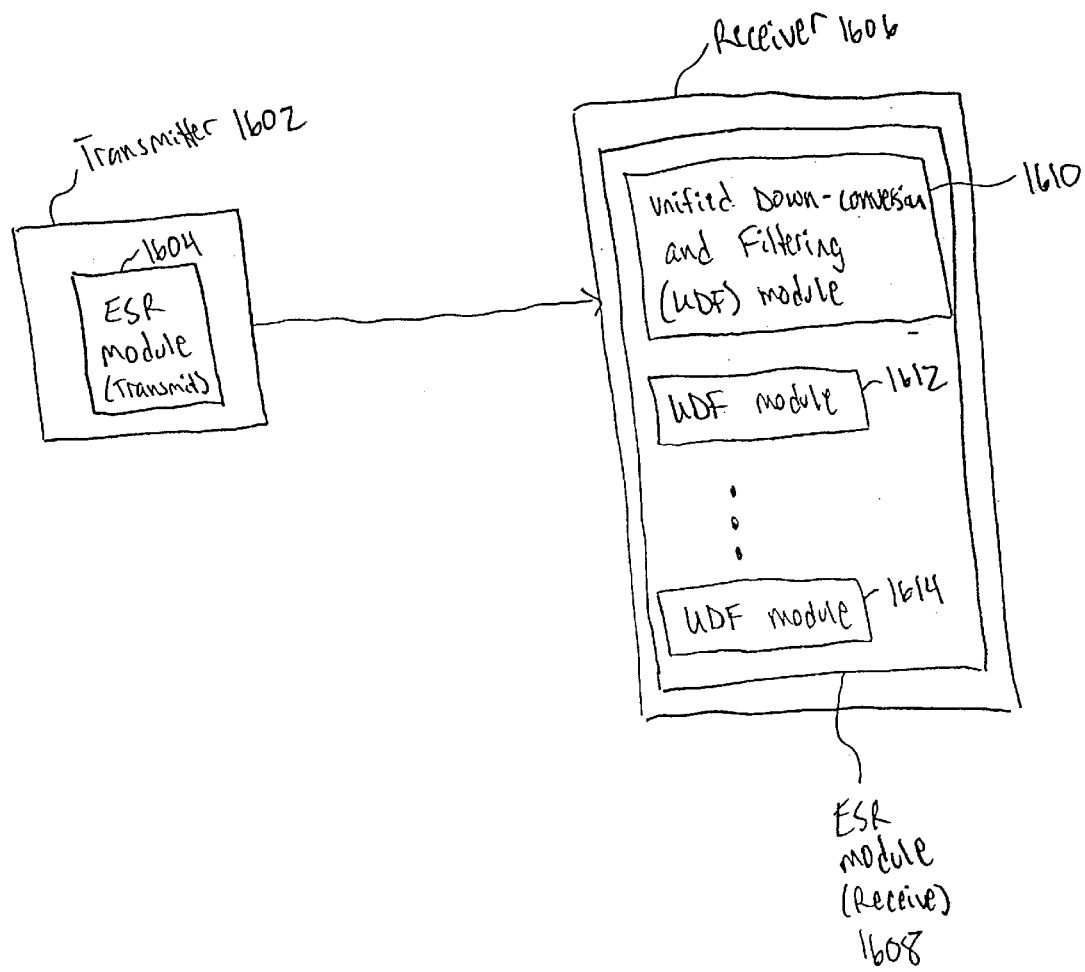
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectra. The ESR module (receive) also operates to isolate the spectra in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of UDF modules 1610, 1612, 1614 operates to down-convert a received signal. UDF modules 1610, 1612, 1614 also operate to filter the down-converted signal so as to isolate the spectrum or spectra contained therein. As noted above, UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the exemplary applications of the UFT module discussed herein. Also, the invention is not limited to the exemplary combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional exemplary applications are described below.

7. Automated Meter Reading (AMR)

The present invention can be implemented in a wireless meter reading system, also referred to herein as an automated meter reading (AMR) system. The invention is directed to AMR systems.

Figure 25:
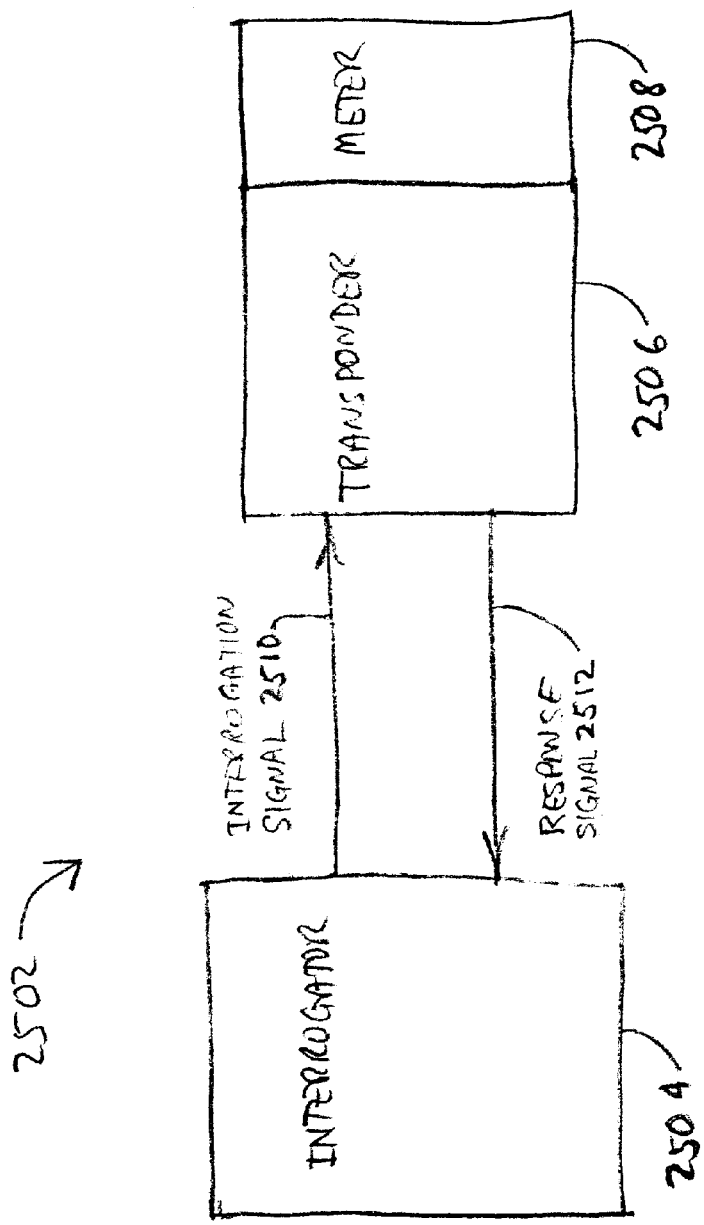
FIG. 25 illustrates an example of an Automated Meter Reading System.

FIG. 25 illustrates an exemplary AMR system 2502, including an interrogator 2504 and a transponder 2506 coupled to a meter 2508. Meter 2508 can be any conventional meter, such as, for example and not meant to be limiting, those used for measuring consumption of water, natural gas, electricity, etc. Multiple transponders 2506 can each be assigned a unique identification number to allow a single interrogator 2504 to specifically target its interrogation to a single transponder 2506 among a plurality of transponders.

In an embodiment, interrogator 2504 transmits an interrogation signal 2510 to transponder 2506. Interrogation signal 2510 typically is a high frequency carrier signal modulated with an information signal. In a typical interrogation, interrogation signal 2510 contains various information such as, but without limitation, synchronization bits, command instruction bits, and transponder identification bits relating to the serial number of the transponder from which meter data is requested.

Transponder 2506 receives, down-converts, and demodulates interrogation signal 2510, preferably using one or more of the aliasing, non-heterodyning techniques described above and/or described in one or more of the co-pending U.S. Patent applications referenced above, which are incorporated herein by reference in their entireties. Alternatively, down-conversion and/or demodulation could be achieved using any well known technique. In an exemplary embodiment, transponder 2506 down-converts interrogation signal 2510 to an intermediate frequency (IF) signal, which is then fed through a data detector to demodulate the information from the IF carrier signal. Transponder 2506 then processes the demodulated information signal. This processing can include, without limitation, synchronizing, command decoding and execution, identifier validation, meter reading, power management, and message reply generation.

In an alternative embodiment, transponder 2506 directly down-converts interrogation signal 2510 to a demodulated baseband information signal for processing by the baseband processors.

Transponder 2506 also modulates, up-converts and transmits a response signal 2512 to interrogator 2504. The data in response signal 2512 can include, without limitation, status and/or meter reading information. Modulation and up-conversion are preferably performed in accordance with the present invention, as described above and/or as described in one or more of the co-pending U.S. Patent applications referenced above, which are incorporated herein by reference in their entireties. Alternatively, modulation and/or up-conversion could be achieved using any well known technique.

The present invention includes methods and systems for employing direct down-conversion and/or direct up-conversion techniques in AMR system 2502.

It is noted that this interrogator/response protocol is described herein for purposes of convenience only. The invention is applicable to other protocols, which will be apparent to persons skilled in the relevant art(s) based on the teachings contained herein. Such alternative protocols include, but are not limited to, time slot protocols wherein the transponders transmit status/meter/etc. information in assigned time slots, ring-type protocols, etc.

7.1 Method of Operation

A method for receiving, down-converting, demodulating, and processing interrogation signal 2510 (referred to generally herein as receiving), at transponder 2506, is now described. A method for modulating, up-converting and transmitting response signal 2512 back to interrogator 2504 (referred to generally herein as transmitting), by transponder 2506, is provided below. The methods for receiving and transmitting can be implemented alone or in combination with one another.

The methods described below can be implemented in a variety of ways. Implementation details can be tailored for specific needs or desired features. Exemplary implementation details are provided below. However, the present invention is not limited to the exemplary implementation details.

7.1.1 Method for Receiving Interrogation Signals

Figure 26A:
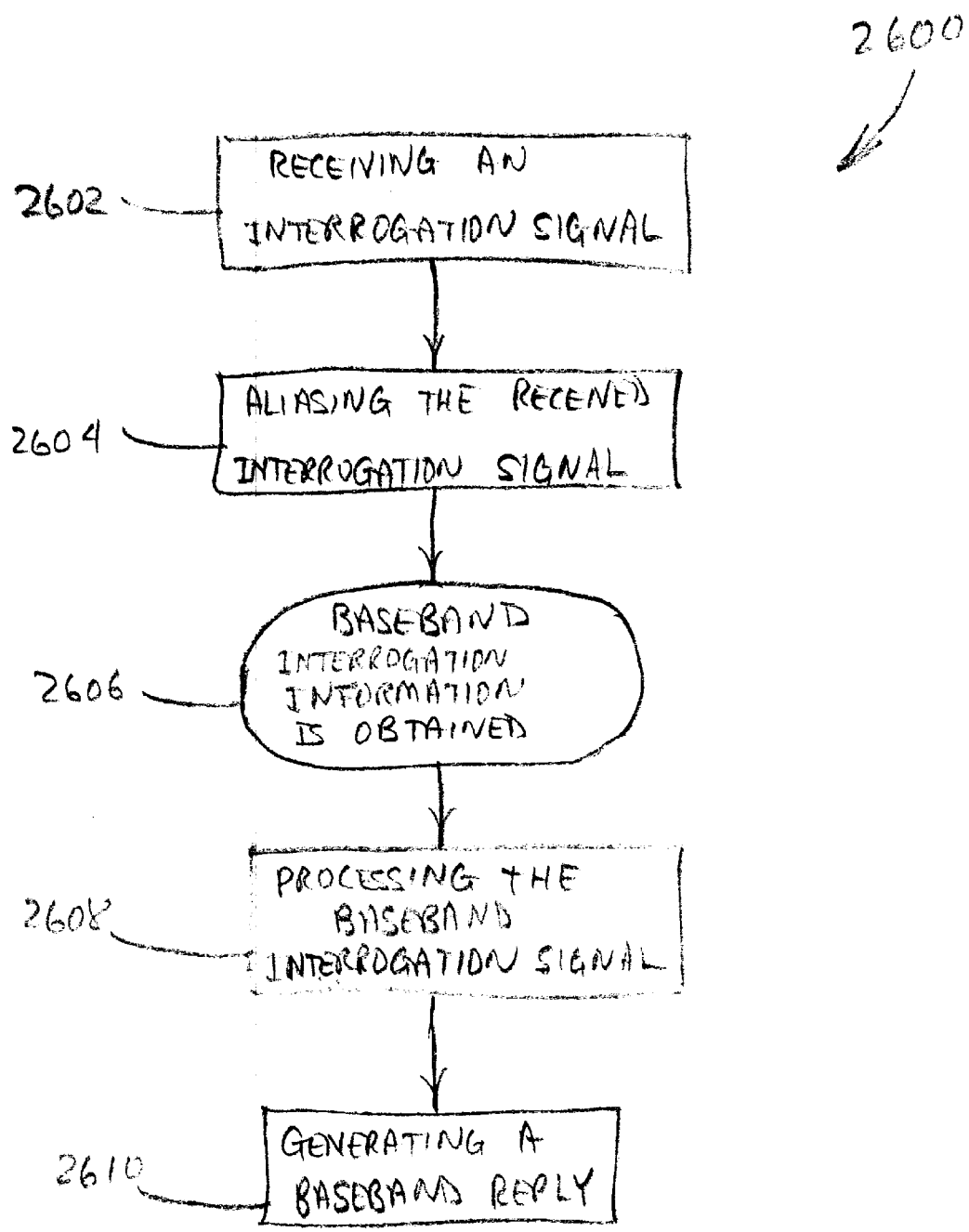
FIG. 26A is a flowchart illustrating a first implementation method for receiving and processing an interrogation signal.

FIG. 26A is a process flowchart 2600 illustrating a first implementation method for receiving and processing interrogation signal 2510 of FIG. 25. FIG. 26B is a process flowchart 2601 illustrating a second implementation method for receiving and processing interrogation signal 2510. In the first implementation method, illustrated by flowchart 2600, interrogation signal 2510 is down-converted to a baseband signal. In the second implementation method, illustrated by flowchart 2601, interrogation signal 2510 is down-converted to an intermediate frequency (IF) signal before being down-converted to a baseband signal.

Looking now to the first implementation method illustrated by flowchart 2600 in FIG. 26A, step 2602 includes receiving an interrogation signal. In step 2604, the received interrogation signal is aliased in accordance with the method described above in Section 2 and/or described in the co-pending patent applications referenced above, which are incorporated herein by reference in their entireties. A baseband interrogation information signal is obtained, as shown in result 2606, and is processed as shown in step 2608. Processing can include, without limitation, decoding, synchronization, transponder identification number verification, instruction reading, etc. Processing can also include performing one or more functions, which can be performed in response to one or more instructions and/or information received from interrogator 2502. The receiving process is completed in step 2610 by generating a baseband reply. A reply message can include a meter reading, an acknowledgment that a function was properly performed, etc. A reply message can also include a meter identification number. A reply message can be generated in direct or indirect response to a an instruction received from interrogator 2502. Step 2610 may also be considered to be the initial step in the transmitting process.

The second implementation method is illustrated by flowchart 2601 in FIG. 26B. In step 2602, the interrogation signal is received, in the same manner as shown in flowchart

2600. In step 2612, the received interrogation signal is aliased at an offset frequency in accordance with the method described above in Section 2 and/or described in the co-pending patent applications referenced above, which are incorporated herein by reference in their entireties. An IF signal is obtained, as shown in result 2614. The IF signal is further down-converted in step 2616 and a baseband interrogation information signal is obtained, as shown in result 2606. The baseband signal is processed in step 2608 and a reply is generated in step 2610 in the same manner as shown in flowchart 2600.

Figure 35:
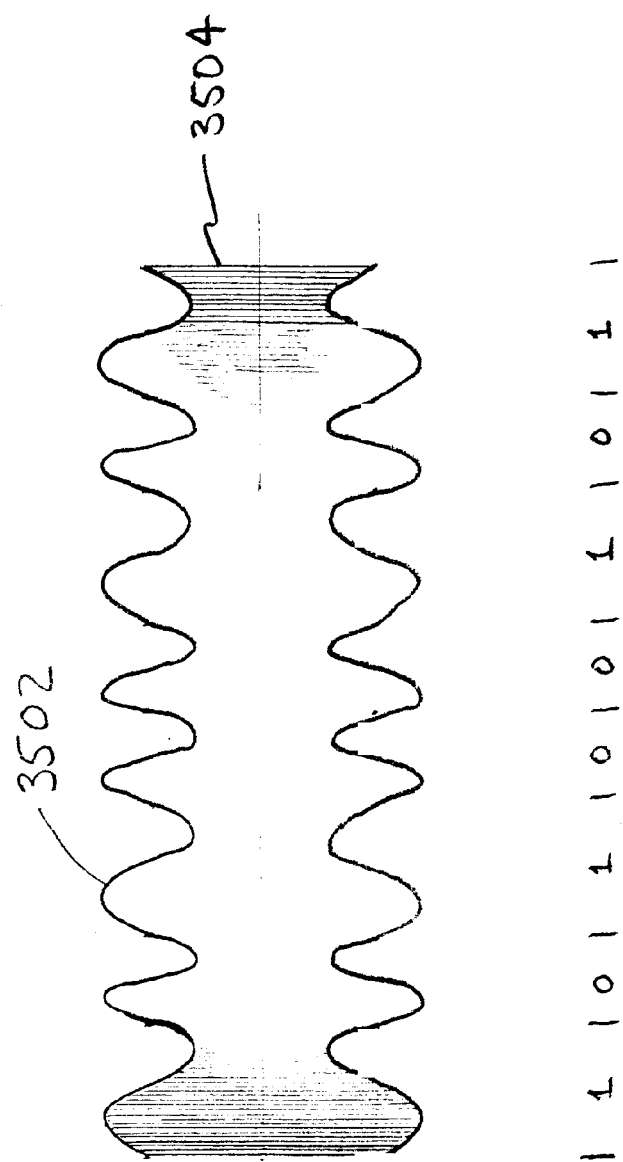
FIG. 35 illustrates a portion of an amplitude modulated interrogation signal.

By way of example, and not meant to be limiting, the interrogation signal can be amplitude modulated, frequency modulated, phase modulated, or any combination or modification thereof. Other modulation schemes are also envisioned by the invention. The information signal may be analog, digital, or a combination thereof. In an embodiment, the information signal is a digital signal and is encoded by varying the frequency of the carrier as a function of the information signal. A second embodiment is illustrated in FIGS. 34A–34C. In this exemplary embodiment, a digital information signal 3402 is illustrated in FIG. 34A. The encoding is accomplished by varying the duration of pulses representing the binary states of the encoded signal. For example, and not meant to be limiting, a shorter pulse (e.g., 300–400 microseconds), shown as a tone 3404 of FIG. 34B, represents a binary "0," and a longer pulse (e.g., 500–600 microseconds), shown as a tone 3406 of FIG. 34C, represents a binary "1." This string of pulses then amplitude modulates the carrier, which may, for example, have a frequency of approximately 450 MHz. FIG. 35 illustrates the amplitude modulated envelope 3502 of a portion of a carrier signal 3504.

In the implementation where the interrogation signal is down-converted to an IF signal (i.e., step 2612), the frequency of the IF signal (i.e., result 2614) might be, by way of illustration and not limitation, approximately 1.5 MHz. This IF signal can then be processed. In an example where the interrogation signal includes a digitally encoded information signal, step 2612 can include filtering tone 3404 from the IF signal. Thereafter, any activity on the filtered IF signal is indicative of the tone 3402 and a logic "1" can be output. Any non-activity on the filtered IF signal can be is indicative of tone 3404 and a logic "0" can be output. The logic ones and zeros represent a demodulated baseband information signal. Such a data detection process can be easily implemented with relatively inexpensive components.

7.1.2 Method for Transmitting Reply Messages

Figure 27:
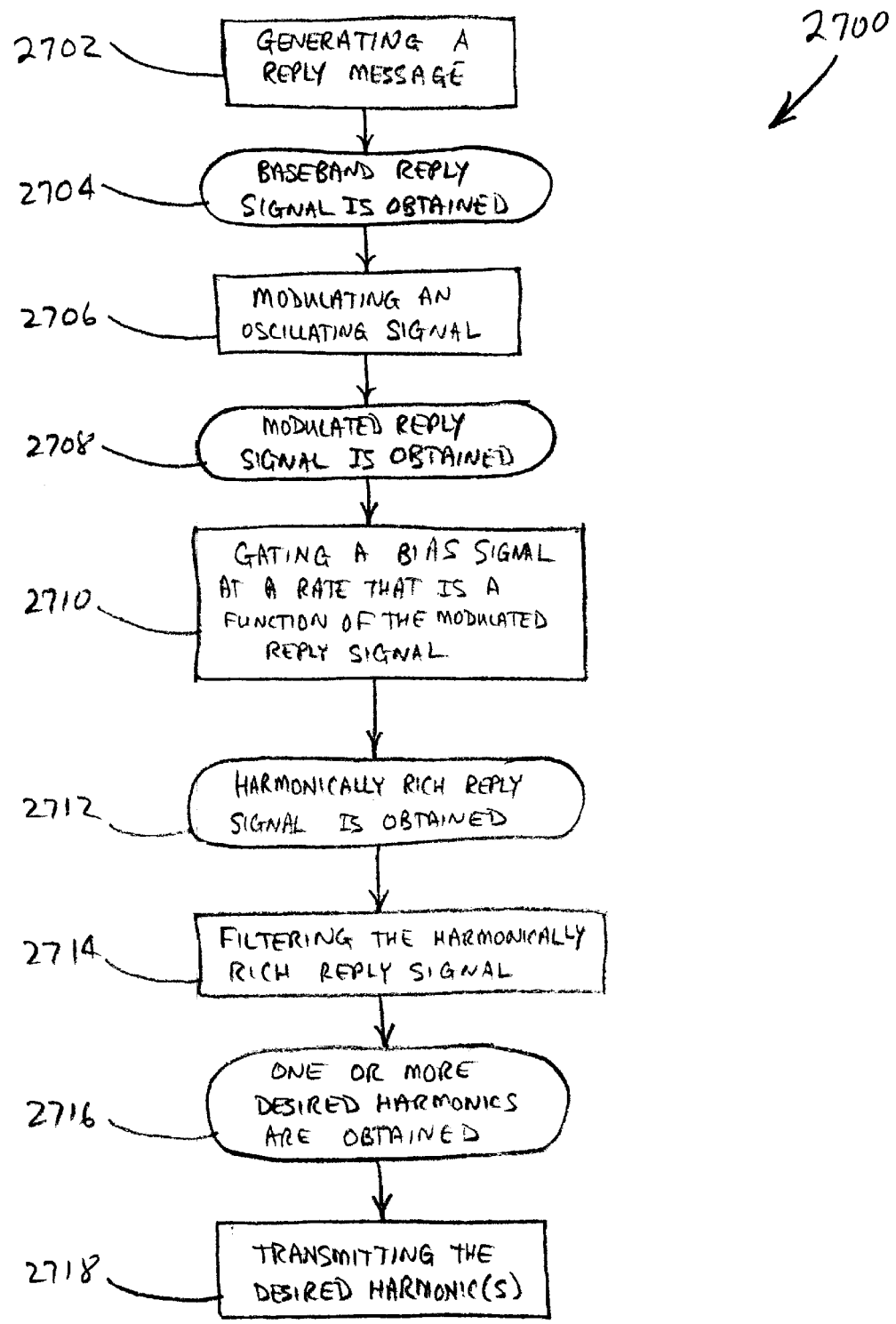
FIG. 27 is a flowchart illustrating a method for transmitting a reply message.

FIG. 27 is a process flowchart 2700 illustrating a method for transmitting a reply message. As stated above, the last step in the receiving method, step 2610, is generating a reply. In step 2702 of the transmitting method, a reply message is generated. This reply message is the baseband reply signal of result 2704. In an example, and not meant to be limiting, the baseband reply signal is a digital signal having a plurality of bits. In step 2706, the baseband reply signal modulates an oscillating signal, resulting in the modulated reply signal of result 2708. Any modulation scheme can be used. In an example, and not meant to be limiting, frequency modulation is used.

In step 2710, the modulated reply signal is preferably used to gate a bias signal at a rate that is a function of the frequency of the modulated reply signal. As a result of the gating step, a harmonically rich reply signal is obtained, as shown in result 2712. This harmonically rich signal is modulated substantially the same as modulated reply signal. The harmonically rich signal is filtered in step 2714 to isolate one or more desired harmonics, as shown in result 2716. The gating and filtering steps are accomplished in substantially the same manner as that described above in Section 3 and/or described in the co-pending patent applications referenced above, which are incorporated herein by reference in their entireties. In step 2718, the desired harmonic is transmitted as response signal 2512 of FIG. 25.

In an example, and not meant to be limiting, response signal 2512 may have a center frequency approximately equal to 415 MHz, and may be frequency modulated. Further, if the reply signal is a digital signal, the frequency modulation may be characterized as frequency shift keying (FSK), with response signal 2512 having two frequencies. The first frequency represents a digital "0" and may, for example, be approximately equal to 414.950 MHz. The second frequency represents a digital "1" and may, for example, be approximately equal to 415.050 MHz. This example is for illustrative purposes only, and is not meant to be limiting. Persons skilled in the relevant art(s) will understand, based on the teachings contained herein, that any number of frequencies and any types of modulations may be used and fall within the spirit and intent of the invention.

In an alternate embodiment, the bias signal is gated by an unmodulated oscillating signal. This creates an unmodulated harmonically rich signal, which is then filtered to obtain the desired harmonic is then modulated by the baseband reply signal. This results in modulated response signal 2512 of FIG. 25, which is then transmitted.

7.1.3 Method for Transmitting Interrogation Messages

Figure 54:
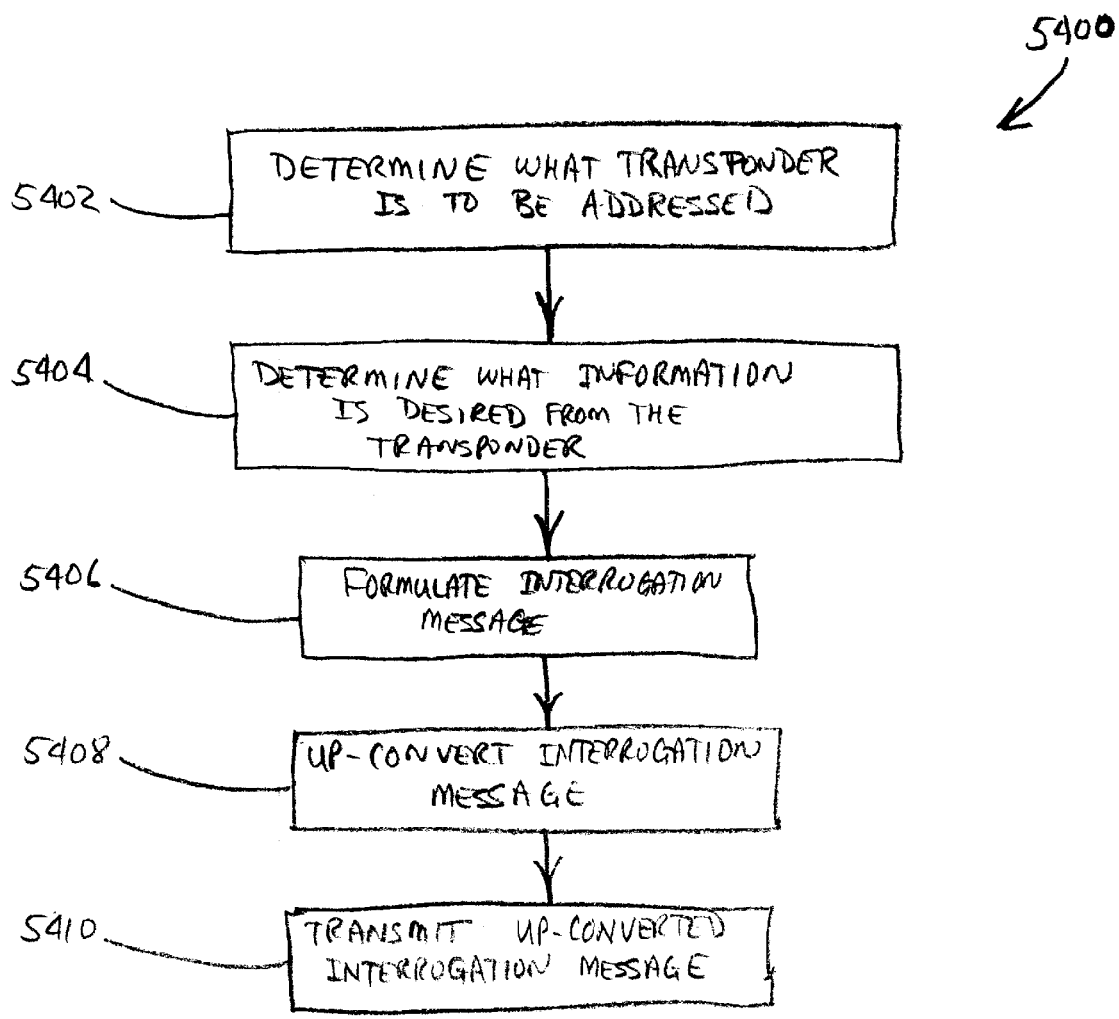
FIG. 54 is a flowchart illustrating a method for transmitting an interrogation message.

FIG. 54 is a flow chart 5400 illustrating an exemplary method for transmitting an interrogation message according to an embodiment of the present invention. In step 5402, a user determines what transponder is to be addressed. In one implementation, a single transponder is addressed; in a second implementation, all transponders are addressed; and in another implementation, some but not all transponders are addressed. These implementations are provided for purpose of illustration only, and are not meant to be limiting.

In step 5404, the user determines what information is desired from the transponder being addressed. Typically, as seen in FIG. 25, a transponder may be associated with a meter. In an alternate implementation, a transponder may be associated with more than one meter. In another implementation, the transponder may stand alone, and not be associated with any meter. These implementations are provided for purpose of illustration only, and are not meant to be limiting.

In step 5406, the interrogation message is formulated. In this step, certain bits of the message may be allocated to the specific transponder being addressed, certain other bits may be allocated to identify what information is desired, and certain other bits may be allocated to "overhead" functions, such as synchronization, timing, parity, etc. These bits are put together in a format that is in accordance with an accepted protocol. As an example, and not meant to be limiting, the formatted message may have the first 8 bits allocated to a synchronization word. The next 4 bits may be allocated to identifying what information is desired from the transponder. The next 32 bits may be allocated to the serial number of the transponder(s) being addressed arid/or the specific meter(s) from which information is desired. The next 16 bits may be allocated to a timing function which may, in one implementation, provide precise time to the addressed transponder. Finally, the last 16 bits may be allocated to parity bits that will facilitate error detection and correction. One skilled in the relevant art(s), based on the teachings contained herein, will appreciate that the actual content of an interrogation message, including the content of the message, the sequence of the bits, and the number of bits corresponding to each part of the message may vary.

In step 5408, the interrogation message is up-converted. The up-conversion of a digital information signal is described in detail in copending U.S. Patent application entitled "Method and System for Frequency Up-Conversion," Ser. No. 09/176,154, filed Oct. 21, 1998, which is incorporated herein by reference in its entirety.

In step 5410, the up-converted interrogation signal is transmitted. In an exemplary implementation, the transmission is a wireless broadcast. In another exemplary implementation, the transmission is via a cable. These exemplary implementations are provided for illustrative purposes, only, and are not meant to be limiting.

7.1.4 Method for Receiving Reply Messages

An interrogator receives the reply signal from one or more transponders. In an embodiment, the reply signal is down-converted directly to a baseband reply signal. This embodiment is illustrated by flowchart 5500 of FIG. 55A. In an alternate embodiment, the reply signal is down-converted to an intermediate frequency (IF) reply signal, and the IF reply signal is then down-converted to a baseband reply signal in a separate step. This embodiment is illustrated by flowchart 5501 of FIG. 55B. These embodiments are provided for illustrative purposes only, and those skilled in the relevant art(s) will appreciate that the invention encompasses other embodiments.

Figure 55A:
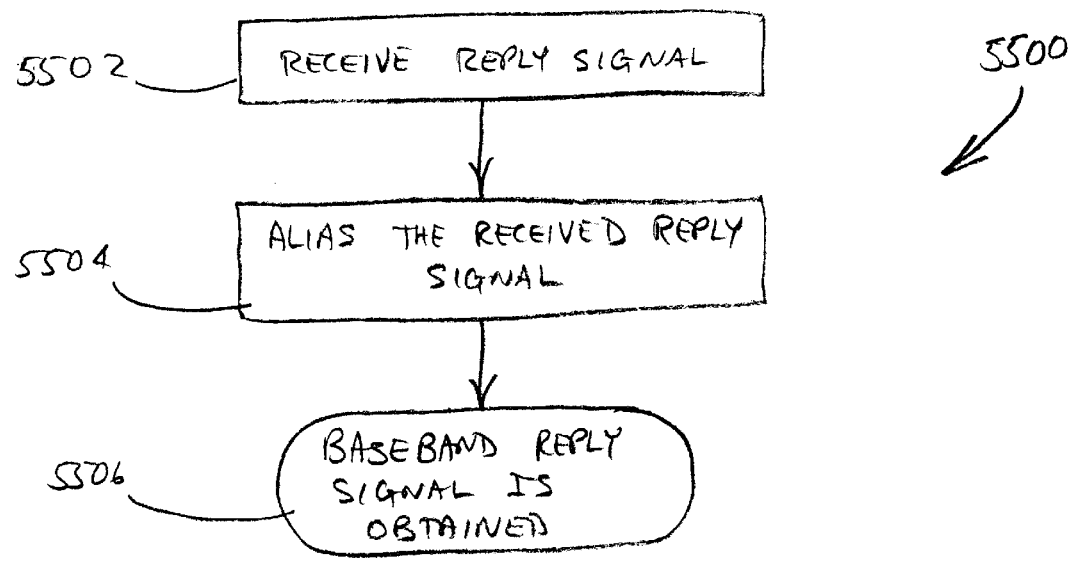
FIG. 55 is a flowchart illustrating a method for receiving a reply message.

Looking to FIG. 55A, in step 5502 the reply signal is received by the interrogator. This reply signal is generated by a transponder in accordance with the procedures described herein. The reply signal may be received from a wireless transmission, a transmission over a cable, or from any other transmission medium.

In step 5504, the received reply signal is aliased at a rate that is a harmonic or subharmonic of the frequency of the reply signal. The aliasing of a received signal at a rate that is a harmonic or A subharmonic of the frequency of the received signal is described in detail in copending U.S. Patent application entitled "Method and System for Down-Converting Electromagnetic Signals," Ser. No. 09/176,022, filed Oct. 21, 1998, which is incorporated herein by reference in its entirety.

The outcome of step 5504 is result 5506. Result 5506 is a baseband reply signal which is available for use in accordance with established procedures. These procedures may include, by way of example, and not meant to be limiting, preparing a bill for the use of the utility.

Figure 55B:
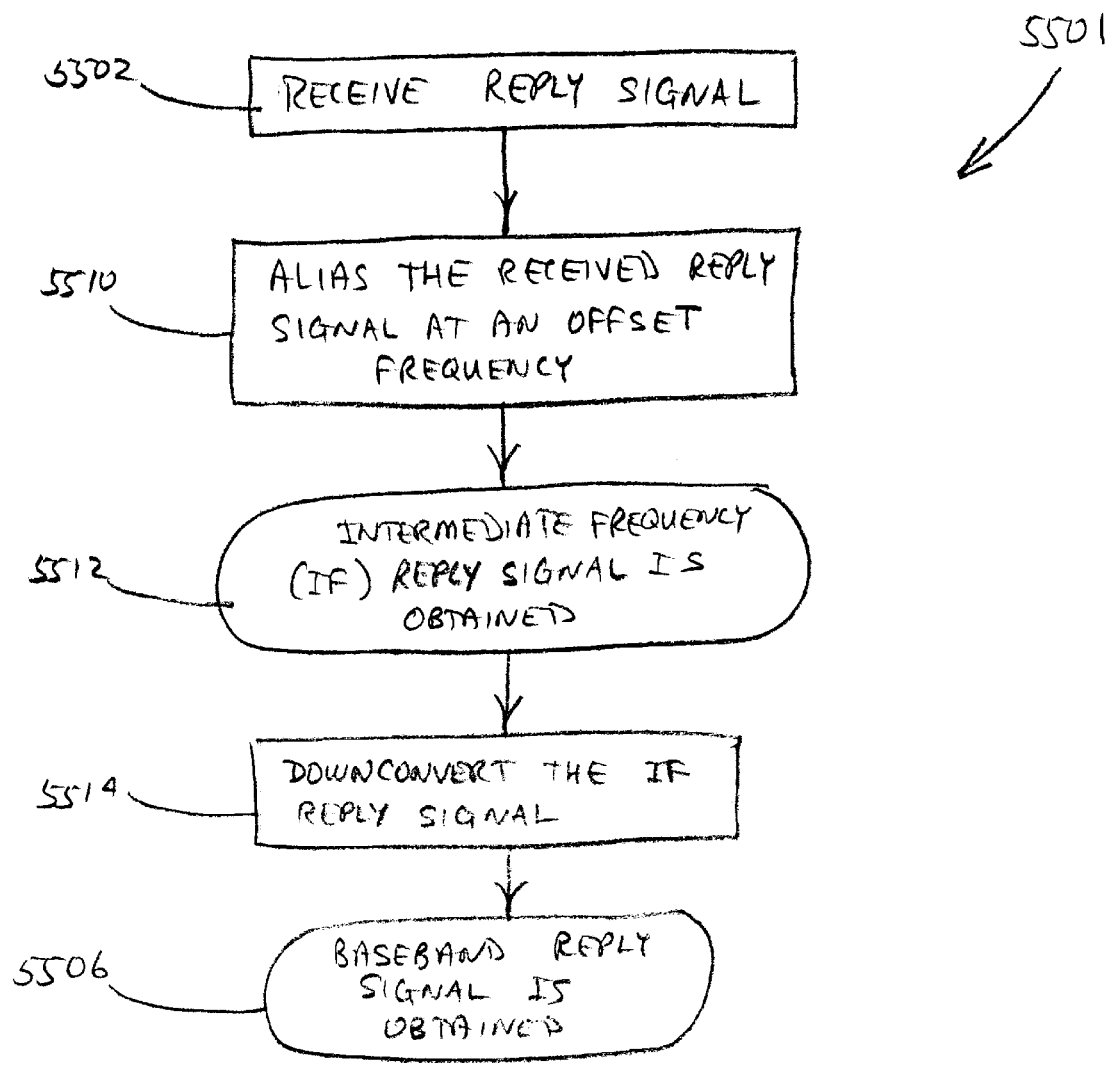

Looking now to FIG. 55B, in step 5502, the reply signal is received by the interrogator. This reply signal is generated by a transponder in accordance with the procedures described herein. The reply signal may be received from a wireless transmission, a transmission over a cable, or from any other transmission medium.

In step 5510, the received reply signal is aliased at a rate that is an offset of a harmonic or subharmonic of the frequency of the reply signal. The aliasing of a received signal at a rate that is an offset of a harmonic or subharmonic of the frequency of the received signal is described in detail in copending U.S. Patent application entitled "Method and System for Down-Converting Electromagnetic Signals," Ser. No. 09/176,022, filed Oct. 21, 1998, which is incorporated herein by reference in its entirety.

The outcome of step 5510 is result 5512. Result 5512 is an F reply signal. The frequency and modulation characteristics of the IF reply signal is determined by the technique used in step 5510 to alias the received signal at a rate that is an offset of a harmonic or subharmonic of the frequency of the reply signal and is discussed in detail in copending U.S. Patent application entitled "Method and System for Down-Converting Electromagnetic Signals," Ser. No. 09/176,022, filed Oct. 21, 1998, which is incorporated herein by reference in its entirety.

In step 5514, the IF reply signal is down-converted. This may be accomplished by demodulation, by mixing the IF reply signal with a signal from a local oscillator, or by aliasing it with a second aliasing signal. These and any other down-conversion techniques are intended to be within the scope and intent of the invention, as will be understood by those skilled in the relevant art(s) based on the teachings contained herein.

The outcome of step 5514 is result 5506. Result 5506 is a baseband reply signal which is available for use in accordance with established procedures. These procedures may include, by way of example, and not meant to be limiting, preparing a bill for the use of the utility.

7.2 Exemplary Implementation of a Transponder

Various embodiments related to the methods described above are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

Figure 28:
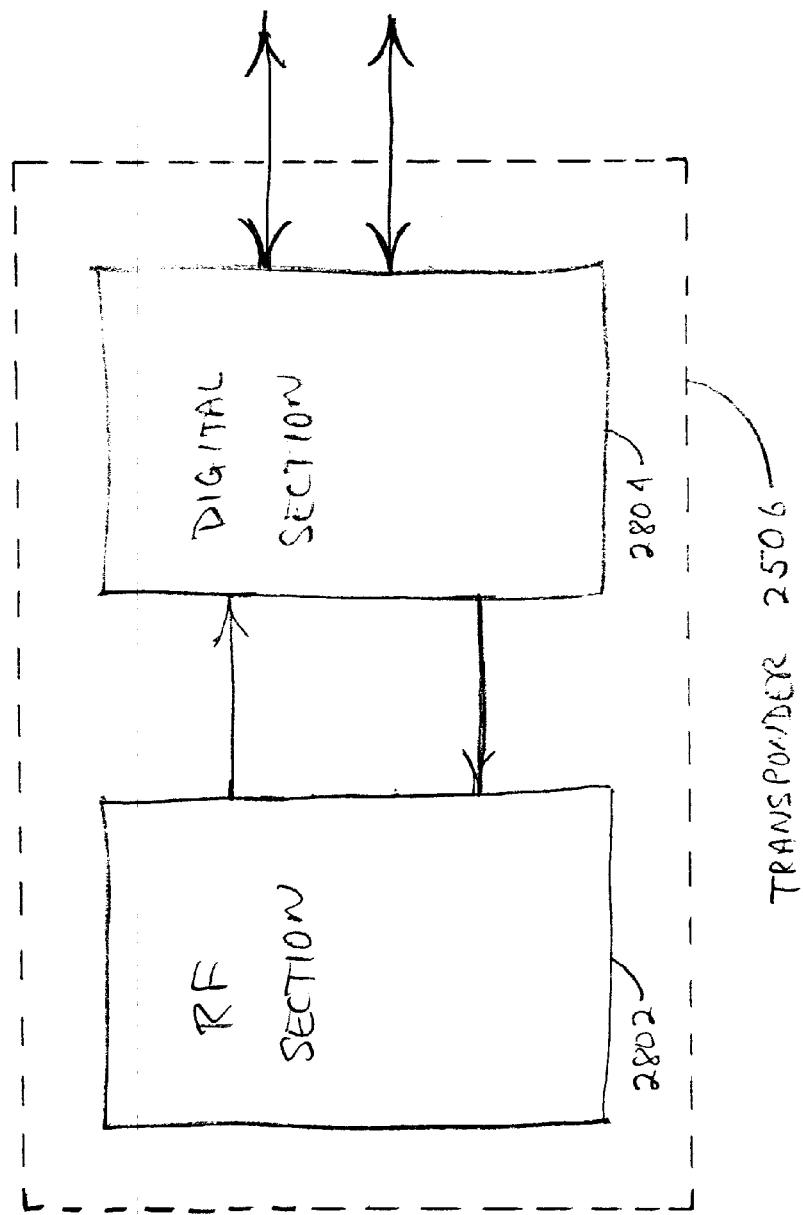
FIG. 28 illustrates an exemplary transponder of the present invention.

FIG. 28 illustrates a top level block diagram of transponder 2506 of FIG. 25. Transponder 2506 is comprised of an RF section 2802 and a digital section 2804. Digital section 2804 interfaces with meter 2508 of FIG. 25 (not shown on FIG. 28).

Figure 29:
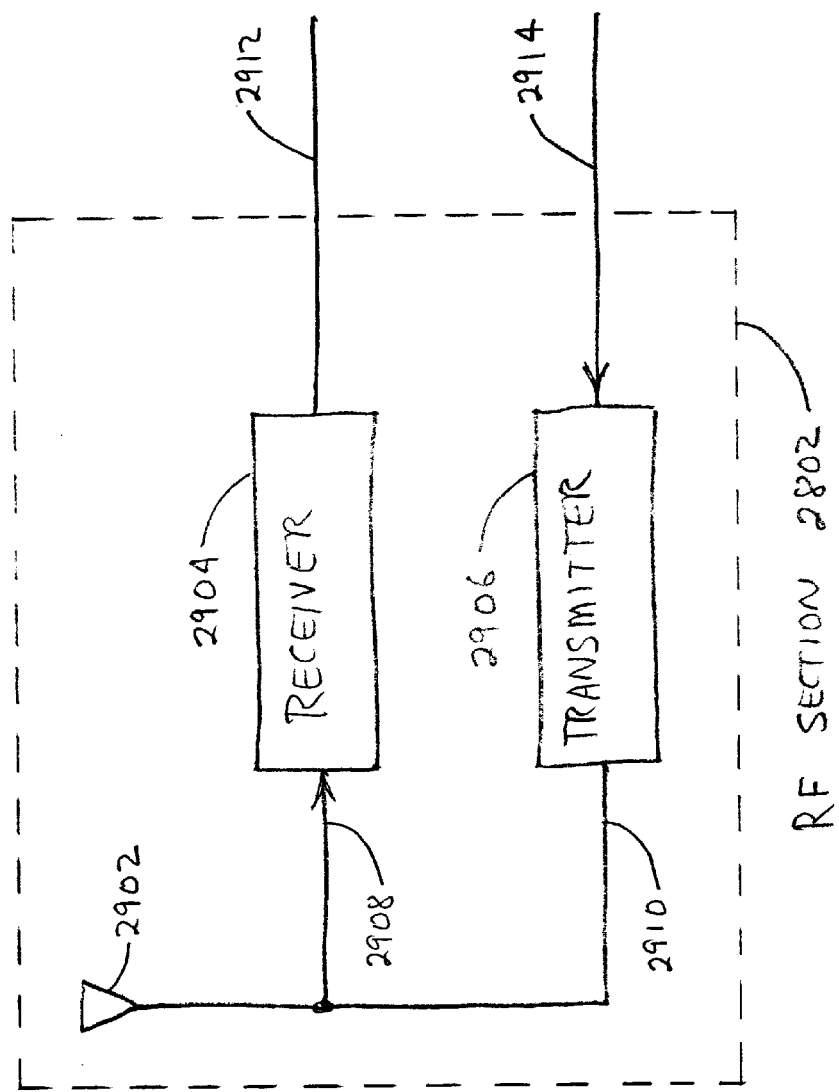
FIG. 29 illustrates an RF section of the present invention.

RF section 2802 is illustrated in FIG. 29. An antenna 2902 is coupled to a receiver 2904 and a transmitter 2906. Receiver 2904 accepts a received interrogation signal 2908 and outputs a baseband interrogation information signal 2912. Transmitter 2906 accepts a baseband reply signal 2914 and outputs a response signal 2910 to antenna 2902. Persons skilled in the relevant art(s) will appreciate that a number of antenna configuration may be used. As an example, and not meant to be limiting, antenna 2902 may be a single antenna, a single antenna connected through a duplexer (not shown), or two antennas. Baseband interrogation information signal 2912 and baseband reply signal 2914 are both coupled to digital section 2804 of FIG. 28 (not shown on FIG. 29).

7.2.1 Receiver

Figure 30:
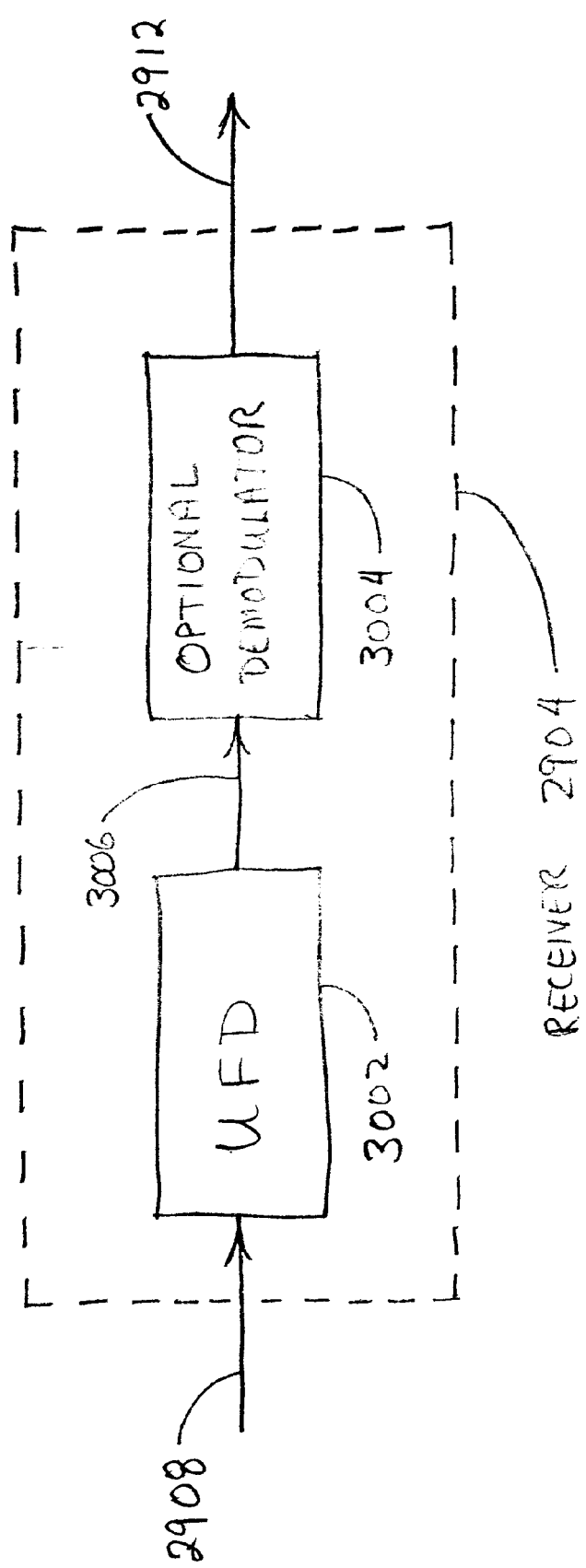
FIG. 30 illustrates a receiver of the present invention.

Receiver 2904 will now be described. Looking to FIG. 30, receiver 2904 can be seen to be preferably comprised of a Universal Frequency Down-Converter (UFD) 3002 and an optional demodulator 3004. Alternatively, receiver 2904 could be implemented using conventional technology. Preferably, receiver 2904 operates in the manner shown in flowcharts 2600 and 2601. In other words, receiver 2904 is the structural embodiment for performing the operational steps of flowcharts 2600 and 2601. However, it should be understood that the scope and spirit of the present invention includes other structural embodiments for performing the steps of flowcharts 2600 and 2601. The specifics of these other structural embodiments will be apparent to persons skilled in the relevant art(s) based on the discussion contained herein.

UFD 3002 accepts received interrogation signal 2908 and aliases it. In the embodiment described in flowchart 2600, an aliased signal 3006 of UFD 3002 is baseband interrogation information signal 2912 which is coupled to digital section 2804 of FIG. 28 (not shown on FIG. 30). In the embodiment described in flowchart 2601, aliased signal 3006 of UFD 3002 is an IF signal which is routed to optional demodulator 3004. If received interrogation signal 2908 is downconverted directly to the baseband interrogation information signal 2912 by UFD 3002, optional demodulator 3004 will not be needed. In the embodiment where optional demodulator 3004 is used, it demodulates the IF signal (aliased signal 3006) in any one of a number of methods as will be appreciated by persons skilled in the relevant art(s). The output of optional demodulator 3004 is baseband interrogation information signal 2912 which is coupled to digital section 2804 of FIG. 28 (not shown on FIG. 30).

Figure 32:
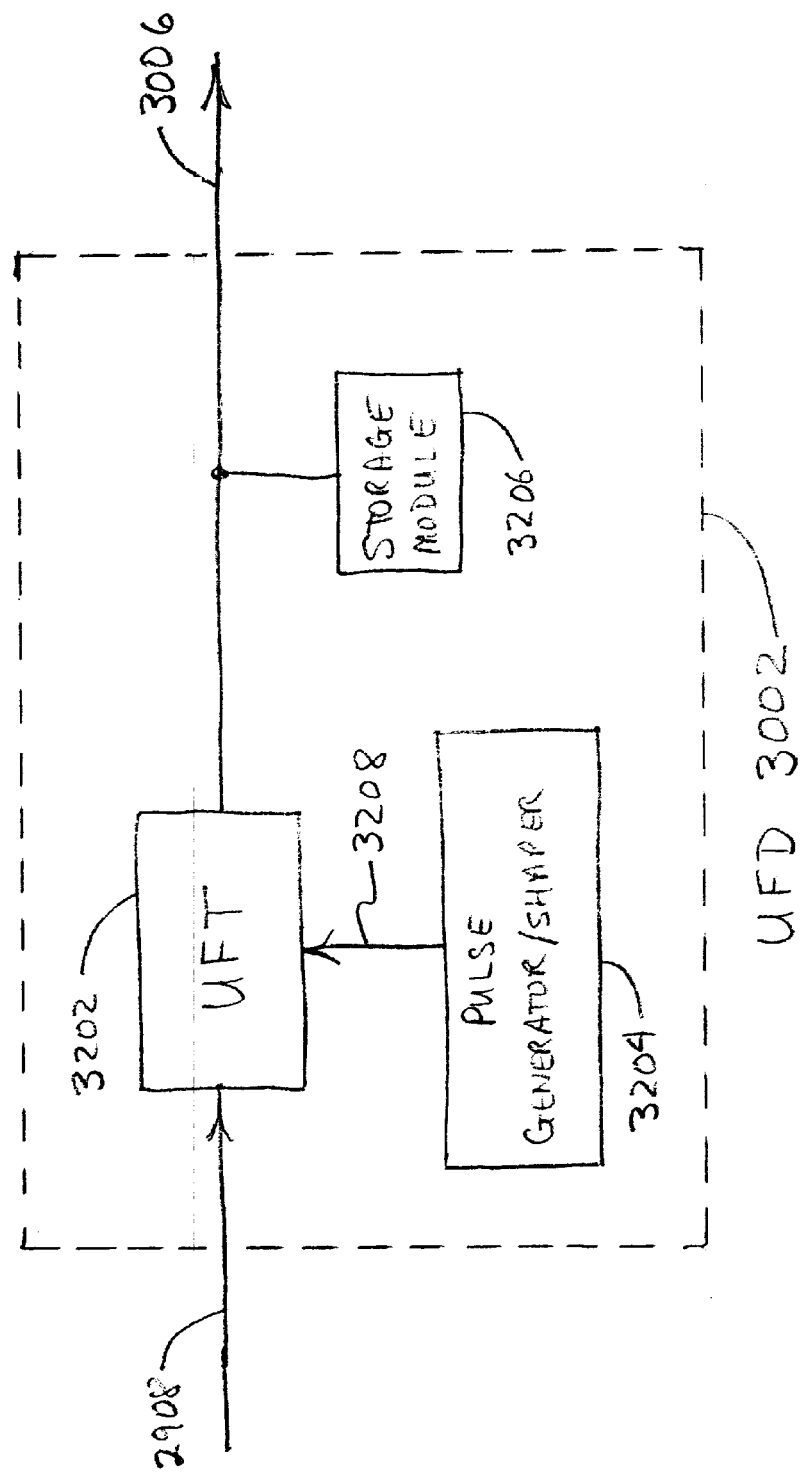
FIG. 32 illustrates a UFD of the present invention.

UFD 3002 is further illustrated in FIG. 32. A Universal Frequency Translator (UFT) 3202 accepts received interrogation signal 2908 and outputs aliased signal 3006 that is either a baseband signal or an IF signal. If aliased signal 3006 is a baseband signal, the output is coupled to a storage module 3206 and to digital section 2804 of FIG. 28 (not shown on FIG. 32). If aliased signal 3006 is an IF signal, the output is coupled to storage module 3206 and to optional demodulator 3004 of FIG. 30 (not shown on FIG. 32). UFT 3202 aliases received interrogation signal 2908 at an aliasing rate that is controlled by an aliasing signal 3208 which is the output of a pulse generator/shaper 3204.

UFD 3002 can be implemented in a variety of ways, as described above and/or as described in one or more of the co-pending U.S. patent applications referenced above, which are incorporated herein by reference in their entireties. Various embodiments are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

Figure 37:
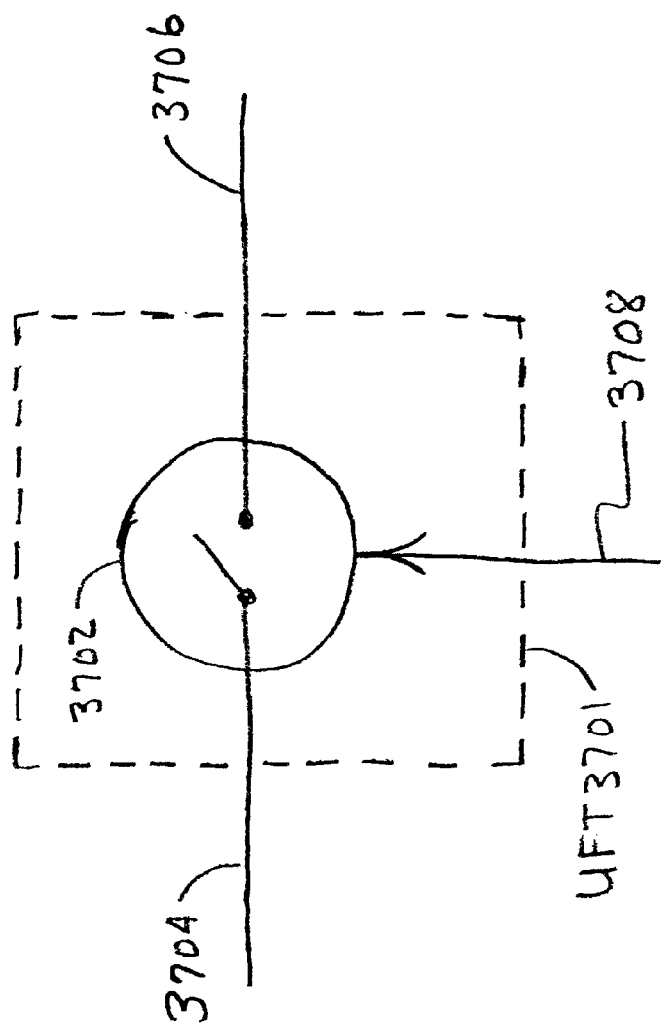
FIG. 37 illustrates a UFT of the present invention.

FIG. 37 illustrates an exemplary universal frequency translator, UFT 3701. UFT 3701 is comprised of a switch 3702 having a first input 3704, a second input 3706, and a control input 3708. When UFT 3701 is being used as UFT 3202 in the receiver configuration, first input 3704 is received interrogation signal 2908, second input 3706 is aliased signal 3006, and control signal 3708 is aliasing signal 3208. UFT 3701 can be implemented in a variety of ways with a variety of components, as described above and/or as described in one or more of the co-pending U.S. patent applications referenced above, which are incorporated herein by reference in their entireties. Various alternatives are presented in this section. These alternatives are described herein for purposes of illustration, and not limitation. The invention is not limited to these alternatives. Alternate configurations and components (including equivalents, extensions, variations, deviations, etc., of the alternatives described herein) will be apparent to persons skilled in the relevant art(s) based on the teachings contained herein. The invention is intended and adapted to include such alternatives.

Figure 38:
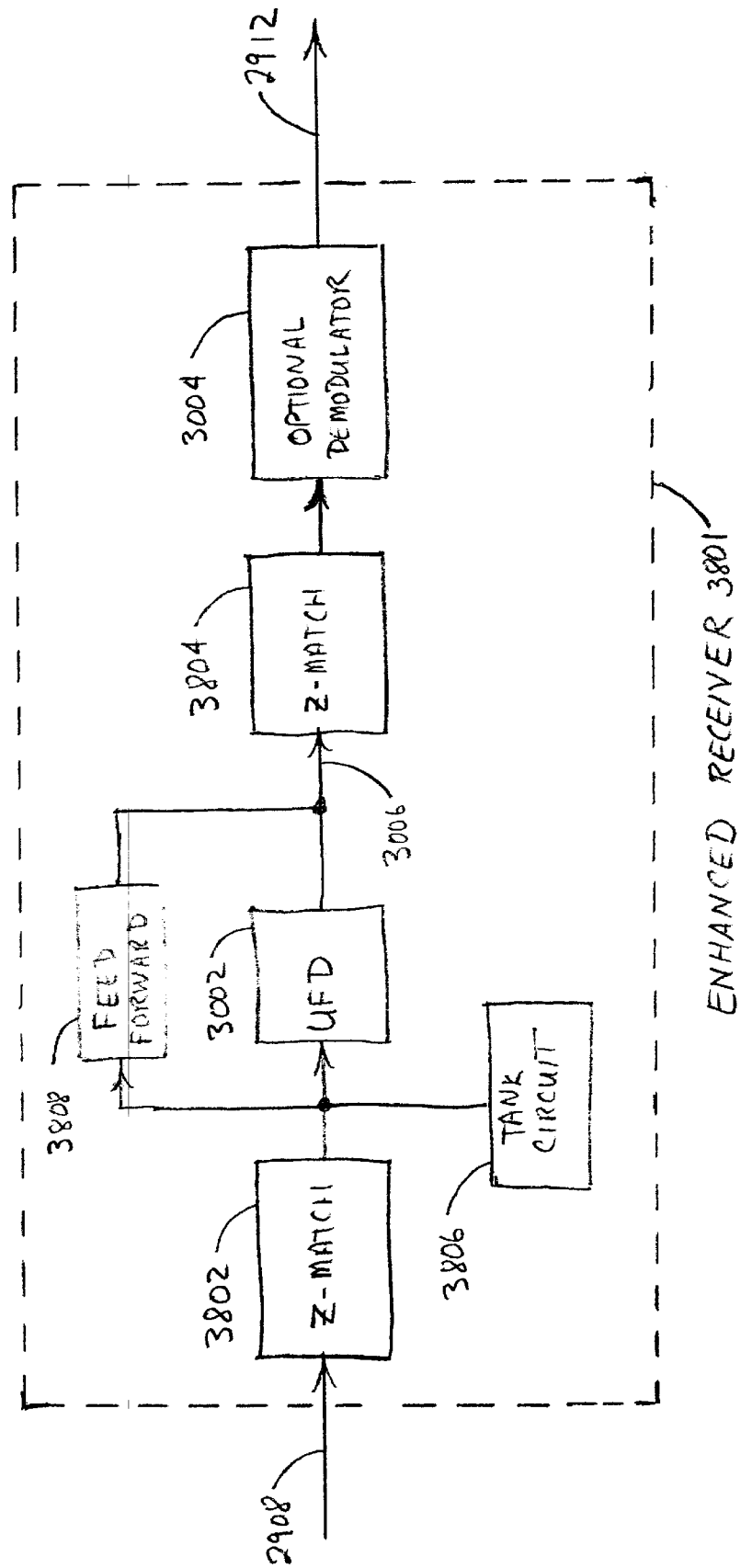
FIG. 38 illustrates an enhanced receiver schematic of the present invention.

FIG. 38 illustrates an enhanced receiver 3801. Enhanced receiver 3801 accepts received interrogation signal 2908 and outputs baseband interrogation information signal 2912 which is coupled to digital section 2804 of FIG. 28 (not shown on FIG. 30). Enhanced receiver 3801 also comprises an input z-match filter 3802, an output z-match filter 3804, a feed forward circuit 3808, a tank circuit 3806, and/or optional demodulator 3004. The operation of enhanced receiver 3801 is substantially the same as receiver 2904.

7.2.2 Transmitter

Transmitter 2906 will now be described. Preferably, transmitter 2906 operates in the manner shown in flowchart 2700. In other words, transmitter 2906 is the structural embodiment for performing the operational steps of flowchart 2700. However, it should be understood that the scope and spirit of the present invention includes other structural embodiments for performing the steps of flowchart 2700. The specifics of these other structural embodiments will be apparent to persons skilled in the relevant art(s) based on the discussion contained herein.

Figure 31:
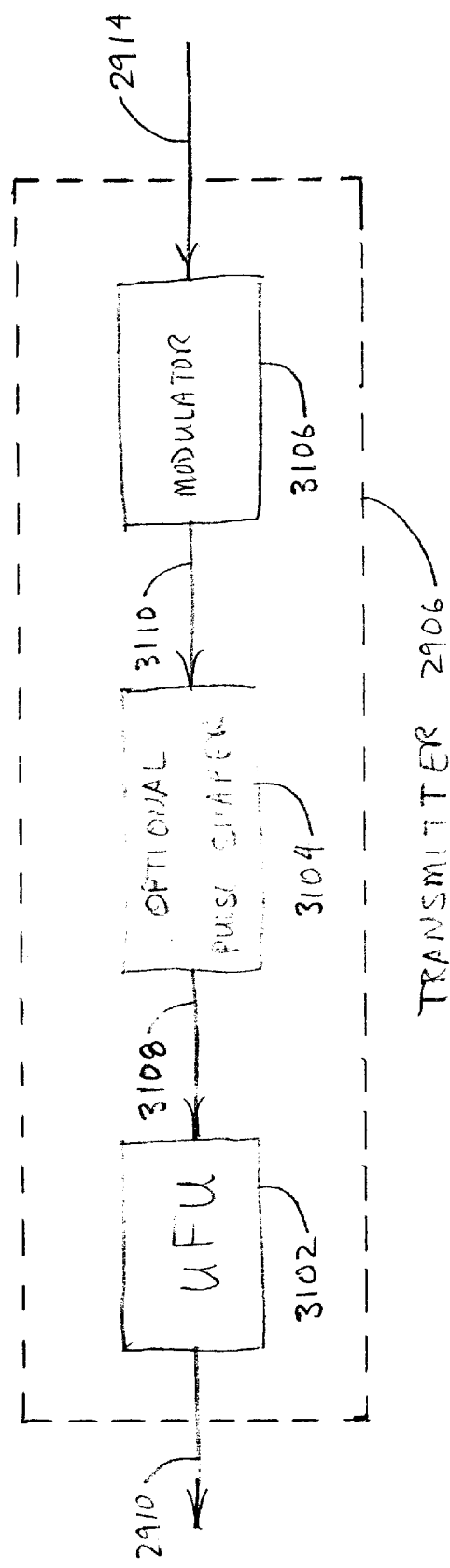
FIG. 31 illustrates a transmitter of the present invention.

Looking to FIG. 31, transmitter 2906 can be seen to be comprised of a Universal Frequency Up-Converter (UFU) 3102, an optional pulse shaper 3104, and a modulator 3106.

Modulator 3106 accepts baseband reply signal 2914 from digital section 2804 of FIG. 28 (not shown on FIG. 31) and modulates it in accordance with the desired modulation scheme. In an example, and not meant to be limiting, the modulation is frequency modulation. The output of modulator 3106 is a modulated reply signal 3110. Modulated reply signal 3110 is routed to optional pulse shaper 3104. Optional pulse shaper 3104 operates in a manner described in one or more of the co-pending U.S. patent applications referenced above, which are incorporated herein by reference in their entireties. The output of optional pulse shaper 3104 is a gating signal 3108. In an alternate embodiment, gating signal 3108 is not shaped.

Gating signal 3108 controls UFU 3102 which then outputs response signal 2910. Response signal 2910 is then routed to antenna 2902 of FIG. 29 (not shown on FIG. 31).

Figure 33:
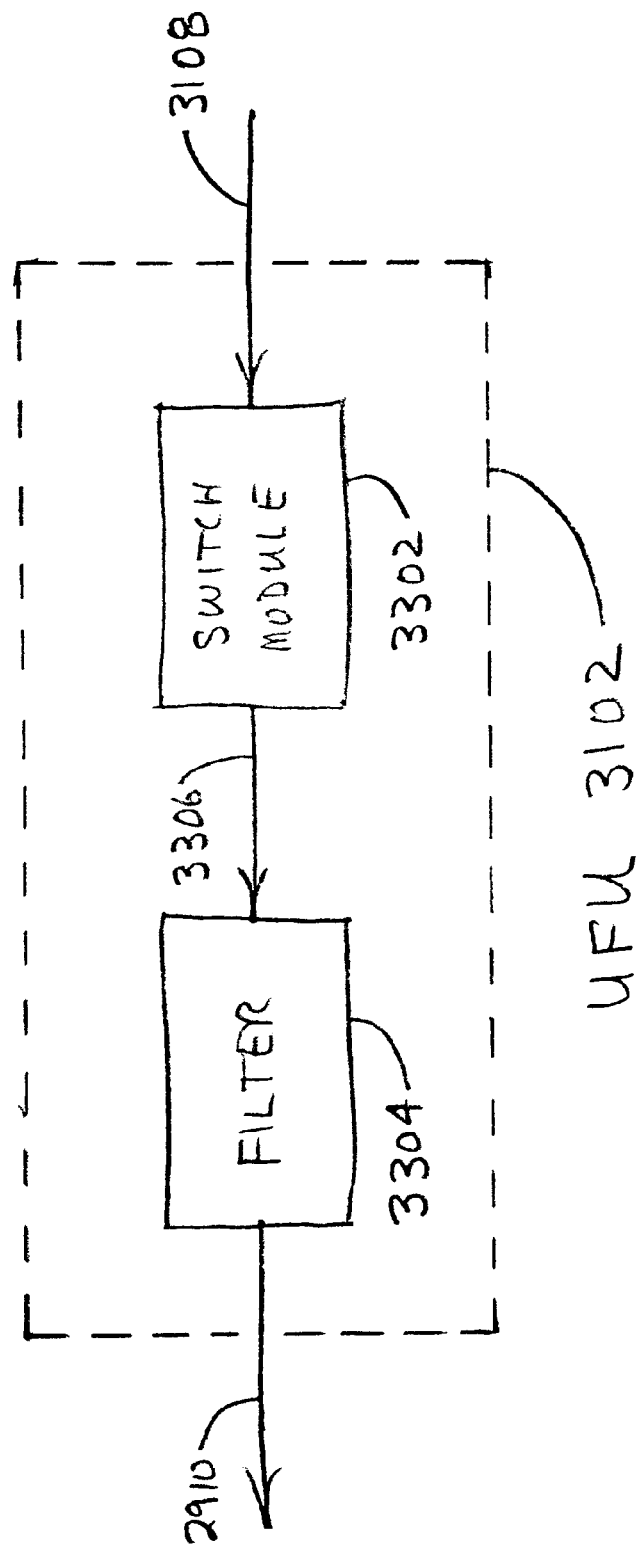
FIG. 33 illustrates a UFU of the present invention.

UFU 3102 is further illustrated in FIG. 33. A switch module 3302 accepts gating signal 3108 and outputs a harmonically rich signal 3306. Harmonically rich signal 3306 is comprised of a plurality of harmonics, each of which is modulated substantially the same as gating signal 3108. Harmonically rich signal 3306 is then routed through a filter 3304 where one or more desired harmonics are extracted. The result is response signal 2910 which is then routed to antenna 2902 of FIG. 29 (not shown on FIG. 31). UFU 3102 can be implemented in a variety of ways, as described above and/or as described in one or more of the co-pending U.S. patent applications referenced above, which are incorporated herein by reference in their entireties. Various embodiments are presented in this section (and its subsections). These embodiments are described herein for purposes of illustration, and not limitation. The invention is not limited to these embodiments. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

Figure 36:
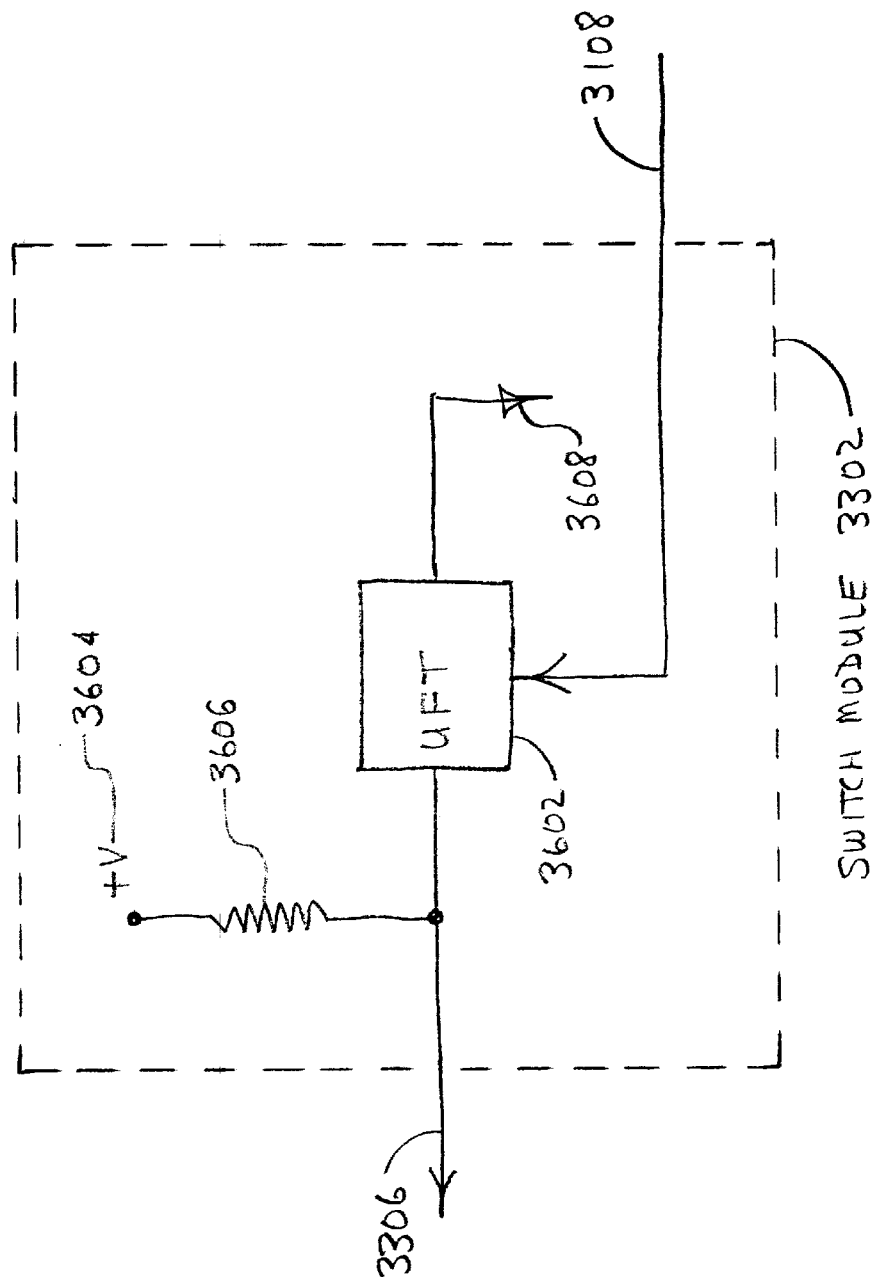
FIG. 36 illustrates a switch module of the present invention.

An exemplary structure of switch module 3302 is now illustrated in FIG. 36. A Universal Frequency Translator (UFT) 3602 receives gating signal 3108. UFT 3602 is also connected to a ground 3608 and through a resistor 3606 to a bias voltage 3604. As can be seen in FIG. 36, harmonically rich signal 3306 is also found at the "low" side of resistor 3606.

FIG. 37 illustrates UFT 3701. UFT 3701 is comprised of a switch 3702 having a first input 3704, a second input 3706, and a control input 3708. When UFT 3701 is being used as UFT 3602 in the transmitter configuration, first input 3704 is harmonically rich signal 3306, second input 3706 is ground 3608, and control signal 3708 is gating signal 3108. UFT 3701 can be implemented in a variety of ways with a variety of components, as described above and/or as described in one or more of the co-pending U.S. patent applications referenced above, which are incorporated herein by reference in their entireties. Various alternatives are presented in this section. These alternatives are described herein for purposes of illustration, and not limitation. The invention is not limited to these alternatives. Alternate configurations and components (including equivalents, extensions, variations, deviations, etc., of the alternatives described herein) will be apparent to persons skilled in the relevant art(s) based on the teachings contained herein. The invention is intended and adapted to include such alternatives.

7.2.3 Embodiment Employing a Single UFT

Figure 39:
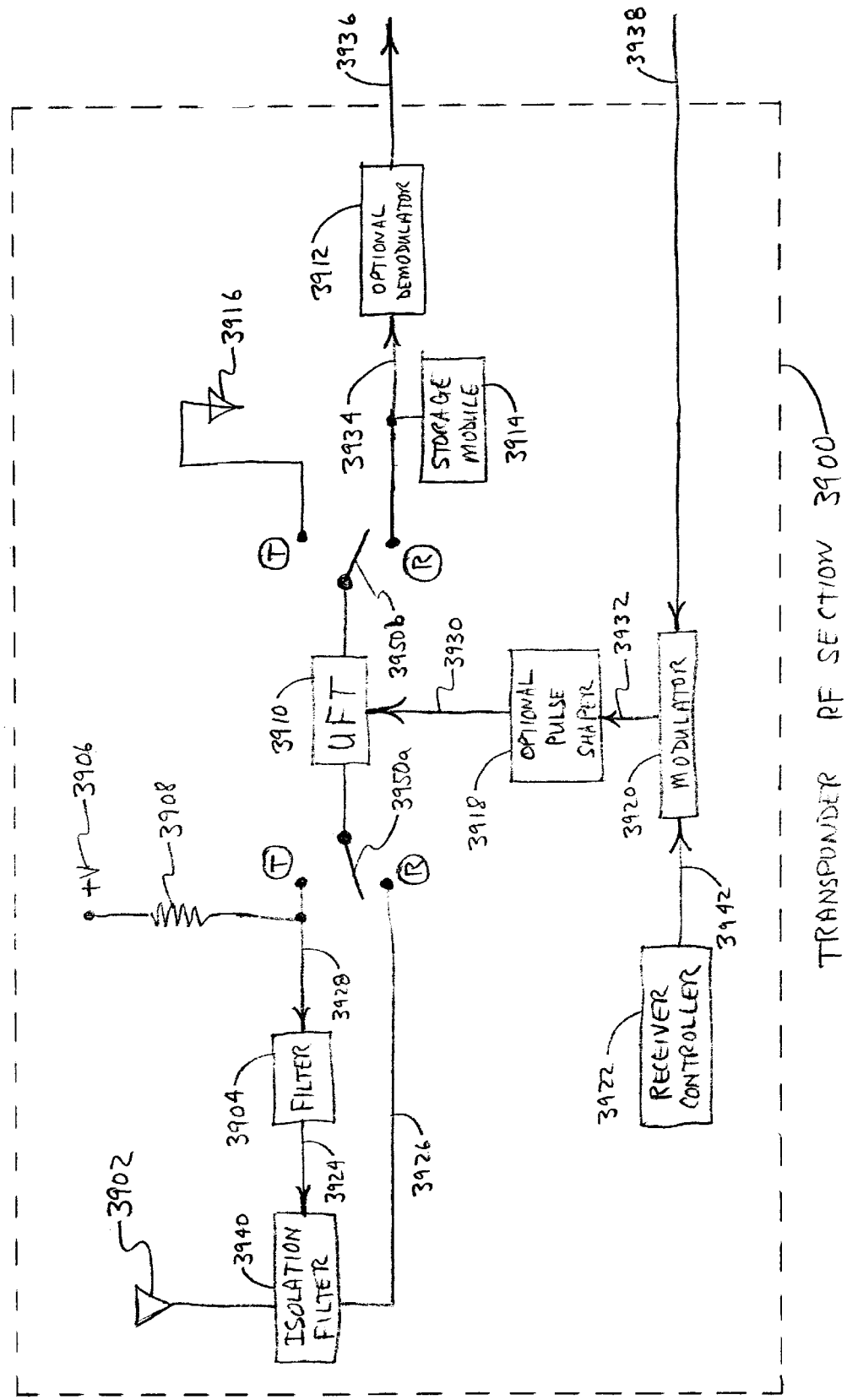
FIG. 39 illustrates an exemplary transponder RF section employing a single UFT.

An embodiment employing a single UFT is shown in FIG. 39. The single UFT embodiment can be implemented in a variety of ways, as described herein and/or as described in one or more of the co-pending U.S. patent applications referenced above, which are incorporated herein by reference in their entireties. The embodiment described herein is for purposes of illustration, and not limitation. The invention is not limited to this embodiment. Alternate embodiments (including equivalents, extensions, variations, deviations, etc., of the embodiment described herein) will be apparent to persons skilled in the relevant art(s) based on the teachings contained herein. The invention is intended and adapted to include such alternate embodiments.

FIG. 39 illustrates a transponder RF section 3900 comprising a UFT 3910 connected on its first input to a switch 3950a and on its second input to a switch 3950b. The position of switches 3950a and 3950b is determined by whether the transponder is in the receive mode or in the transmit mode. As shown in FIG. 39, when the transponder is in the transmit mode, switches 3950a and 3950b are in the positions marked (T) and when the transponder is in the receive mode, switches 3950a and 3950b are in the positions marked (R). The control input to UFT 3910 is a control signal 3930.

The transmit mode is now described. With switch 3950a in the position marked (T), the first input of UFT 3910 is connected through a resistor 3908 to a bias signal 3906 and to a filter 3904. Filter 3904 accepts a harmonically rich signal 3928, and isolates one or more desired harmonics. The desired harmonic(s) is response signal 3924. Response signal 3924 is routed through an isolation filter 3940 to an antenna 3902. The purpose of isolation filter 3940 is to ensure that bias voltage 3906 is blocked when the transponder is in the receive mode. Persons skilled in the relevant art(s) will understand, based on the teachings contained herein, that a number of circuit designs will accomplish the objective of isolating the DC bias voltage from the rest of the circuit when the transponder is in the receive mode. These alternate circuits are intended to be within the scope of the invention. The second input of UFT 3910 in the transmit mode is connected to a ground 3916. In the transmit mode, control signal 3930 is a gating signal. Control signal 3930, when comprising a gating signal, is generated in the following manner. Modulator 3910 accepts baseband reply signal 3938 from digital section 2804 of FIG. 28 (not shown on FIG. 39) and modulates an oscillating signal in accordance with the desired modulation scheme. In an example, and not meant to be limiting, the modulation is frequency modulation. The output of modulator 3920 is a modulated reply signal 3932. Modulated reply signal 3932 is routed to optional pulse shaper 3918. Optional pulse shaper 3918 operates in a manner described in one or more of the co-pending U.S. patent applications referenced above, which are incorporated herein by reference in their entireties. The output of optional pulse shaper 3918 is control signal 3930 comprising a gating signal. In an alternate embodiment, control signal 3930 is not shaped.

In an alternate embodiment, not shown in FIG. 39, control signal 3930 is not modulated. The modulation of the response occurs after harmonically rich signal 3928 has been routed through filter 3904.

The receive mode is now described. With switch 3950a in the position marked (R), the first input of UFT 3910 accepts received interrogation signal 3926 from antenna 3902 through isolation filter 3940. As stated above, the purpose of isolation filter 3940 is to ensure that bias voltage 3906 is blocked when the transponder is in the receive mode. Persons skilled in the relevant art(s) will understand, based on the teachings contained herein, that a number of circuit designs will accomplish the objective of isolating the DC bias voltage from the rest of the circuit when the transponder is in the receive mode. With switch 3950b in the position marked (R), the second input of UFT 3910 connects an aliased signal 3934 to a storage module 3914 and to an optional demodulator 3912. The output of optional demodulator 3912 (or the output of UFT 3910 in the embodiment wherein optional demodulator 3912 is not used) is baseband interrogation information signal 3936 which is coupled to digital section 2804 of FIG. 28 (not shown on FIG. 39). In the receive mode, control signal 3930 is an aliasing signal.

Control signal 3930, when comprising an aliasing signal, is generated in the following manner. A receiver controller 3922 generates a receiver control signal 3942 which is coupled to modulator 3920. The output of modulator 3920 is oscillating signal 3932 comprising an unshaped aliasing signal having a frequency that is a sub-harmonic of (or offset from a sub-harmonic of) the frequency of received interrogation signal 3926. Oscillating signal 3932 is routed to optional pulse shaper 3918. Optional pulse shaper 3918 operates in a manner described in one or more of the co-pending U.S. patent applications referenced above, which are incorporated herein by reference in their entireties. The output of optional pulse shaper 3918 is control signal 3930 comprising an aliasing signal. In an alternate embodiment, control signal 3930 is not shaped. The purpose of receiver controller 3922 is to generate a signal that will cause modulator 3920 to output a signal at the desired aliasing frequency. Since modulator 3920 is used to generate a modulated oscillating signal in response to baseband reply signal 3938, the use of receiver controller 3922 will permit the use of a single oscillating source (i.e., modulator 3920) in the transponder. Thus, the output of modulator 3920 is either an aliasing signal at a frequency that is a sub-harmonic of (or offset from a sub-harmonic of) the frequency of received interrogation signal 3926 when the transponder is operating in the receive mode, or it is a modulated gating signal having two frequencies (in the FSK embodiment) that are sub-harmonics of the desired frequencies of response signal 3924 when the transponder is operating in the transmit mode.

7.2.4 AM and AM-Hybrid Interrogation Schemes

In an embodiment, the present invention operates to receive, demodulate, and decode AM interrogation signals and/or hybrid AM interrogation signals. Hybrid AM interrogation signals can include AM/FM signals, for example. Such an AM/FM signal can include a multi-state data signal that frequency modulates a first carrier signal to generate an FM signal. The FM signal oscillates a different frequency for each data state (e.g., two data states/two frequencies). The FM signal then amplitude modulates a second carrier signal, resulting in an AM/FM signal. The AM/FM signal oscillates substantially at the frequency of the second carrier signal, but has an amplitude envelope that substantially matches the FM signal. When the high frequency components of the AM/FM signal are filtered out, the two tone FM signal remains, which can be demodulated/decoded in a conventional manner.

7.3 Exemplary Implementation of an Interrogator

Figure 40:
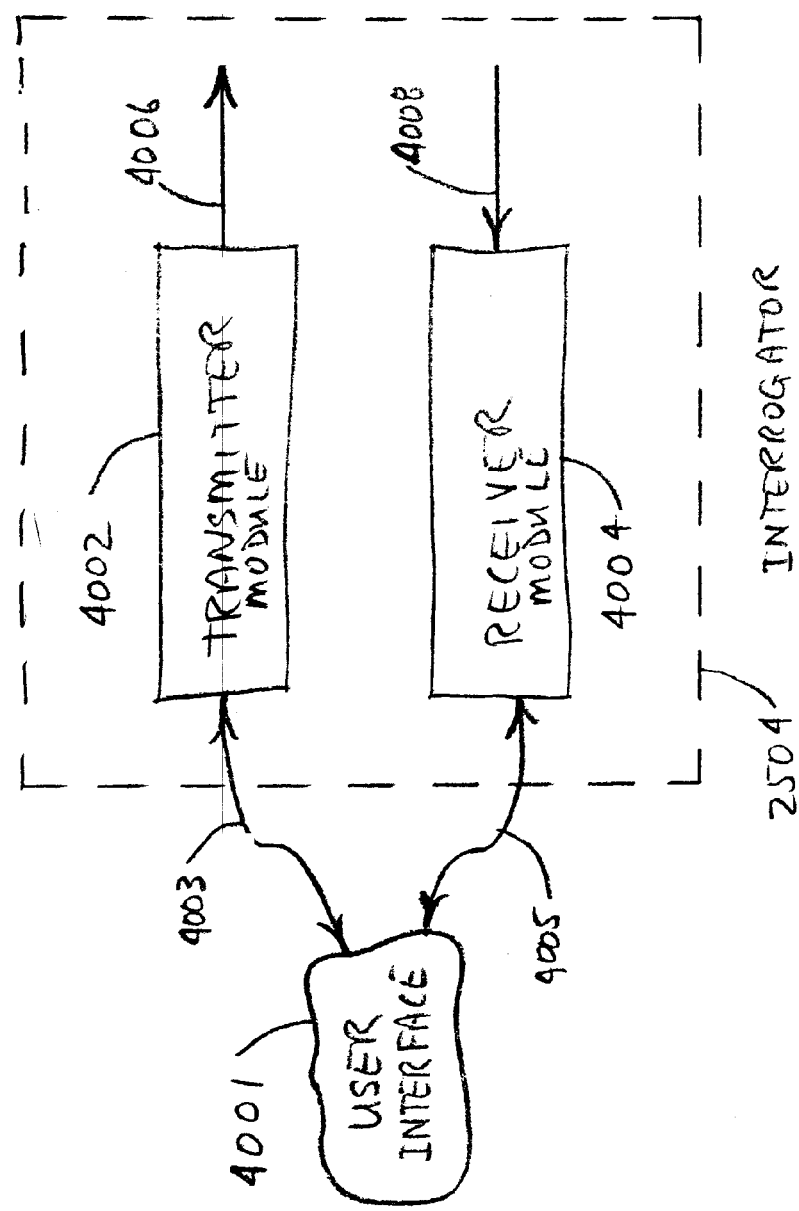
FIG. 40 illustrates an exemplary interrogator of the present invention.

Referring back to FIG. 25, it can be seen that interrogator 2504 is a component of AMR system 2502. FIG. 40 shows interrogator 2504 is comprised of a transmitter module 4002 and a receiver module 4004. Transmitter module 4002 is connected to a user interface 4001 through a transmitter/user connection 4003, and receiver module 4004 is connected to user interface 4001 through a receiver/user connection 4005. User interface 4001 is shown to illustrate the user input, through transmitter/user connection 4003, of which transponders are to be addressed, and what information is requested from each transponder that is addressed. It may be an operator entering the data on a real-time or near-real-time basis; it may be loaded before the interrogator is placed into operation; it may be entered via a separate radio-frequency link; or it may be any other procedure by which the address and/or requested information are specified prior to the interrogation taking place.

User interface 4001 is also shown to illustrate the user acquiring, through receiver/user connection 4005, the reply from the transponder. It may be an operator reading a digital display in real-time or near-real-time. It may also be a recording device to record the information for later input into a computer or similar device. It may also be a separate radio-frequency transmission device. Persons skilled in the relevant art(s) will understand that these and other user interfaces are within the scope of the invention.

Transmitter module 4002 outputs a modulated interrogation signal 4006. Modulated interrogation signal 4006 may be interrogation signal 2510 of FIG. 25. Receiver module 4004 accepts modulated reply signal 4008. Modulated reply signal 4008 may be response signal 2512 of FIG. 25.

7.3.1 Transmitter Module

Figure 41:
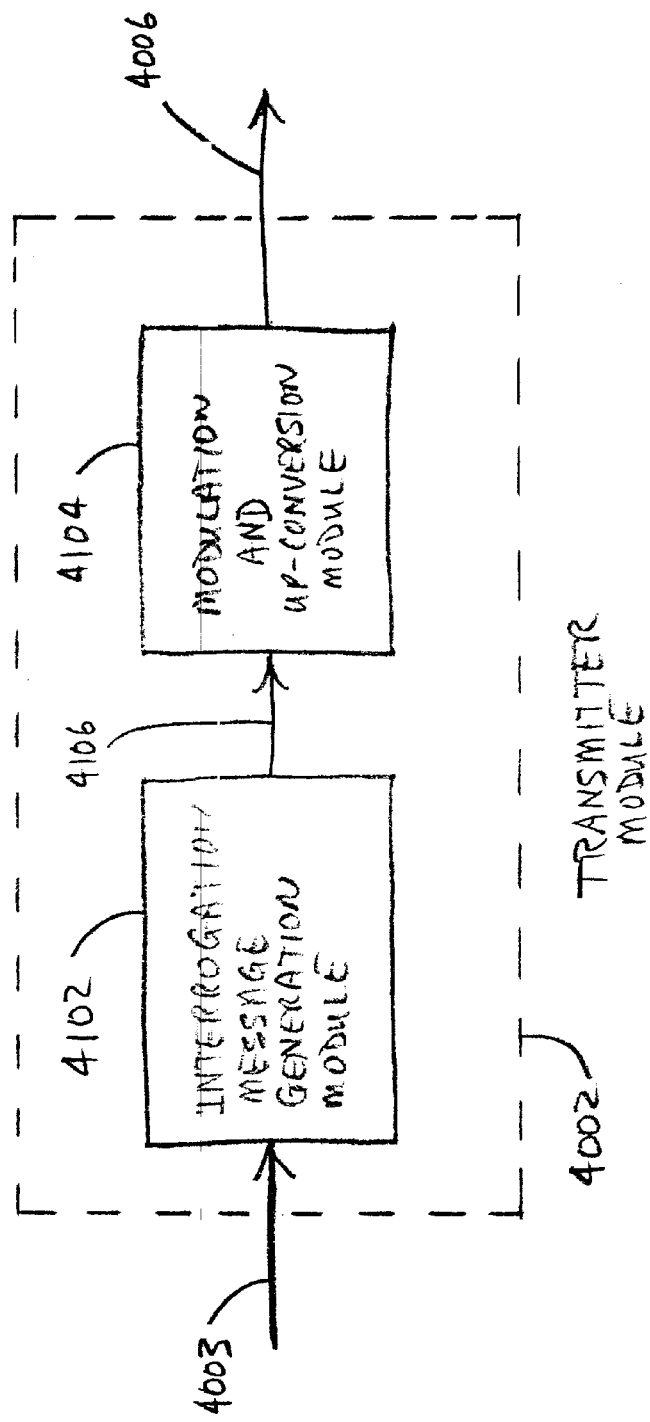
FIG. 41 illustrates a transmitter module of an exemplary interrogator.
Figure 42:
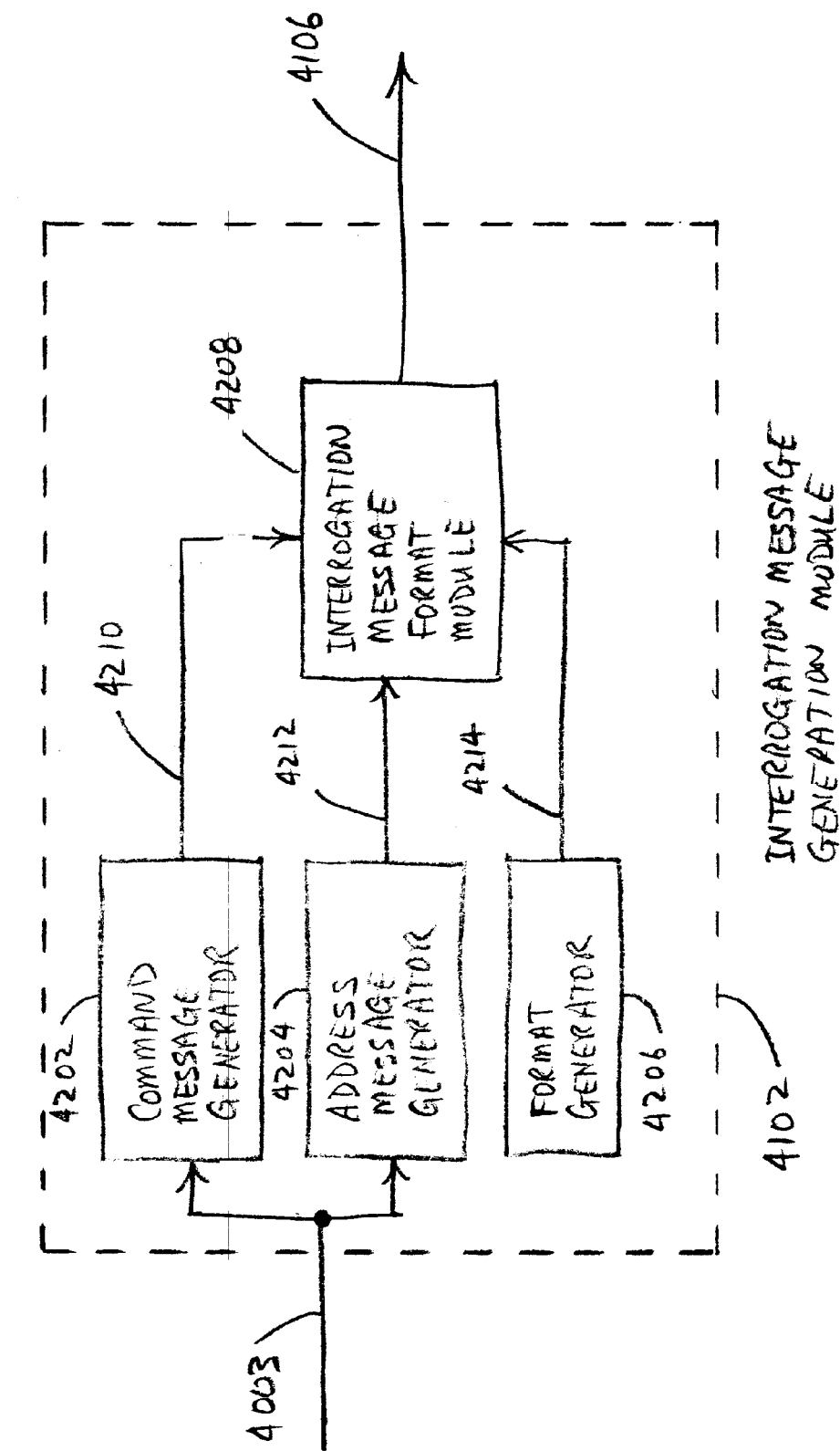
FIG. 42 illustrates an exemplary interrogation message format module.

Transmitter module 4002 is illustrated in FIG. 41. An interrogation message generation module 4102 accepts direction via transmitter/user connection 4003 and outputs an interrogation message 4106. An example of interrogation message generation module 4102 is illustrated in FIG. 42. In this example, which is not meant to be limiting, interrogation message generation module 4102 is shown as comprising a command message generator 4202, an address message generator 4204, a format generator 4206, and an interrogation message format module 4108.

In an exemplary implementation, command message generator 4202 generates a command message 4210 that identifies what information is desired from a transponder. Command message 4210 may be, for example and not meant to be limiting, four bits long. Further, address message generator 4204 generates an address message 4212 that identifies which transponder(s) and/or which meter is being addressed. Address message 4212 may be, for example and not meant to be limiting, 32 bits long. Thirdly, format generator 4206 generates a format message 4214 that contains essential parts of the interrogation message 4106 such as synchronization, timing, parity, etc., and, in addition, ensures that the interrogation message 4106 is in a format that is in accordance with an accepted protocol. Format message 4214 may contain, for example and not meant to be limiting, 8 bits allocated to a synchronization word, 16 bits allocated to a timing function, and 16 bits allocated to parity bits to facilitate error detection and correction. Interrogation message format module 4208 arranges these messages in a format that is an accordance with a prescribed protocol. One skilled in the relevant art(s), based on the teachings contained herein, will appreciate that interrogation message 4106, including the content of the message, the sequence of the bits, and the number of bits corresponding to each part of the message, may vary.

Figure 43:
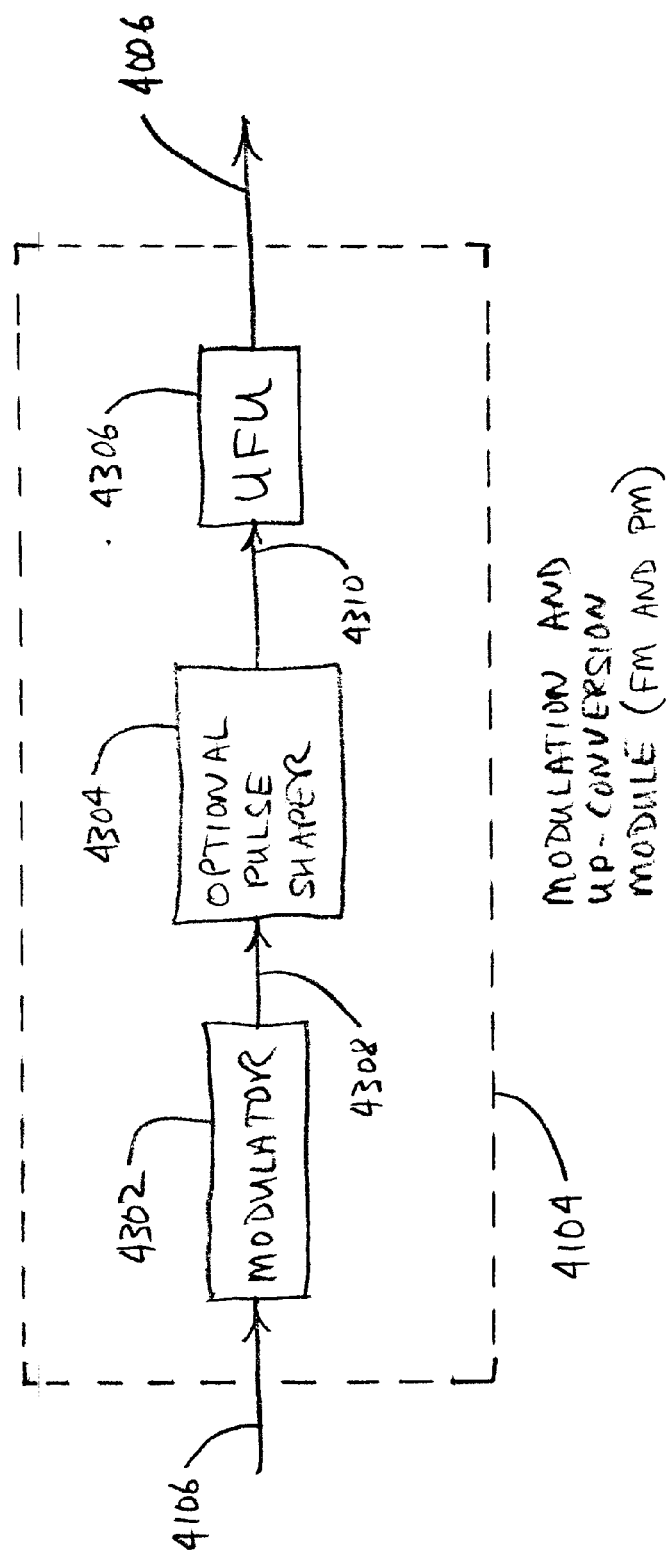
FIG. 43 illustrates an exemplary modulation and up-conversion module for the FM and PM implementations.
Figure 44:
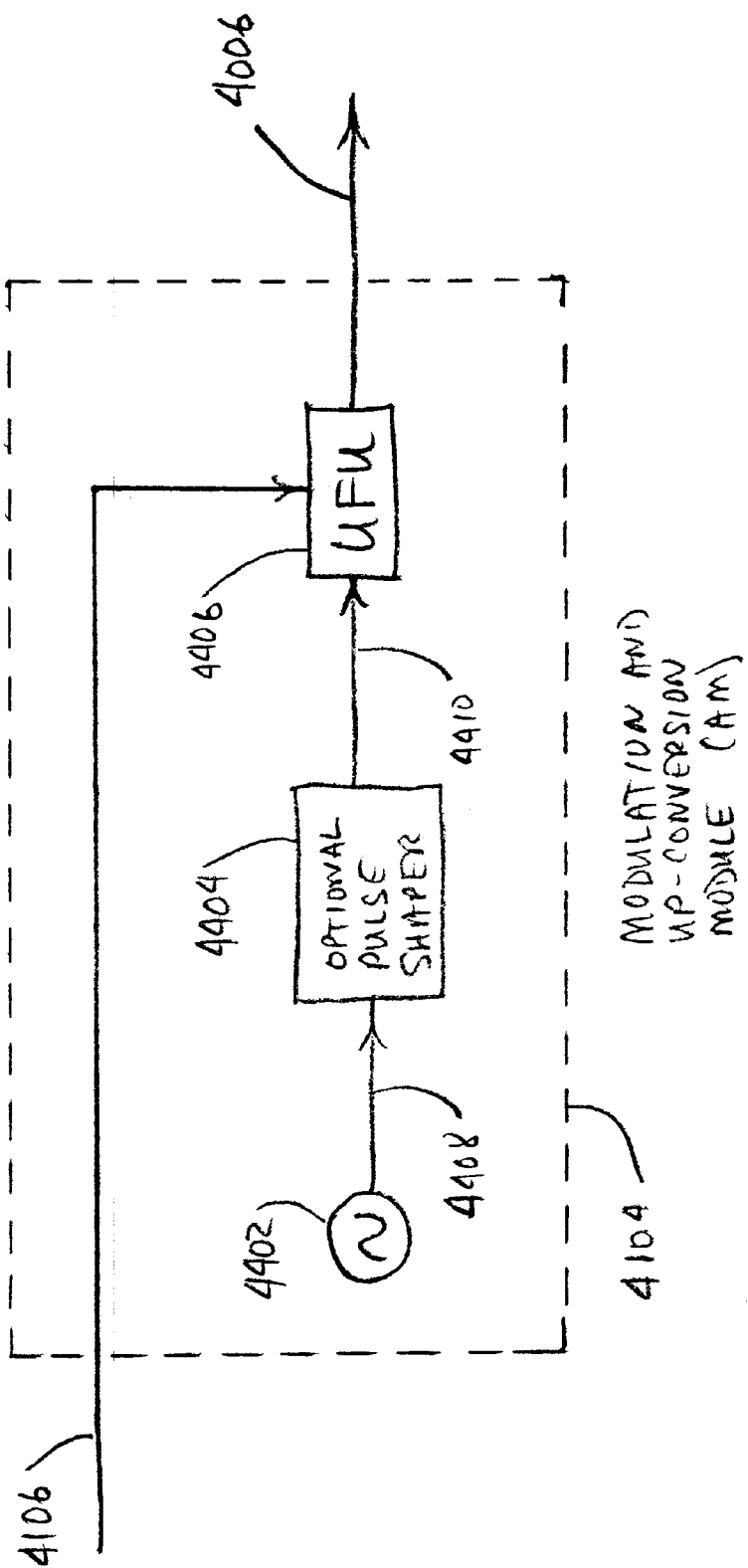
FIG. 44 illustrates an exemplary modulation and up-conversion module for the AM implementation.

Interrogation message 4106 is routed to a modulation and up-conversion module 4104. FIG. 43 illustrates an exemplary configuration for the frequency modulation (FM) and the phase modulation (PM) embodiments. FIG. 44 illustrates an exemplary configuration for the amplitude modulation (AM) embodiment.

Looking first to the angle modulation embodiment of FIG. 43, interrogation message 4106 is connected to a modulator 4302. Modulator 4302 is a frequency modulator for the FM embodiment, such as, but not limited to, a voltage controlled oscillator. Modulator 4302 is a phase modulator for the PM embodiment. The output of modulator 4302 is modulated interrogation message 4308. Modulated interrogation message 4308 is routed to an optional pulse shaper 4304 to create a shaped modulated interrogation message 4310. Shaped modulated interrogation message 4310 is then routed to a universal frequency up-converter (UFU) 4306. In an embodiment wherein optional pulse shaper 4304 is not used, modulated interrogation message 4308 is routed directly to UFU 4306. The output of UFU 4306 is modulated interrogation signal 4006.

Looking now to the amplitude modulation embodiment of FIG. 44, interrogation message 4106 is connected to a universal frequency up-converter (UFU) 4406. An oscillator 4402 generates an oscillating signal 4408. Oscillating signal 4408 is routed to an optional pulse shaper 4404 to create a shaped oscillating signal 4410. Shaped oscillating signal is then routed to UFU 4406. In an embodiment wherein optional pulse shaper 4404 is not used, oscillating signal 4408 is routed directly to UFU 4406. The output of UFU 4406 is modulated interrogation signal 4006.

Figure 45:
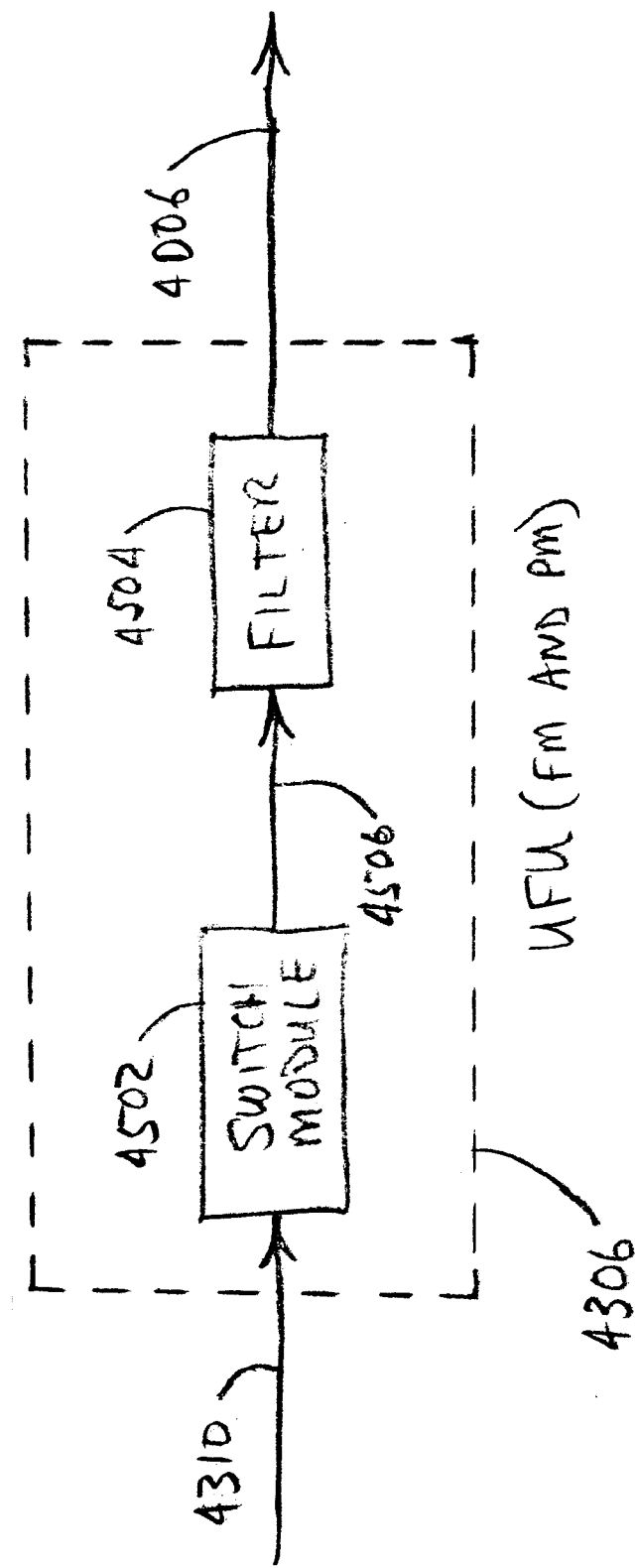
FIG. 45 illustrates a UFU for the FM and PM implementations.
Figure 46:
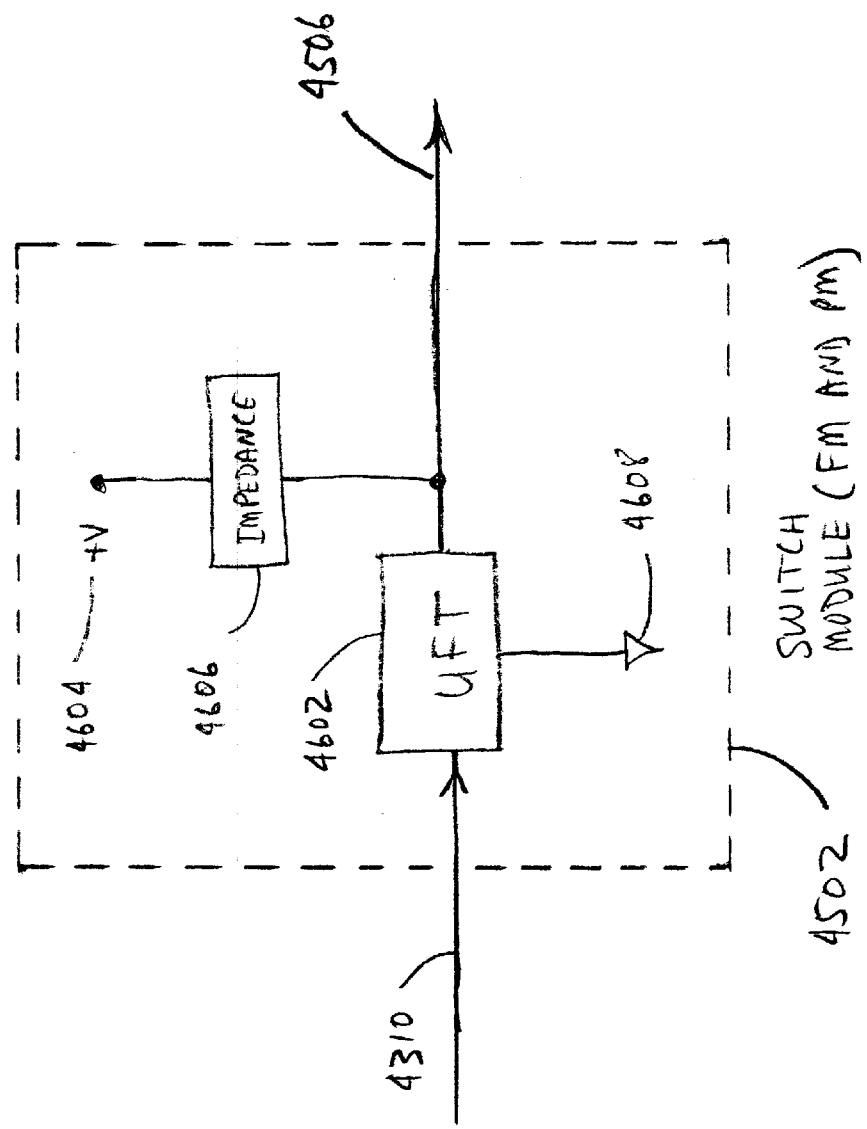
FIG. 46 illustrates a switch module for the FM and PM implementations.
Figure 47:
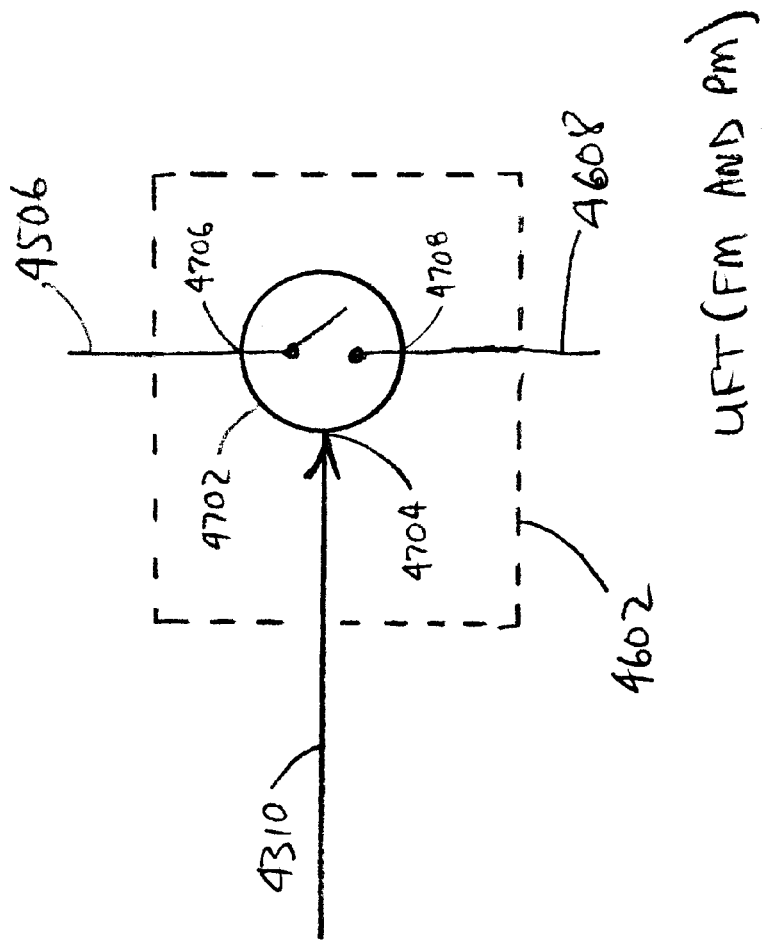
FIG. 47 illustrates a UFT for the FM and PM implementations.

FIGS. 45, 46, and 47 illustrate an exemplary structure of UFU 4306 in the angle modulation embodiment. In FIG. 45, shaped modulated interrogation message 4310 is routed to a switch module 4502 to create a harmonically rich interrogation message 4506. Harmonically rich interrogation message 4506 is routed to a filter 4504 to create modulated interrogation signal 4006. It should be noted that in the embodiment wherein optional pulse shaper 4304 of FIG. 43 is not used, shaped modulated interrogation message 4310 is replaced by modulated interrogation message 4308. It should also be noted that filter 4504 is optional, and in the embodiment wherein filter 4504 is not used, harmonically rich interrogation message 4506 becomes modulated interrogation signal 4006. An exemplary structure of switch module 4502 is shown in FIG. 46, wherein shaped modulated interrogation message 4310 (or modulated interrogation message 4308 in the alternate embodiment wherein optional pulse shaper 4304 is not used) is routed to a universal frequency translator (UFT) 4602. UFT 4602 is also connected to a ground 4608. A bias voltage 4604 is connected through an impedance 4606 to the output of UFT 4602. The output of UFT 4602 is harmonically rich interrogation message 4506. An exemplary structure of UFT 4602 is shown in FIG. 47 as comprising a switch 4702. Switch 4702 has a first input 4706, a second input 4708, and a control input 4704. Shaped modulated interrogation message 4310 (or modulated interrogation message 4308 in the alternate embodiment wherein optional pulse shaper 4304 is not used) is routed to control input 4704. Harmonically rich interrogation message 4506 is found at first input 4706, and ground 4608 is found at second input 4708.

Figure 48:
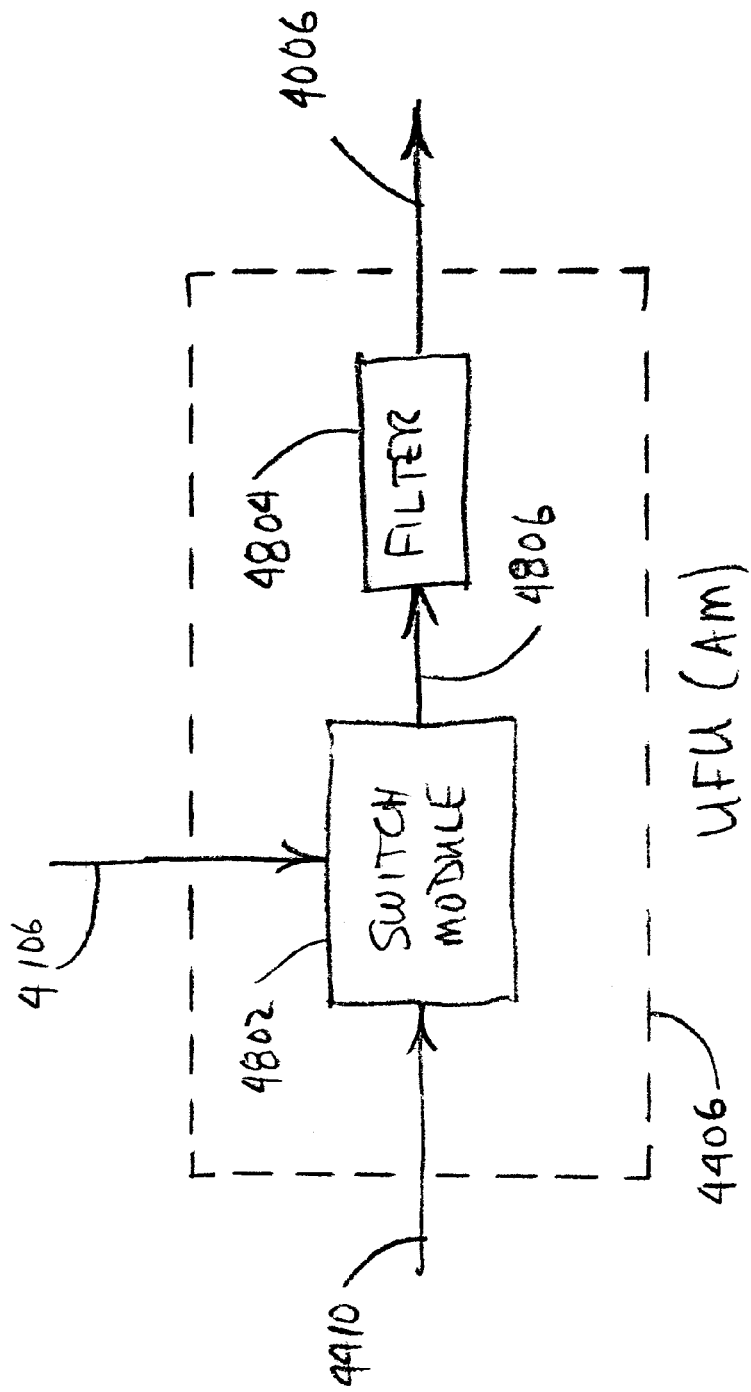
FIG. 48 illustrates a UFU for the AM implementation.
Figure 49:
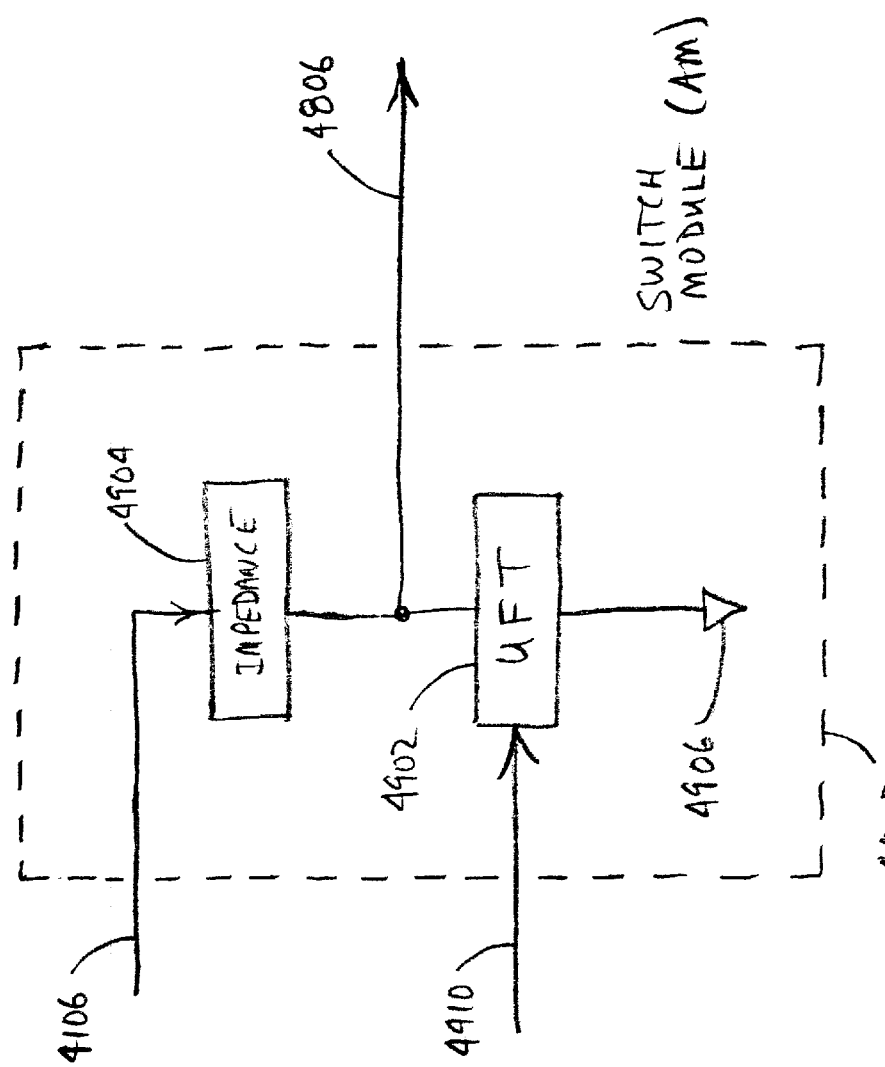
FIG. 49 illustrates a switch module for the AM implementation.
Figure 50:
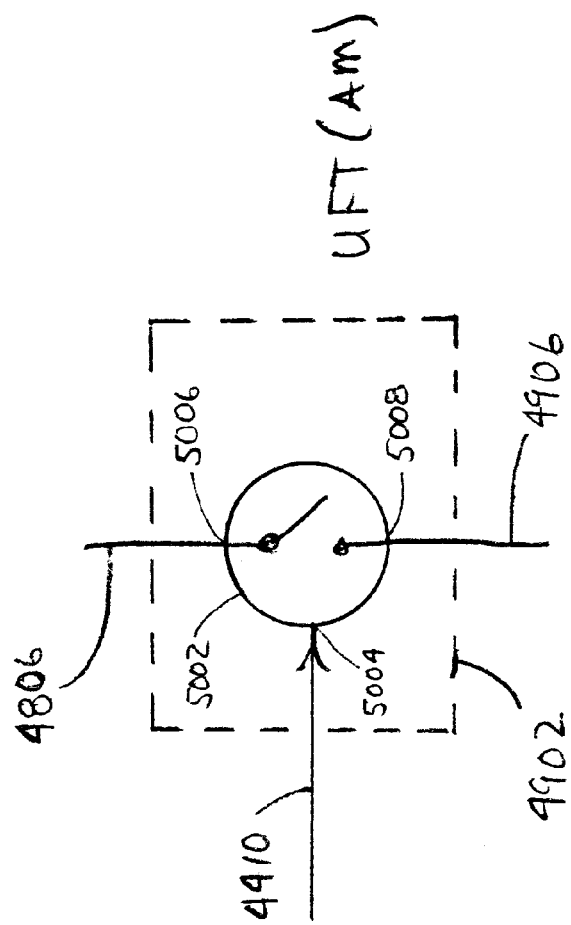
FIG. 50 illustrates a UFT for the AM implementation.

FIGS. 48, 49, and 50 illustrate an exemplary structure of UFU 4406 in the amplitude modulation embodiment. In FIG. 48, shaped oscillating signal 4410 is routed to a switch module 4802 to create a harmonically rich interrogation message 4806. Harmonically rich interrogation message 4806 is routed to a filter 4804 to create modulated interrogation signal 4006. It should be noted that in the embodiment wherein optional pulse shaper 4404 of FIG. 44 is not used, shaped oscillating signal 4410 is replaced by oscillating signal 4408. It should also be noted that filter 4804 is optional, and in the embodiment wherein filter 4804 is not used, harmonically rich interrogation message 4806 becomes modulated interrogation signal 4006. An exemplary structure of switch module 4802 is shown in FIG. 49, wherein shaped oscillating signal 4410 (or oscillating signal 4408 in the alternate embodiment wherein optional pulse shaper 4404 is not used) is routed to a universal frequency translator (UFT) 4902. UFT 4902 is also connected to a ground 4906. Interrogation message 4106 is connected through an impedance 4904 to the output of UFT 4902. The output of UFT 4902 is harmonically rich interrogation message 4806. An exemplary'structure of UFT 4902 is shown in FIG. 50 as comprising a switch 5002. Switch 5002 has a first input 5006, a second input 5008, and a control input 5004. Shaped oscillating signal 4410 (or oscillating signal 4408 in the alternate embodiment wherein optional pulse shaper 4404 is not used) is routed to control input 5002. Harmonically rich interrogation message 4806 is found at first input 5006, and ground 4906 is found at second input 5008.

The embodiments described herein are illustrative, and are not meant to be limiting. A more detailed explanation of frequency up-conversion according to the present invention is found herein in the sections entitled "Universal Frequency Translation" and "Frequency Up-conversion," as well as in copending U.S. Patent application entitled "Method and System for Frequency Up-Conversion," Ser. No. 09/176, 154, filed Oct. 21, 1998, which is incorporated herein by reference in its entirety.

7.3.2 Receiver Module

Figure 51:
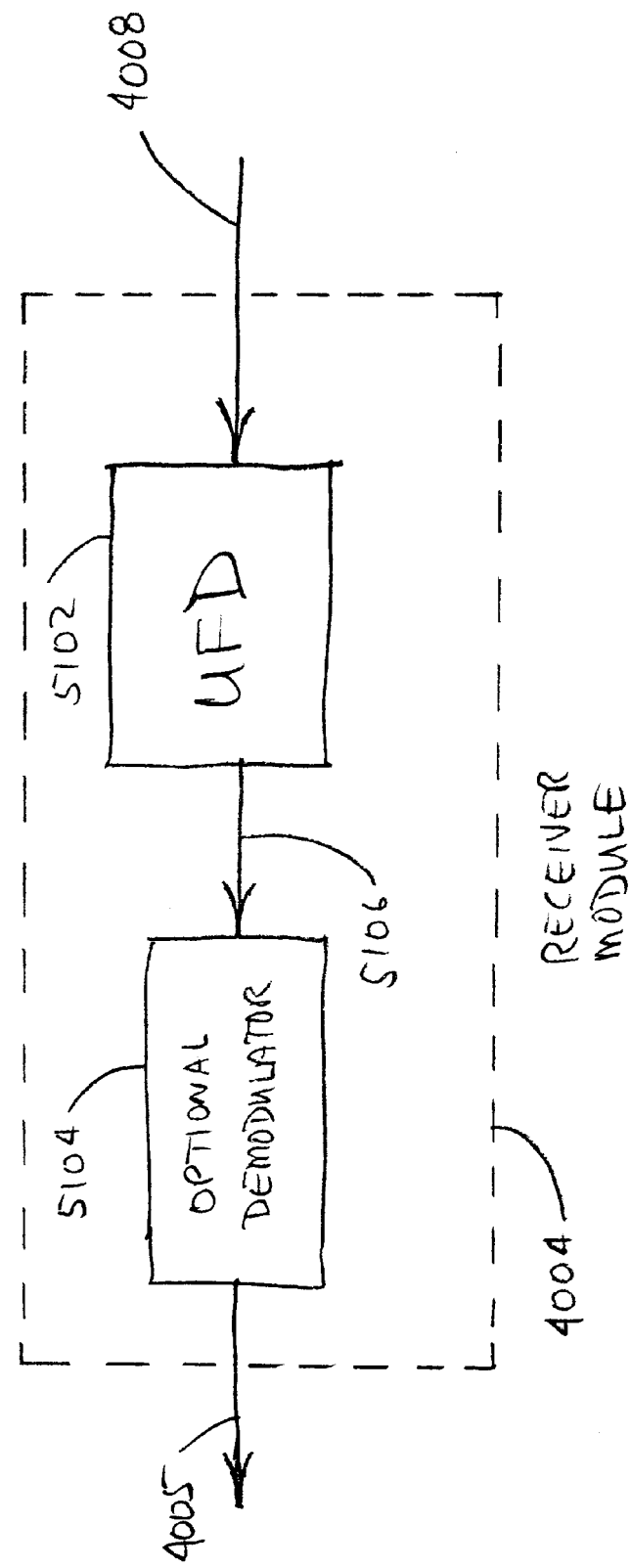
FIG. 51 illustrates a receiver module of an exemplary interrogator.

Receiver module 4004 is illustrated in FIG. 51. A universal frequency down-converter 5102 accepts modulated reply signal 4008 and outputs down-converted reply message 5106. Down-converted reply message 5106 may be at baseband frequency (BB) or it may be at an intermediate frequency (IF). Down-converted reply message 5106 is routed to an optional demodulator 5104, which in turn outputs the reply message at receiver/user connection 4005. If optional demodulator 5104 is not used, down-converted reply message 5106 is output at receiver/user connection 4005. One skilled in the relevant art(s) will appreciate that the function of optional demodulator 5104 is to ensure that the reply signal presented at receiver/user connection 4005 is in a useable format. This includes, but is not limited to, a second frequency down-conversion, a frequency demodulation, a phase demodulation, an amplitude demodulation, etc.

Figure 52:
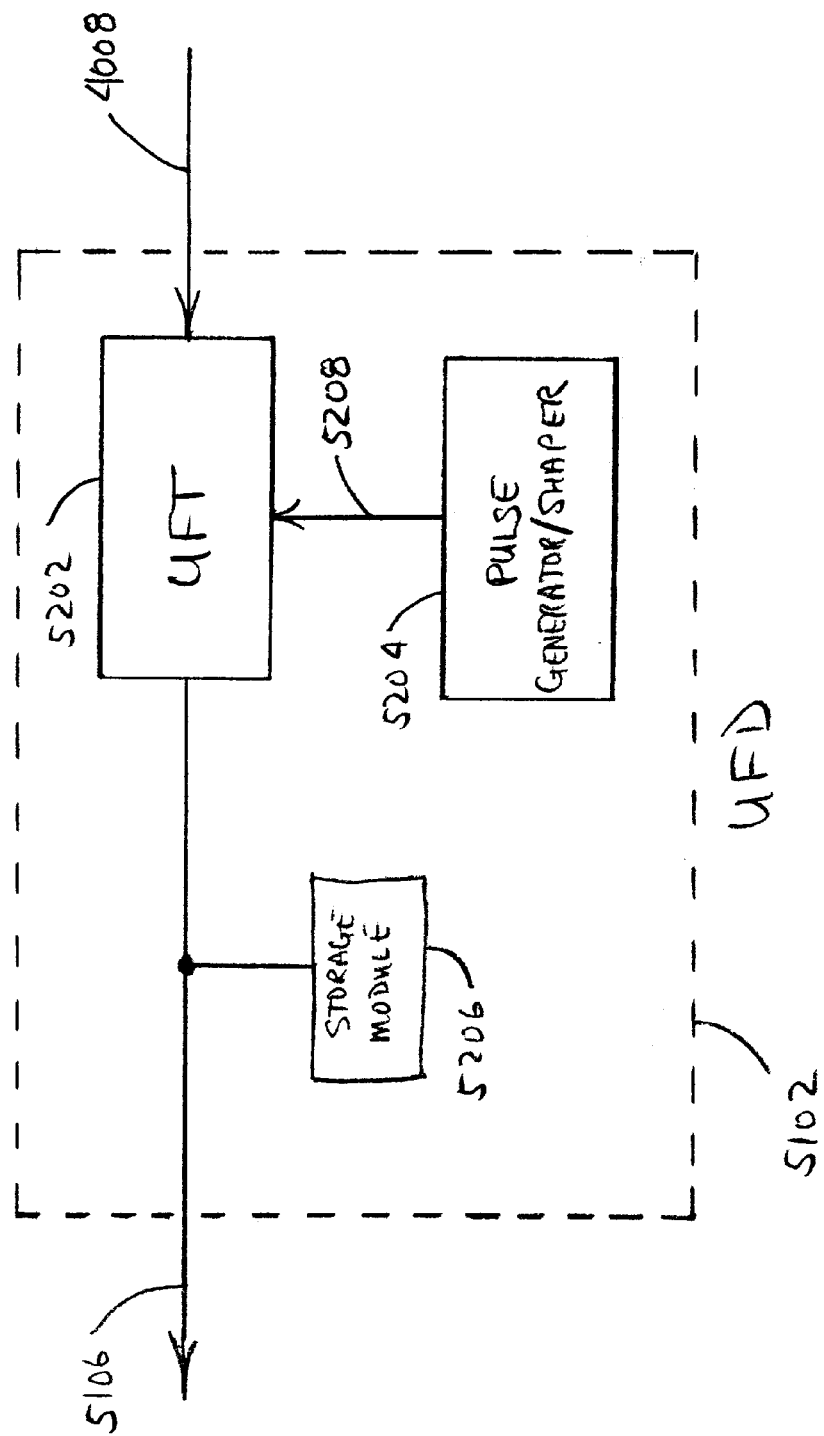
FIG. 52 illustrates a UFD of the present invention.

Looking now to FIG. 52, it is seen that UFD 5102 is comprised of a universal frequency translator (UFT) 5202, a pulse generator/shaper 5204, and a storage module 5206. UFT 5202 accepts modulated reply signal 4008 and outputs down-converted reply message 5106. UFT 5202 also receives a control signal 5208 from pulse generator/shaper 5204. Furthermore, the output of UFT 5202 is also connected to storage module 5206. Storage module 5206 stores the output of UFT 5202. In one implementation, it may be a capacitor. In a second implementation, it may be an inductor. These examples are for purpose of illustration and not of limitation. One skilled in the relevant art(s) will understand, based on the teachings contained herein, that any electrical or electronic storage device may be used.

Figure 53:
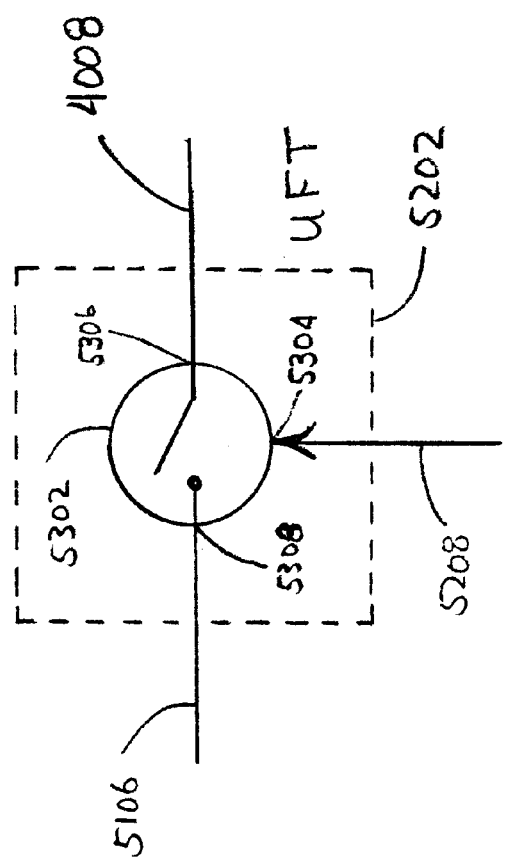
FIG. 53 illustrates a UFT of the present invention.

An exemplary structure of UFT 5202 is shown in FIG. 53 as comprising a switch 5302. Switch 5302 has a first input 5306, a second input 5308, and a control input 5304. Control signal 5208 is routed to control input 5304. Modulated reply signal 4008 is found at first input 5306 and down-converted reply message 5106 is found at second input 5308.

The embodiments described herein are illustrative, and are not meant to be limiting. A more detailed explanation of frequency down-conversion according to the present invention is found herein in the sections entitled "Universal Frequency Translation" and "Frequency Down-conversion," as well as in copending U.S. Patent application entitled "Method and System for Down-Converting Electromagnetic Signals," Ser. No. 09/176,022, filed Oct. 21, 1998, which is incorporated herein by reference in its entirety.

8. Other Exemplary Applications

The application embodiments described above are provided for purposes of illustration. These applications and embodiments are not intended to limit the invention. Alternate and additional applications and embodiments, differing slightly or substantially from those described herein, will be apparent to persons skilled in the relevant art(s) based on the teachings contained herein. For example, such alternate and additional applications and embodiments include combinations of those described above. Such combinations will be apparent to persons skilled in the relevant art(s) based on the herein teachings.

9. Conclusions

Exemplary implementations of the systems and components of the invention have been described herein. As noted elsewhere, these exemplary implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for reading a meter in an automated manner, comprising the steps of:
   (1) aliasing a received interrogation signal to obtain a baseband interrogation signal;
   (2) processing said baseband interrogation signal; and
   (3) generating a baseband reply;
   (4) modulating an oscillating signal with said baseband reply to obtain a modulated reply signal;

(5) gating a bias signal with said modulated reply signal to obtain a harmonically rich reply signal;

(6) filtering said harmonically rich reply signal to obtain one or more desired harmonics; and (7) transmitting said one or more desired harmonics.

2. The method of claim 1, wherein step (1) further comprises the steps of:

(a) aliasing said received interrogation signal with an aliasing signal to obtain an aliased interrogation signal, said aliasing signal being comprised of a string of pulses, said string of pulses having a frequency and a period, each pulse of said string of pulses having a pulse width; and (b) storing said aliased interrogation signal to obtain said baseband interrogation signal.

3. The method of claim 1, wherein said modulated reply signal has a first frequency and step 5 comprises:

gating a bias signal with said modulated reply signal, the first frequency being a subharmonic of a desired harmonic.

4. The method of claim 1, wherein step 4 comprises:

frequency modulating said oscillating signal with said baseband reply to obtain said modulated reply signal.

5. The method of claim 1, wherein step 4 comprises:

phase modulating said oscillating signal with said baseband reply to obtain said modulated reply signal.

6. A method for reading a meter in an automated manner, comprising:

(1) aliasing a received interrogation signal to obtain an intermediate frequency (IF) interrogation signal;

(2) down-converting said IF interrogation signal to obtain a baseband interrogation signal;

(3) processing said baseband interrogation signal;

(4) generating a baseband reply;

(5) modulating an oscillating signal with said baseband reply to obtain a modulated reply signal;

(6) gating a bias signal with said modulated reply signal to obtain a harmonically rich reply signal;

(7) filtering said harmonically rich reply signal to obtain one or more desired harmonics; and (8) transmitting said one or more desired harmonics.

7. The method of claim 6, wherein step (1) comprises:

(a) aliasing said received interrogation signal with an aliasing signal to obtain an aliased interrogation signal, said aliasing signal being comprised of a string of pulses, said string of pulses having a frequency and a period, each pulse of said string of pulses having a pulse width; and (b) storing said aliased interrogation signal to obtain said IF interrogation signal.

8. The method of claim 6, wherein said modulated reply signal has a first frequency and step 6 comprises:

gating said bias signal with said modulated reply signal, said first frequency being a subharmonic of a desired harmonic.

9. The method of claim 6, wherein step 5 comprises:

frequency modulating said oscillating signal with said baseband signal to obtain said modulated reply signal.

10. The method of claim 6, wherein step 5 comprises:

phase modulating said oscillating signal with said baseband signal to obtain said modulated reply signal.

11. A method of interrogating one or more transponders comprising:

(1) identifying a targeted transponder from the one or more transponders;

(2) formulating an interrogation message;

(3) modulating an oscillating signal with said interrogation message to obtain a modulated interrogation signal;

(4) gating a bias signal with said modulated interrogation signal to obtain a harmonically rich interrogation signal;

(5) filtering said harmonically rich interrogation signal to obtain one or more desired harmonics, wherein said one or more desired harmonics form an up-converted interrogation message; and (6) transmitting said up-converted interrogation message.

12. The method of claim 11, further comprising:

(7) receiving a reply signal from said targeted transponder; and (8) aliasing said reply signal whereby a baseband reply signal is generated.

13. The method of claim 11, further comprising:

(7) receiving a reply signal from said targeted transponder;

(8) aliasing said reply signal at an off-set frequency whereby an intermediate frequency reply signal is generated; and (9) down-converting said intermediate frequency reply signal whereby a baseband reply signal is generated.

14. A monitoring device, comprising:

a down-converter that aliases an interrogation signal to obtained a down-converted interrogation signal;

means for processing said down-converted interrogation signal;

means for generating a reply signal;

an up-converter that up-converts and transmits said reply signal, wherein said up-converter includes;

means for modulating an oscillating signal with said reply signal to obtain a modulated reply signal;

means for gating a bias signal with said modulated reply signal to obtain a harmonically rich reply signal;

means for filtering said harmonically rich reply signal to obtain one or more desired harmonics; and means for transmitting said one or more desired harmonics.

15. The monitoring device of claim 14, wherein said monitoring device represents a meter.

16. The monitoring device of claim 14, wherein said down-converter comprises:

a switch;

a storage device coupled to said switch; and a control signal generator coupled to said switch.

17. The monitoring device of claim 16, wherein said storage device is a capacitor.

18. The monitoring device of claim 14, wherein said up-converter comprises:

a switch; and a filter, coupled to said switch.

19. The monitoring device of claim 18, wherein said up-converter further comprises at least one of an amplifier and an antenna.

20. An interrogation device, comprising:

means for identifying a targeted transponder;

means for formulating an interrogation message;

an up-converter that up-converts said interrogation message to thereby create an up-converted interrogation message; and means for transmitting said up-converted interrogation message to said targeted transponder;
wherein said up-converter comprises:
 means for modulating an oscillating signal with said interrogation message to obtain a modulated interrogation message;
 means for gating a bias signal with said modulated interrogation message to obtain a harmonically rich interrogation message; and
 means for filtering said harmonically rich interrogation message to obtain one or more desired harmonics;
 wherein said means for transmitting includes means for transmitting said one or more desired harmonics.

21. The interrogation device of claim 20, wherein said targeted transponder is associated with a meter.

22. The interrogation device of claim 20, wherein said interrogation device is used in a meter reading apparatus.

23. The interrogation device of claim 20, further comprising:
 means for receiving a reply signal from said targeted transponder; and
 a down-converter that down-converts said received reply signal.

24. The interrogation device of claim 23, further comprising:
 means for processing said down-converted reply signal.

25. The interrogation device of claim 23, wherein said down-converter comprises:
 means for aliasing said received reply signal to down-convert said received reply signal.

26. A transponder, comprising:
 a radio front-end; and
 an interface module coupled to said radio front-end;
 wherein said radio front-end comprises:
  a down-converter that aliases an interrogation signal to obtained a down-converted interrogation signal,
  a reply signal generator;
  an up converter coupled to said reply signal generator; and
  a transmitter coupled to said up converter;
  wherein said up converter includes:
   means for modulating an oscillating signal with said reply signal to obtain a modulated reply signal;
   means for gating a bias signal with said modulated reply signal to obtain a harmonically rich reply signal; and
   means for filtering said harmonically rich reply signal to obtain one or more desired harmonics;
   wherein said transmitter transmits said one or more desired harmonics.

27. The transponder of claim 26, wherein said interface module couples to a meter.

28. The transponder of claim 26, wherein said up-converter comprises:
 a switch; and
 a filter, coupled to said switch.

* * * * *

UNITED STATES PATENT AND TRADEMARK OFFICE
CERTIFICATE OF CORRECTION

PATENT NO. : 6,798,351 B1
DATED : September 28, 2004
INVENTOR(S) : Sorrells et al.

It is certified that error appears in the above-identified patent and that said Letters Patent is hereby corrected as shown below:

Title page,
Item [56], References Cited, U.S. PATENT DOCUMENTS,
Please replace "08-032566" with -- 08-032556 --.

Column 19,
Line 51, please replace "of at" with -- of $\varphi_1$ at --.

Column 38,
Line 32, please replace "obtained" with -- obtain --.

Column 40,
Line 7, please replace "obtained" with -- obtain --.

Signed and Sealed this

Twenty-sixth Day of July, 2005

JON W. DUDAS
*Director of the United States Patent and Trademark Office*